United States Patent [19]
Kinney et al.

[11] Patent Number: 5,369,356
[45] Date of Patent: Nov. 29, 1994

[54] DISTRIBUTED CURRENT AND VOLTAGE SAMPLING FUNCTION FOR AN ELECTRIC POWER MONITORING UNIT

[75] Inventors: Michael A. Kinney, Raleigh, N.C.; James T. Cronvich, Harahan, La.; Wayne M. Zavis, Raleigh, N.C.

[73] Assignee: Siemens Energy & Automation, Inc., Alpharetta, Ga.

[21] Appl. No.: 73,913

[22] Filed: Jun. 8, 1993

Related U.S. Application Data

[63] Continuation of Ser. No. 753,261, Aug. 30, 1991, abandoned.

[51] Int. Cl.$^5$ .................. G01R 21/06; G11C 27/02; H02H 3/18
[52] U.S. Cl. .................. 324/142; 361/93; 327/91
[58] Field of Search .................. 324/141, 142, 107; 361/88, 93; 340/664; 364/483; 328/151; 307/352, 353

[56] References Cited

U.S. PATENT DOCUMENTS 4,870,351  9/1989  Milkovic .................. 324/142

OTHER PUBLICATIONS

Siemens Bulletin SG3169-1; "Microprocessor-Based Tripping System Static Trip III"; Siemens Energy & Automation, Inc., Raleigh, N.C. 27626; 1993.

*Primary Examiner*—Ernest F. Karlsen

[57] ABSTRACT

A low voltage AC electric power monitoring system includes a processor which samples the current and circuit breaker system includes a processor which samples each of the current components at seventeen samples per cycle to obtain current samples representing a single period of the AC power signal. The processor samples the voltage component at different points in the voltage cycle over several cycles to obtain voltage samples representing a single period of the AC power signal.

6 Claims, 14 Drawing Sheets

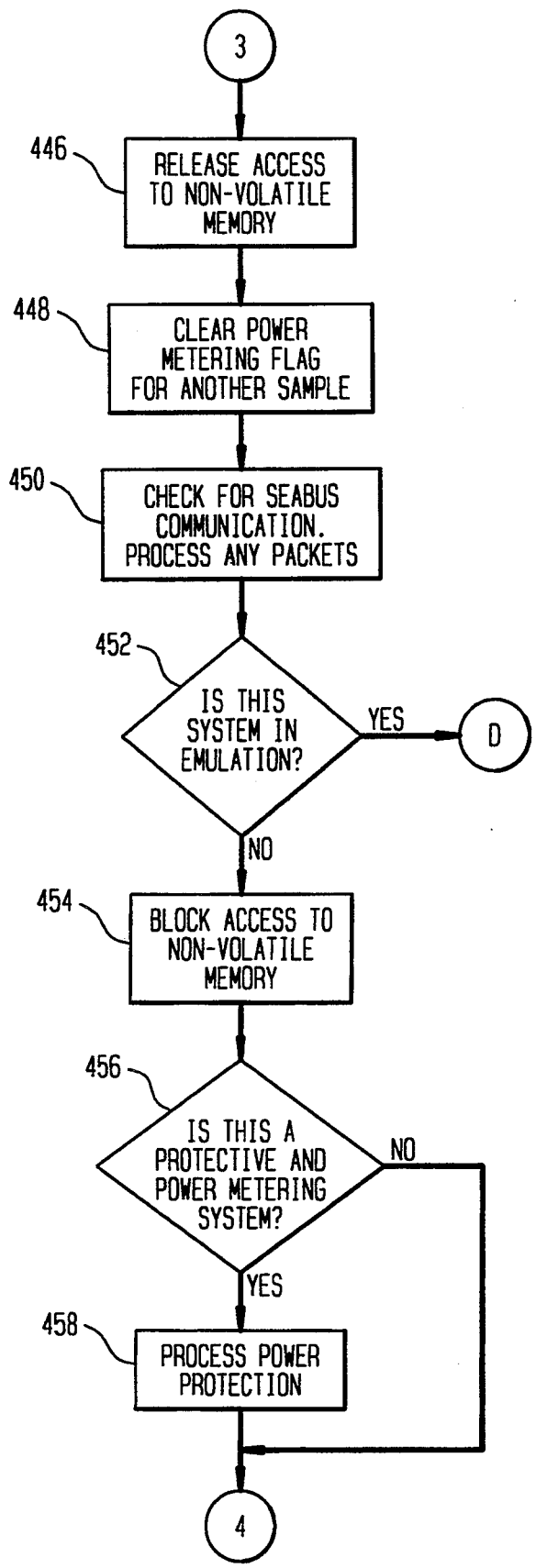

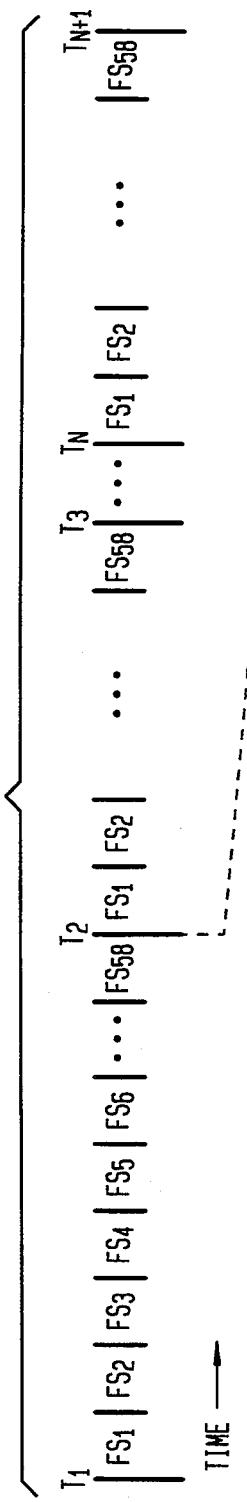

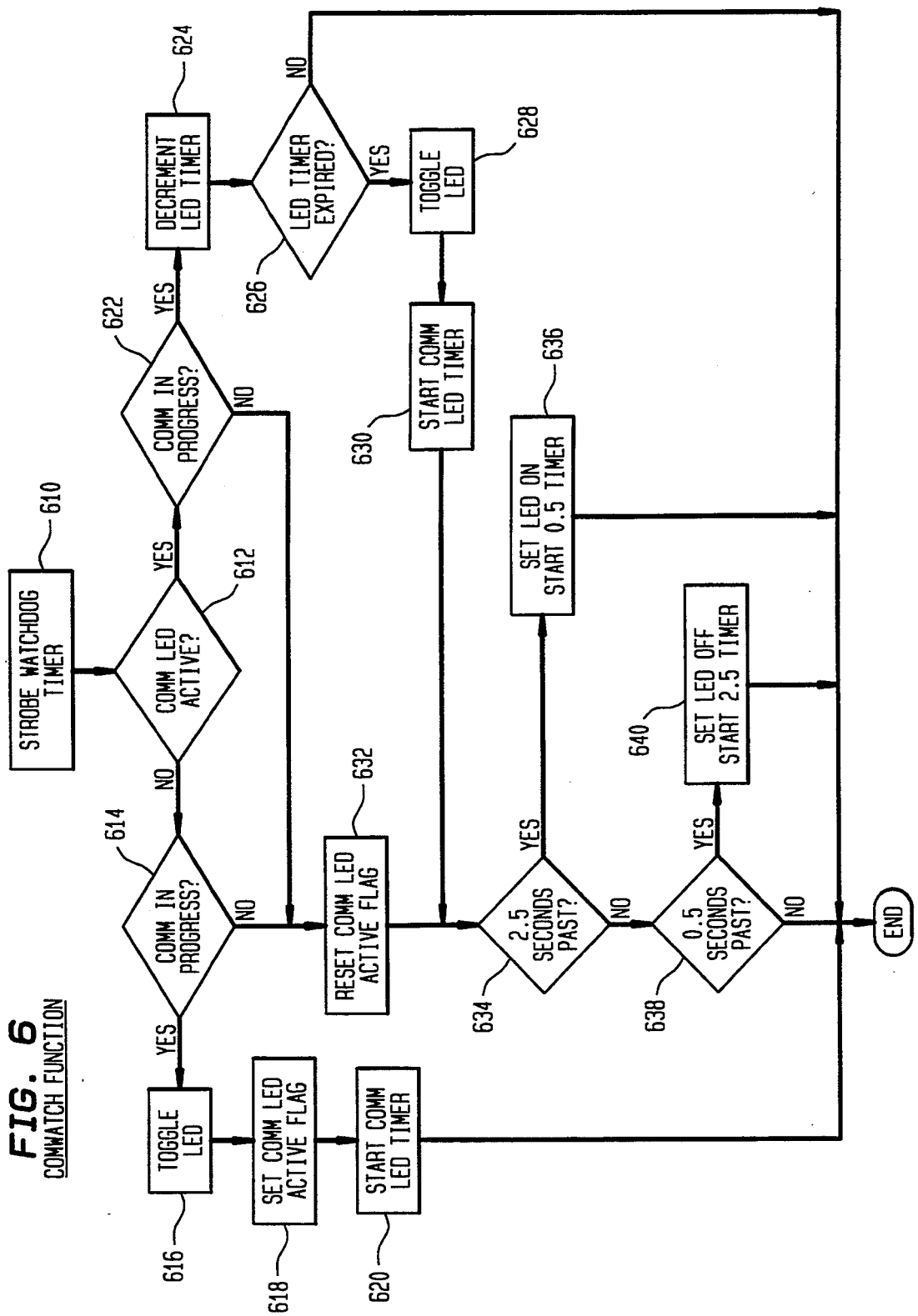

DISTRIBUTED CURRENT AND VOLTAGE SAMPLING FUNCTION FOR AN ELECTRIC POWER MONITORING UNIT

CROSS-REFERENCE TO RELATED APPLICATION

This is a continuation of Ser. No. 07/753,261 filed Aug. 30, 1991, now abandoned.

A portion of the disclosure of this patent document contains material which is subject to copyright protection. The copyright owner has no objection to the facsimile reproduction by anyone of the patent document or the patent disclosure as it appears in the Patent and Trademark Office patent file or records, but otherwise reserves all copyright rights whatsoever.

BACKGROUND OF THE INVENTION

The present invention is directed to apparatus for monitoring an electric power distribution system and in particular to a monitoring unit which provides extended monitoring functions and which includes a distributed current and voltage sampling system.

In a typical factory power distribution system, high-voltage (i.e. greater than 1,000 volts) power provided by the power company generation station is stepped down to low voltage power using a transformer. The low voltage power is then distributed around the factory to power equipment such as, motors, welding machinery and large computers.

Power distribution systems of this type are typically divided into branches, where each branch supplies power to a portion of the factory. The entire power distribution system is protected by installing low voltage fuses or circuit breakers in each branch so that a fault such as a short circuit in a piece of equipment supplied by one branch will not affect the power distributed to equipment coupled to the remaining branches.

Typically, these low voltage circuit breakers detect more than just large overcurrent conditions caused by short circuit faults. In addition, they detect lower level long-time overcurrent conditions and excessive ground current. The simplest form of circuit breaker is thermally tripped as a result of heating caused by an overcurrent condition. This type of breaker is best for detecting relatively low level overcurrent conditions since it measures the cumulative heating effect of the low-level overcurrent condition over a period of time. A breaker of this type, however, may respond too slowly to provide effective protection against high-current short circuit conditions.

Another type of breaker monitors the level of current being passed through the branch circuit and trips the breaker when the current exceeds a predefined maximum value. Breakers of this type typically include a microcontroller coupled to one or more current sensors. The microcontroller continually monitors the digitized current values using a curve which defines permissible time frames in which both low-level and high-level overcurrent conditions may exist. If an overcurrent condition is maintained for longer than its permissible time frame, the breaker is tripped.

Although this type of breaker provides good protection against both long-time and short-time overcurrent conditions, if it does not calculate RMS current values, it may erroneously trip the circuit when a nonlinear load, such as a welding machine, is coupled to the branch that it is protecting. Non-linear loads tend to produce harmonics in the current waveform. These harmonics tend to distort the current waveform, causing it to exhibit peak values which are augmented at the harmonic frequencies. When the microcontroller, which assumes a sinusoidal current waveform, detects these peaks, it may trip the breaker even though the heating effect of the distorted waveform may not require that the circuit be broken.

Since circuit breakers of the type described above only monitor overcurrent conditions, other types of faults such as over or under voltage conditions and phase imbalances may be missed unless or until they result in an overcurrent fault. Typically, circuit protection for faults of this type requires special purpose line monitoring and relaying equipment, separate from the overcurrent breakers.

Another problem with many existing circuit breakers involves the time required to restore the branch to operation once the breaker has been tripped. For purely transient faults, such as a power surge during an electrical storm, a technician must go onto the factory floor, locate the tripped breakers and reset them. Depending on the experience and knowledge of the technician, this may take a few minutes or a few hours. In this instance, however, the delay may be minimized by using a breaker with an automatic recloser.

Faults caused by the equipment that is powered by the branch may be more difficult to locate. Many circuit breakers provide no information on the conditions present at the time the breaker was tripped. Thus, the technician may need to install power monitors on each piece of equipment to determine the magnitude and duration of the current that caused the fault. Due to the limited information provided by currently available breakers, faults of this type may take several days to locate and correct.

A final problem with existing low-voltage circuit breaker systems concerns the lack of effective backup protection if the breaker should fail to trip. This problem is more of a concern with microcontroller based trip units than with the older thermal trip units. In general, effective backup protection may include a fuse, in series with the branch line, which blows at a short-circuit current slightly higher than the short-circuit current of the breaker. If the microcontroller or any of its associated circuitry fails, a lower-level overcurrent condition may damage the distribution system and/or the equipment being protected before the backup fuse is blown.

SUMMARY OF THE INVENTION

The present invention is embodied in a power monitoring circuit for low-voltage AC electric power distribution system. The controller circuit monitors the level of current flowing by continually sampling instantaneous current and voltage levels on the branch line. The sampling system produces a number of samples sufficient to characterize the current component during one cycle of the AC power signal and a number of samples sufficient to characterize the voltage component over an interval longer than one cycle of the AC power signal.

BRIEF DESCRIPTION OF THE DRAWINGS

FIG. 2 is a block diagram, partly in schematic diagram form of a trip unit suitable for use in the system shown in FIGS. 1 and 1a.

FIG. 2a is an elevation drawing of the front panel of one of the trip units shown in FIGS. 1 and 1a.

FIGS. 4a through 4g are flow-chart diagrams which are useful for describing the operation of the trip unit shown in FIG. 2.

FIGS. 5a through 5c are timing diagrams which are useful for describing the current and voltage sampling scheme used by the trip unit shown in FIG. 2.

FIG. 6 is a flow-chart diagram which is useful for describing the operation of the trip unit shown in FIG. 2.

DETAILED DESCRIPTION

Overview

The present invention is embodied in a dual processor low-voltage circuit breaker and power line monitoring system. In this system, which is shown in greater detail in FIGS. 2 and 2a, the two processors are implemented using respective microcontroller circuits 210 and 250.

Figure 2:
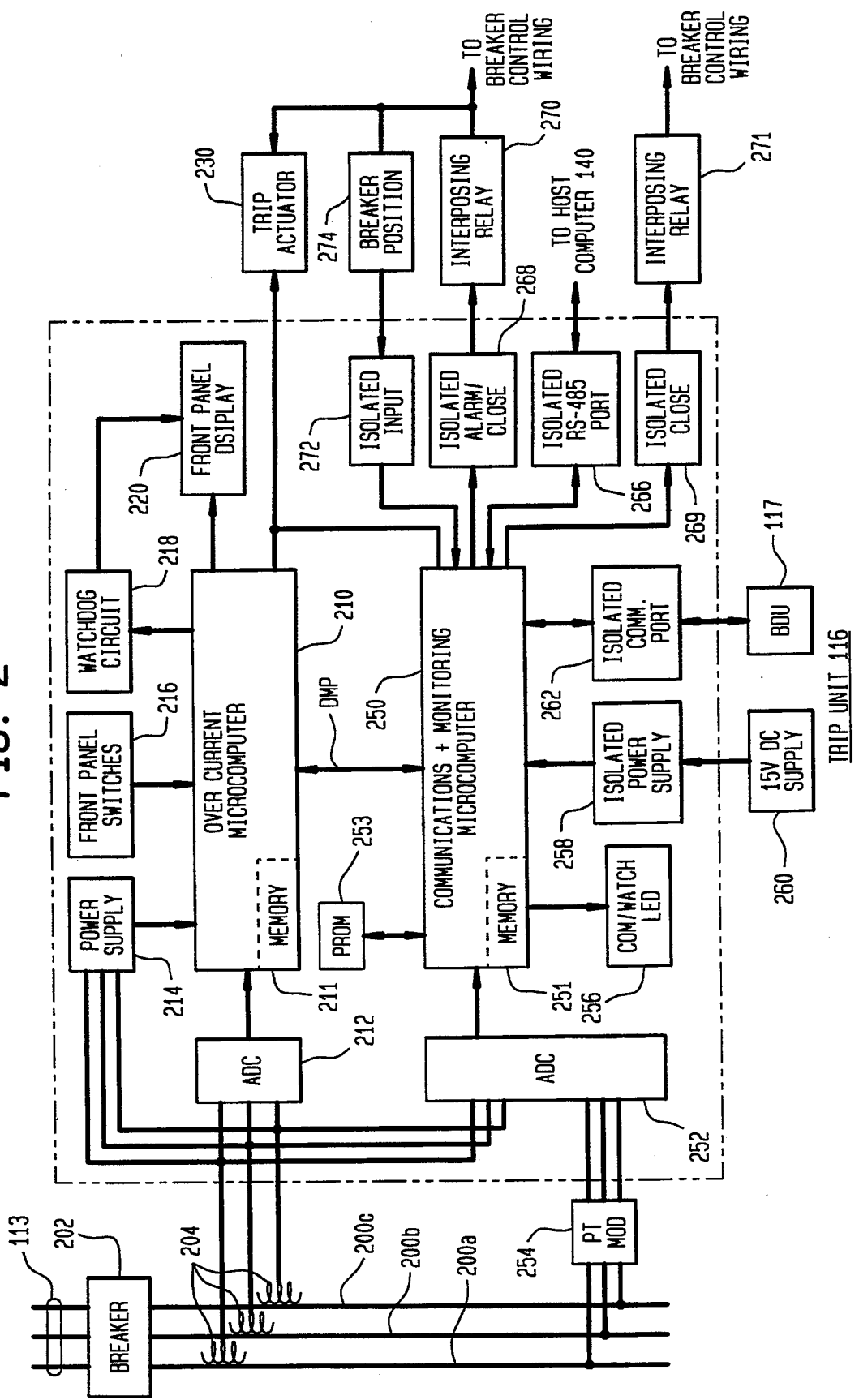

Referring to FIG. 2, the microcontroller 210 monitors the current flowing through the three-phase power lines 200a, 200b and 200c to detect overcurrent conditions and to trip the circuit breaker 202 immediately if a large overcurrent is detected or if, after a programmable delay time, a relatively small overcurrent is detected.

The microcontroller 250 monitors the potential developed across the power lines 200a, 200b and 200c in addition to monitoring the current flowing through the power lines 200a, 200b and 200c. From these values, the controller 250 calculates the power flowing through the lines and the frequency of the power signal. Based on these monitored parameters, the microcontroller 250 can trip the breaker or change the state of an alarm output signal. The alarm signal may be used to actuate an alarm device, such as a light and/or a buzzer, or it may be used, through an interposing relay to open the circuit breaker 202. The microcontroller 250 can also reclose the breaker after receiving a specific command from the host computer 140.

In addition to its protection functions, the microcontroller 250 logs minima and maxima for various ones of the monitored variables and logs the occurrence of events such as the detection of overcurrent conditions, also known as pickup events, and trip events.

The logged items may be monitored by a remote host computer 140. The computer 140, shown in FIG. 1a, is coupled to multiple trip units to provide, at one location, the continuing status of the electric power distribution system. In addition, many of these logged items may be monitored using a local breaker display unit 117. The host computer 140 can also be used to control the operation of the processor 250.

The microcontroller 250 provides backup overcurrent protection by tripping the breaker 202 at overcurrent levels greater than those used by the microcontroller 210. In addition, the microcontroller 250 uses a power supply which is separate and distinct from that used by the microcontroller 210. All input and output signals used by the microcontroller 250, including the operational power signal, are electrically isolated from the outside circuitry to prevent damage to the trip unit circuitry.

DETAILED DESCRIPTION OF THE EXEMPLARY EMBODIMENT OF THE INVENTION

Figure 1:
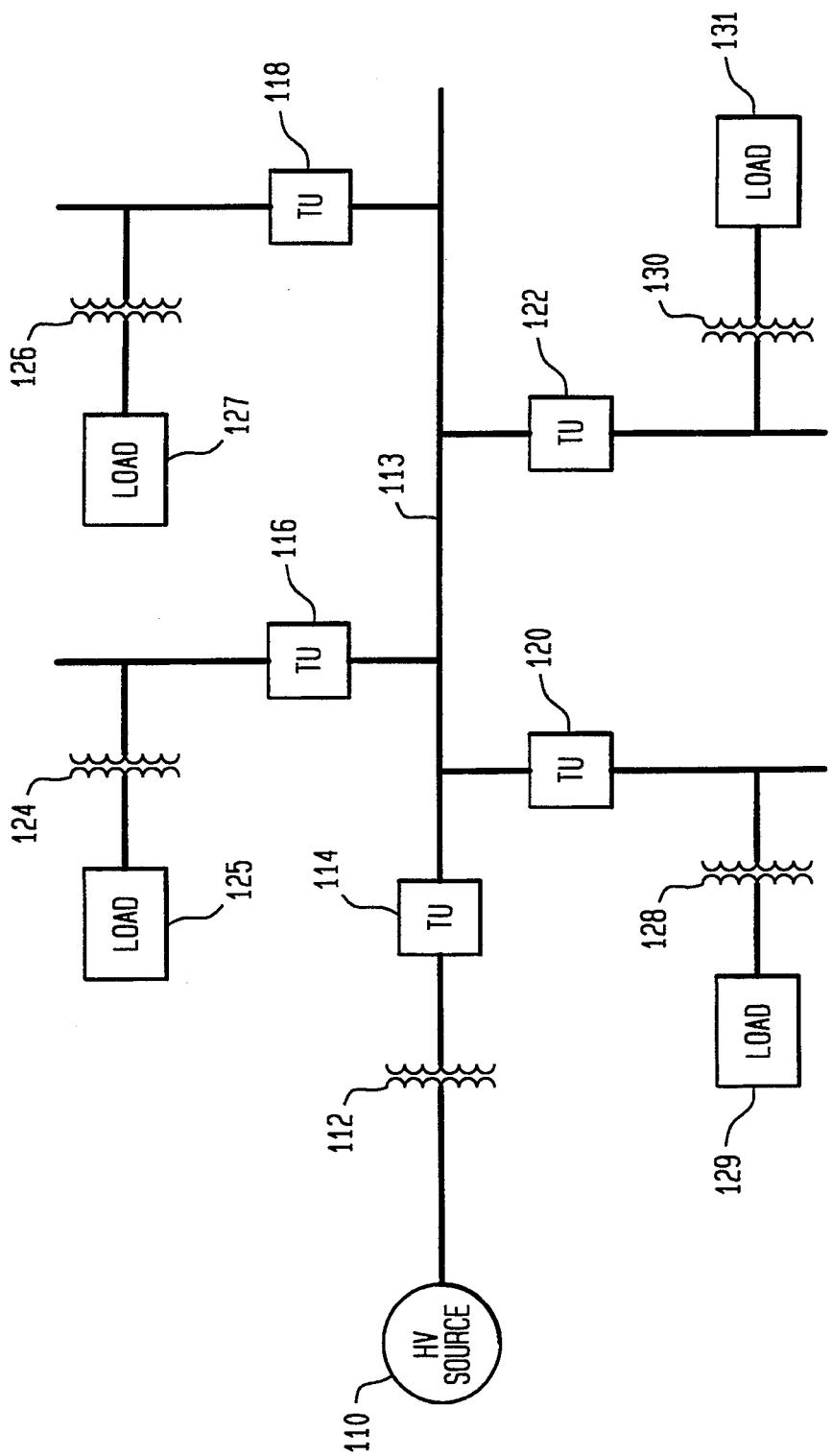
FIG. 1 is a schematic diagram, partly in block diagram form of a power distribution system which includes a trip unit containing an embodiment of the present invention.
Figure 1A:
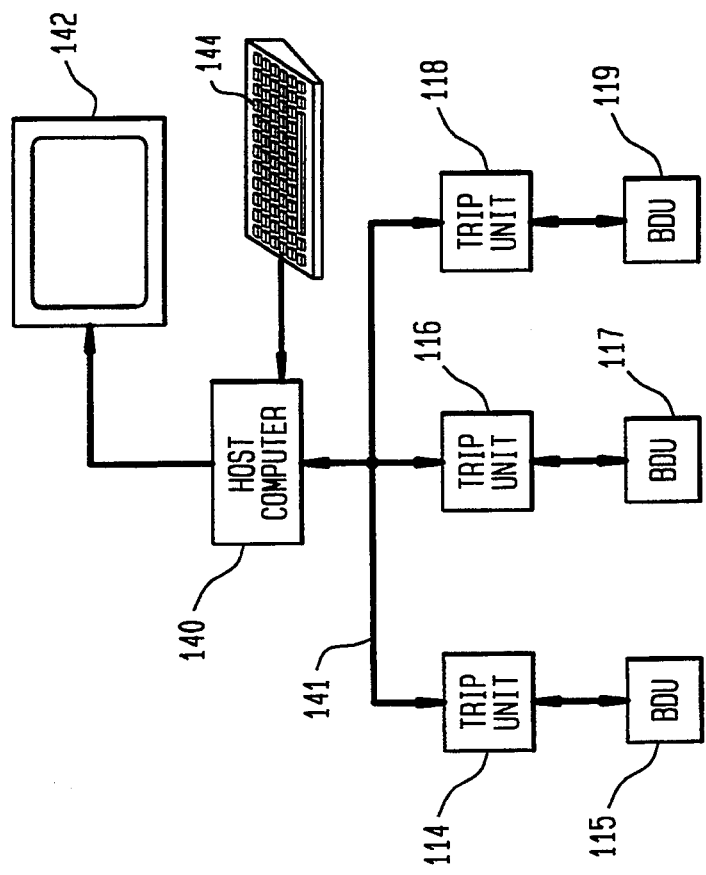
FIG. 1a is a block diagram which illustrates the data communications interconnections of selected ones of the trip units shown in FIG. 1.

FIG. 1 is a diagram of an exemplary electrical power distribution system. The system has been simplified to facilitate the explanation of the invention. In the FIGURE, all of the power lines are three-phase lines even though only one line is shown.

As shown in FIG. 1, a high voltage source 110, which may be a power company substation, provides a high voltage electrical power signal to the primary winding of a transformer 112. The secondary winding of the transformer provides three-phase low voltage power to the power distribution system of, for example, a factory. The low voltage power is distributed around the factory floor through respective step-down transformers 124, 126, 128 and 130 to provide power to equipment represented as respective loads 125, 127, 129 and 131.

The power distribution system is protected by multiple trip units 114, 116, 118, 120 and 122. In this configuration, the trip units 116, 118, 120 and 122 each protect the system from faults occurring on a respective branch of the power distribution system while the trip unit 114 protects the transformer 112 from faults not handled by one or more of the other trip units and from faults on the main distribution bus 113.

FIG. 1a is a block diagram which illustrates how the trip units are connected to the host computer 140 to allow the power distribution system to be monitored from a central location. To simplify the drawing, only three of the trip units 114, 116 and 118 are shown in FIG. 1a. It is contemplated, however, that all of the trip units may be connected to the host computer 140. In this embodiment of the invention, the host computer 140 may be an ACCESS ™ electrical distribution communication system, available from Siemens Energy and Automation, Inc.

The host computer 140 is coupled to a display device 142 and a keyboard 144. As set forth below, the host computer 140 may periodically poll each of the trip units, via a multi-drop line 141, to monitor the status of the power distribution system at the main bus and at each branch bus. In addition, the host computer 140 can issue commands to the various trip units causing them to open or close their respective breakers or to change the levels at which pickup and trip events occur for certain ones of the monitored parameters.

Furthermore, as shown in FIG. 1a, each of the trip units 114, 116 and 118 may be coupled to respective breaker display units (BDUs) 115, 117 and 119 by a separate data communications port. The BDU may be used to monitor the status and history of the power distribution system, at the trip unit. This monitoring function is implemented to be substantially independent of the monitoring functions of the main computer 140.

FIG. 2 is a block diagram, partly in schematic diagram form of an exemplary trip unit which controls a breaker 202. For the purpose of this explanation, the trip unit is assumed to be the unit 116 which isolates its branch line from the main bus 113 as shown in FIG. 1.

The trip unit includes an overcurrent microcomputer 210 which implements the basic overcurrent protection functions of the trip unit and a communications microcomputer 250 which implements data communications functions and provides auxiliary circuit protection functions.

The exemplary overcurrent microcomputer 210 includes an 80C49 microcontroller, available from Intel Corp, which includes an internal memory 211. The memory 211 includes read only memory (ROM) for program and fixed-value data storage as well as a small scratchpad random access memory (RAM).

Electrical current flowing through the three-phase lines 200a, 200b and 200c is sensed by three current transformers 204. In the exemplary embodiment of the invention, the current transformers 204 are implemented as respective secondary windings wrapped around each of the bus bars 200a, 200b and 200c. Current induced in the secondary winding is stepped down by three respective current transformers (not shown) internal to the trip unit 116. These stepped-down currents are converted to voltage by three resistors (not shown) which are also internal to the trip unit. These voltages are applied to a multiplexed analog to digital converter (ADC) 212. The ADC 212, under control of the microcomputer 210, sequentially digitizes the voltages generated by the three stepped-down currents. These digitized values are supplied to the overcurrent microcomputer 210 as data values.

In addition to the current sensors on the three phase lines 200a, 200b and 200c, the trip unit may also be configured to accept ground current and neutral current at separate current sensor input terminals. As set forth below, the neutral current input signal is used only by the communications microcomputer 250. The ground and neutral current lines are not shown in FIG. 2 to avoid unnecessary complexity in the drawing.

Operational power for the overcurrent microcomputer 210 is supplied from the current transformers 204. As shown in FIG. 2, the secondary windings of the transformers 204 are coupled to power supply circuitry 214 which rectifies the provided alternating current power signal to generate direct current (DC) operational power for the overcurrent microcomputer 210. The power supply 214 is also coupled to provide operational power to the ADC 212, watchdog circuitry 218 and front panel display 220.

The front panel switches 216 are used to set the pickup and trip levels used for primary overcurrent protection. As set forth above, a pickup level is an overcurrent condition which may cause the unit to trip the circuit breaker, either after a delay dependent on the level of the detected current, or instantaneously, for large overcurrent conditions. The configuration of the front panel switches 216 is described below with reference to FIG. 2a.

The watchdog circuit 218 continually monitors the status of the microcomputer 210. The exemplary circuit 218 expects to receive a pulse signal from the microcomputer 210 at regular intervals. If it fails to receive a pulse within an interval centered about an expected time, it causes a liquid crystal device (LCD) array on the front panel display to display the message "DISABLE" and attempts to reset the overcurrent microcomputer 210. Even if it is successful in restarting the microcomputer 210, the watchdog circuit continues to display the DISABLE message once a failure has been detected.

If, during its current monitoring, the microcontroller 210 detects a large overcurrent condition indicative of a short circuit condition, or a smaller overcurrent condition which persists for longer than a predefined time interval, the microcontroller 210 activates the trip actuator 230, causing the breaker 202 to break the connection between the branch lines 200a, 200b and 200c and the main bus 113.

In addition to tripping the breaker, the microcomputer 210 indicates on the front panel display 220 the type of event which caused the trip. If the event was a long-time overcurrent condition, the word "OVERLOAD" is displayed on the front panel display 220. If the event was a ground overcurrent, sensed from the ground current input terminal (not shown) to the ADC 212, the words "GROUND FAULT" are displayed. If the event was a large overcurrent, causing a short time or instantaneous trip, the words "SHORT CIRCUIT" are displayed. In addition to these event displays, the microcomputer 210 can activate two light emitting diodes (LEDs) on the front panel. One of these LEDs is lighted when a long-time pickup event occurs and the other is activated when a short-time pickup or a ground fault pickup event has occurred.

In addition to displaying these events, the overcurrent microcomputer 210 provides signals via a digital message path (DMP) for events which have occurred to the communications microcomputer 250. These signals include all of the signals that activate the front panel display and, in addition, signals that indicate when a short-time or long-time pickup event has occurred or a trip event has occurred.

Figure 2A:
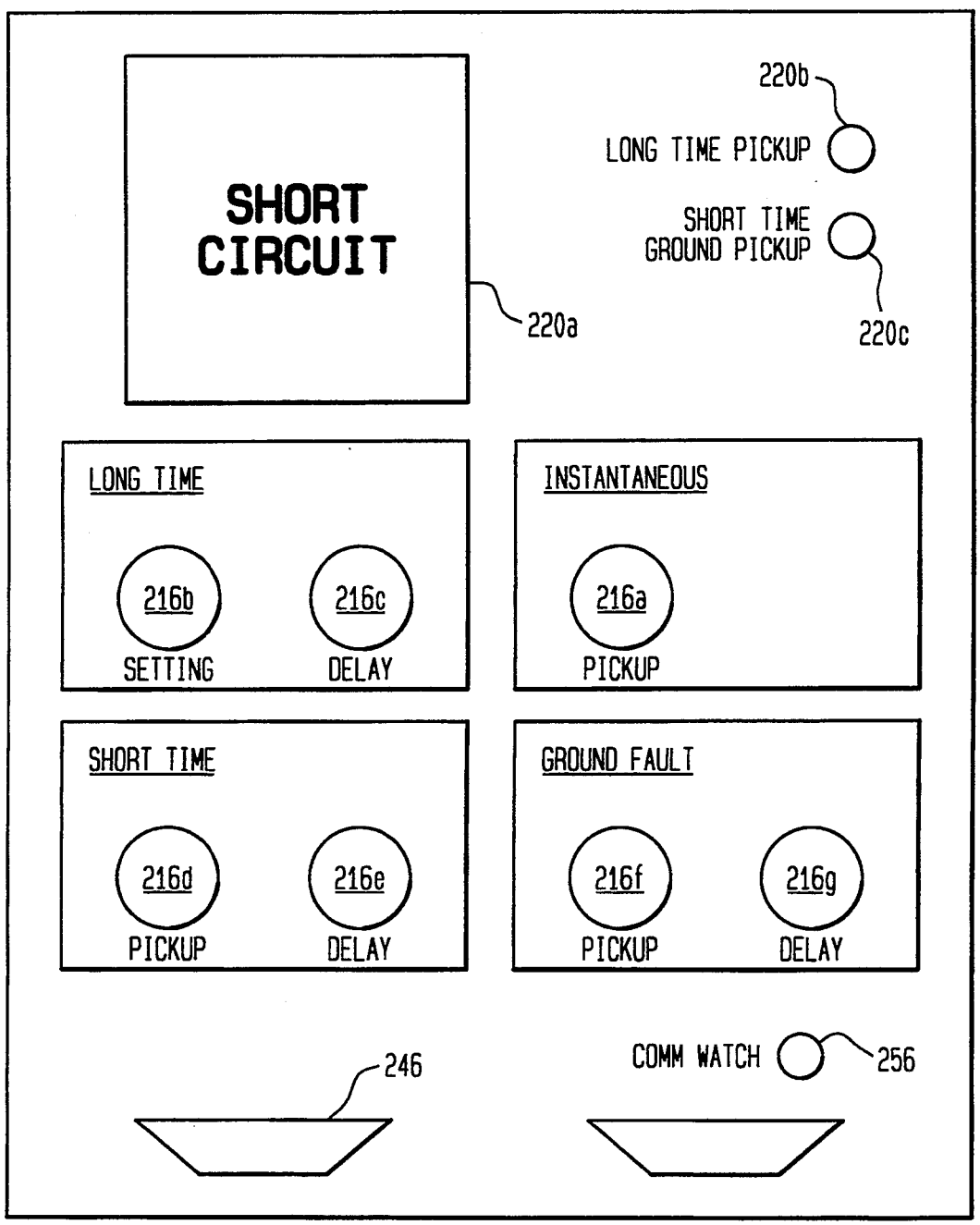

FIG. 2a is an elevation drawing of an exemplary front panel which may be used with this embodiment of the invention. The front panel is described now since it primarily relates to the overcurrent microcomputer 210.

The front panel display 220 includes an LCD array 220a the long-time pickup LED 220b and the short-time/ground fault pickup LED 220c.

The front panel switches include a switch 216a for setting the current level which will cause an instantaneous trip of the breaker 202. This current is specified a multiple of the rated current of the current sensors 204. In the exemplary embodiment of the invention, this may be set to between twice and fifteen times the rated current of the sensor. Switches 216b and 216c set the pickup level and time delay for a long-time trip. The exemplary pickup level may be set to between one-half of the rated current and the rated current. The delay may be set to between 3.5 seconds and 30 seconds.

Switches 216d and 216e determine the short-time trip settings. A short-time pickup may be set to occur for sensed currents between twice and twelve times the long-time pickup setting while the delay from pickup to trip may be set to between 0.08 and 0.4 seconds.

The parameters used for a ground-fault trip are controlled by the front panel switches 216f and 216g. The ground-fault pickup may be set to between 20% and 60% of the rated current for the ground current sensor and the delay can be set to between 0.1 seconds and 0.4 seconds.

In addition to the display 220 and control switches 216, the front panel includes a connector 264 which is used by the communications microcomputer 250 to implement data communications with the breaker display unit (BDU) 117. A rear connector (not shown)

couples the microcomputer 250 with the host computer 140.

Referring again to FIG. 2, the communications microcomputer includes a 68HC11F1 microcontroller available from Motorola, Inc. and a memory. This memory includes an external programmable read-only memory (PROM) 253, which is used to hold the program instructions and an a memory 251 which is internal to the microcontroller. In this embodiment of the invention, the PROM 253 is a 27C256 integrated circuit available from Intel Corp. The program stored in the PROM 253 is included as a software appendix to the present application.

The internal memory includes a non-volatile random access memory (NVRAM) portion, which is used to hold certain log entries that may be provided to either the host computer 140 or the BDU 117 and a RAM portion which is used to hold log entries which may change frequently as well as flags and partial values of calculations.

Operational power is applied to the microcomputer 250 and to the circuitry to which it is coupled from an external 15 volt direct current instrument supply 260. The operational power for the microcomputer 250 is further shielded by an isolating power supply 258 interposed between the microcomputer 250 and the instrument power supply 260. This isolating power supply 258 may be include, for example, a conventional DC to DC converter.

The supply 260 is desirably isolated from the branch lines 200 so that the communications microcomputer 250 can continue to operate even when the breaker 202 is open or tripped. In addition, this alternate operational power source shields the communications processor from power problems which may disable the overcurrent microcomputer 210.

In this embodiment of the invention, the communications microcomputer 250 performs both communications and monitoring functions. In addition to monitoring the current flowing through the lines, the microcomputer 250 monitors the voltage between the respective three phase lines and, using this voltage and current data, monitors power, energy and imbalances among the three phases in either voltage or current.

Data on the current flowing through the lines 200a, 200b and 200c is collected by an ADC 252 which is coupled, in parallel with the ADC 212, to the current sensors 204. In addition, the ADC 252 is coupled to a potential transformer module 254 which provides a measure of the voltage between each of the three phases. The ADC may also be coupled to receive ground and neutral currents from sensors coupled to the branch lines 200. In an exemplary system, these sensors may include a circuit (not shown) which derives ground current as the vector sum of the three phase currents and a conventional current transformer coupled to the neutral line (not shown) of the branch lines 200.

The ADC 252 is a multiplexed ADC which provides instantaneous samples of one of three current signals (five if ground and neutral are used) and three voltage signals. The ADC is controlled by the microcomputer 250 to determine which sample to provide at any given time.

The communications microcomputer 250 is coupled to the COMM WATCH LED 256 on the front panel of the trip unit. The function and operation of this LED is described in detail below with reference to FIG. 6.

As set forth above, the communications microcomputer 250 provides two substantially independent communications links. One of these links is a dedicated communications port 262 which is coupled to the BDU 117. The other communications link is an RS-485 port 266 through which the communications microprocessor is coupled to the host computer 140. Both of the ports 262 and 266 include conventional opto-isolators to prevent any electrical connection between the communications microcomputer 250 and the BDU 117 or the host computer 140.

The communications microcomputer 250 is also configured with an opto-isolated alarm signal output line 268, an opto-isolated breaker position input signal line, an output line to the trip actuator 230 and an opto-isolated breaker-close signal output line 269. These signal lines allow the communications microcomputer 250 to trip, open or close the breaker 202 and, in addition, allow it to log the state of the breaker 202. The alarm line 268 may be coupled to an alarm device so that conditions detected by the communications microcomputer 250 which activate the alarm signal activate the alarm device.

Alternatively, as shown in FIG. 2, the alarm line 268 may be coupled to an interposing relay 270 which is coupled to control circuitry (not shown) in the breaker 202. In this configuration, when the alarm signal is activated, the interposing relay closes, causing the breaker to open. The breaker may be closed by activating the breaker-close output line 269.

The input signal line 272 is coupled to the breaker control circuitry to determine if the breaker is open or closed. If the breaker 202 has been opened using the interposing relay 270 or tripped using the trip actuator 230, this signal indicates that the breaker is open.

The communications microcomputer 250 has three functions in the trip unit. First, it directly monitors line current and interline voltage for each of the three or four wires of the branch line 200 through the ADC 252 and, from these values calculates other values which indicate the status of the line 200. Second, it controls communication between the trip unit 116 and the host computer 140 and BDU 117. Third it performs protective functions which augment the overcurrent protection provided by the overcurrent microcomputer 210.

The monitoring function primarily entails collecting voltage and current samples from the branch line 200, calculating and storing functions of these samples which may indicate significant events, and logging these events as they occur. Table I lists the parameters which are monitored by the microcomputer 250.

TABLE I

| Measured Parameter | Measured Parameter |
| --- | --- |
| Phase A current | Phase A voltage[1] |
| Phase B current | Phase B voltage[1] |
| Phase C current | Phase C voltage[1] |
| Average current (A, B & C) | Average phase voltage[1] |
| Neutral current[1] | Frequency |
| Ground current[2] | Real power |
| Line voltage A-B | Reactive power |
| Line voltage B-C | Apparent power |
| Line voltage C-A | Power factor |
| Average line-line voltage | Kilowatt hours |
| | Kilowatt hours reverse |
| | Kilovar hours |
| | Kilowatt demand | note 1 - only for four wire systems (three phases plus neutral)
note 2 - only when ground sensor is used For each monitored parameter, the communications microcomputer 250 records, in a monitored parameter log, the present value as well as the maximum and minimum values that have occurred since the last time the log was cleared. The monitored voltage and current values are RMS values generated from sample values taken over a one-second interval. The frequency parameter is determined by measuring the time interval between successive zero-crossing points of the measured voltage signal for one of the three phases, doubling the measured interval and inverting it to convert it into a frequency.

The sampling algorithm and the method used to calculate the RMS current and voltage values are described in detail below. The other values in Table I may be calculated from the current and voltage samples or from the RMS current and voltage values by well known methods.

Either the host computer 140 or the BDU 117 may retrieve the monitored parameter values at any time. Either processor may also clear the monitored parameter log.

The protective functions implemented on the communications microcomputer 250 allow it to trip the breaker 202 on the occurrence of certain events or to activate the alarm signal to either sound an alarm or open the breaker 202, depending on the system configuration selected by the user. Table II lists the events for which the overcurrent microcomputer 210 (OC) and the communications microcomputer 250 (COM) may trip the breaker 202 and the parameters that are stored in the trip log when the breaker is tripped.

TABLE II

| Cause of Trip | Processor | Parameters logged |
|---|---|---|
| Overcurrent | OC | $I_A$, $I_B$ & $I_C$ |
| Short Circuit | OC | $I_A$, $I_B$ & $I_C$ |
| Ground Fault | OC | $I_A$, $I_B$, $I_C$ & $I_G$ |
| Current Imbalance | COM | $I_A$, $I_B$ & $I_C$ |
| Over Voltage | COM | VA-B, VB-C, VC-A & VAVE |
| Under Voltage | COM | VA-B, VB-C, VC-A & VAVE |
| Voltage Imbalance | COM | VA-B, VB-C, VC-A & VAVE |
| Over Frequency | COM | Freq., VA-B, VB-C, VC-A & VAVE |
| Under Frequency | COM | Freq., VA-B, VB-C, VC-A & VAVE |
| Reverse Power | COM | KW, KVAR, and KVA |
| Shadow | COM | $I_A$, $I_B$ & $I_C$ |

In Table II, $I_X$ indicates the present current in phase X, VX-Y indicates the present voltage measured from phase X to phase Y, VAVE indicates the average phase-to-phase voltage, KW, KVAR and KVA indicate the present value of real power, reactive power and apparent power, respectively. Table II assumes a three-wire system with no ground current input (except for the ground current trip). Except for the shadow protection, any of the trip events which are implemented using the communications microcomputer 250 must be specifically enabled from the host computer 140 before they can cause the breaker 202 to trip.

The alarm/relay functions which may be recognized by the trip unit are listed in Table III. All of these events are recognized by the communications microcomputer 250.

TABLE III

| Alarm event | Measured Parameter |
|---|---|
| Over phase current | $I_A$, $I_B$ & $I_C$ |
| Over ground current | $I_G^1$ |
| Over neutral current | $I_N^2$ |
| Over voltage | VA-B, VB-C & VC-A |
| Over KW | KW |
| Over KVA | KVA |
| Over Frequency | Frequency |
| Over Reverse KW | Reverse KW |
| Over KW demand | KW demand |
| Over KVAR | KVAR |
| Under Voltage | VA-B, VB-C & VC-A |
| Current Imbalance | $I_A$, $I_B$ & $I_C$ |
| Voltage Imbalance | VA-B, VB-C & VC-A |
| Power factor | Power factor | note 1 - requires ground current sensor
note 2 - requires four wire system

The communications microcomputer 250 maintains three logs for use in reporting significant events: the trip log, the event log and the alarm log. The trip log is a nonvolatile memory which holds the last three trip events that have occurred. The host computer 140 can access all three entries in the trip log with time stamps, but the BDU 117 can only access the most recent event without its time stamp. The event log is a volatile memory which holds, on the average, the ten most recent alarm events. More or less may be held, depending on the amount of data logged for each event. This log may only be read by the host computer 140. The alarm log holds the most recent alarm event. This log may only be read by the BDU 117. Either the BDU 117 or the host processor 140 can read the entire monitored parameter log.

As shown in Table I, one event which may cause the communications microcomputer 250 to trip the breaker 202 is a shadow event. This event occurs when the communications microcomputer 250 detects an overcurrent condition which should have caused the overcurrent microcomputer 210 to trip the breaker. To understand how the shadow protection function is implemented, it is helpful to understand how the overcurrent microcomputer 210 determines that an overcurrent condition exists and trips the breaker 202.

Figure 3B:
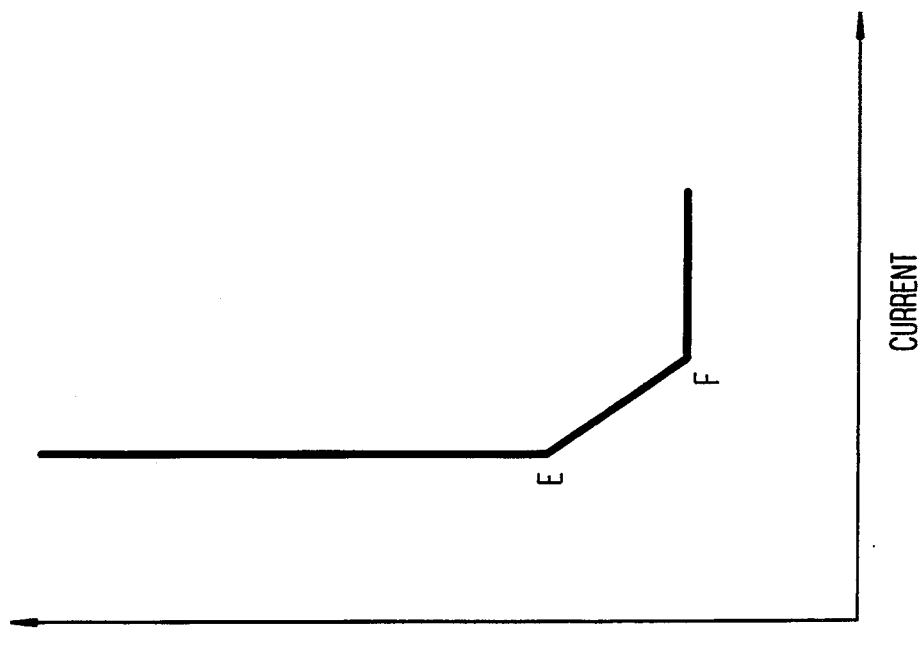
FIGS. 3a and 3b are graphs of current versus time which are useful for describing the operation of the trip unit shown in FIG. 2.
Figure 3A:
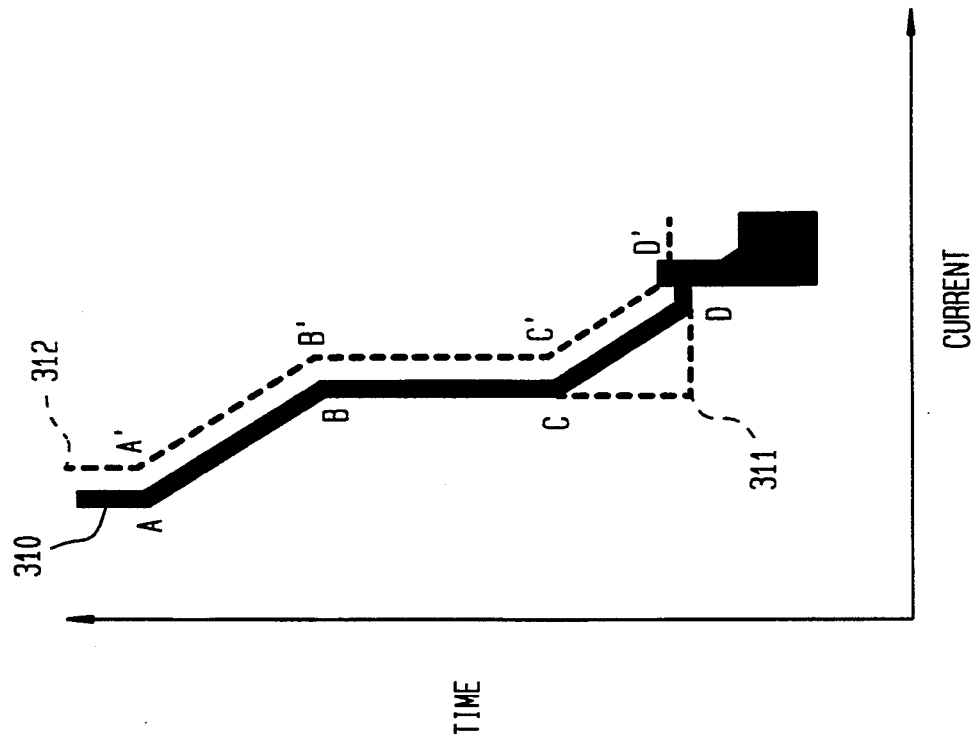

FIG. 3a is a graph of the trip curve 310 and the shadow protection curve 312. FIG. 3b is a similar curve which illustrates how the ground-fault trip function is implemented on a system which provides a ground sensor input signal to the trip unit.

In FIG. 3a, the coordinates of point A on the solid-line curve 310 represent the pickup current and delay parameters of the long-time trip setting. The coordinates of point C represent pickup current and delay parameters for the short-time trip setting and the current coordinate of point D represents the instantaneous trip current.

Point B on the curve 310 is determined as the intersection of a fixed slope line, originating at the long-time trip coordinates, and a line drawn vertically from the short-time trip coordinate. This line is referred to as an $I^2T$ curve. Similarly, the sloped line between points C and D is a fixed-slope line originating at the short-time trip coordinates and intersecting a line drawn vertically from the instantaneous trip coordinate. The broken line 311 illustrates the trip function without this short-time $I^2T$ curve.

The solid line 310 defines the pickup and trip functions performed by the overcurrent microcomputer 210. A pickup occurs whenever the current sensed on one of the phases can be mapped onto the curve 310.

The breaker is not tripped, however, until after the time delay indicated by the time coordinate of the trip curve at the pickup current value.

In this embodiment of the invention, the communications microcomputer 250 implements a shadow trip function. The broken-line curve 312 represents this function. It is noted that the shadow trip function can only cause a trip when the main overcurrent function, represented by the curve 310 has failed to do so. In this embodiment of the invention, the long-time (A'), short-time (C') and instantaneous (D') trip coordinates are set at values slightly greater than the maximum values which may be set for the overcurrent microcomputer 210 using the front panel switches 216. The trip point values for the shadow overcurrent protection curve are preset and cannot be reset by the user.

It is contemplated, however, that the set points for the shadow overcurrent curve may be specified by the operator either through the BDU or through the host microcomputer 140. Alternatively, they may be specified as offsets from the principal overcurrent curve, 310. In this instance, the shadow setpoints would change whenever the operator changed the setpoints for the curve 310 using the front-panel switches.

The ground fault curve shown in FIG. 3b consists of two points, a variable trip coordinate E, which may be specified by the operator using the front-panel switches 216, and a short-time trip coordinate F which is automatically set to a current that is 1.5 times the specified ground-fault pickup value and a delay of one-half second. The ramp between the points E and F is a fixed-slope $I^2T$ curve drawn between the variable trip coordinate and the resulting short-time trip coordinate.

All of the functions described above for the communications microcomputer 250 are implemented through a real-time program which controls the operation of the microcomputer. This program consists of a main, or background task and several interrupt handlers or foreground tasks. The main program uses sample values taken in response to a periodic interrupt and performs the calculations needed to generate the various monitoring values. The sampling interrupt routine samples all of the voltage and current waveforms over a one-second interval, squares the sample values and accumulates a sum of squares for use by the foreground task. Other interrupt handlers perform functions such as receiving communications packets from the host processor 140 and BDU 117.

In the materials that follow, the main loop of the program for the communications microprocessor 250 is described (FIGS. 4a through 4g). This is followed by a description of the sampling algorithm and the algorithm that controls the comm/watch LED 256 on the front panel of the trip unit (FIG. 6). The object code which implements the functions described with reference to FIGS. 4a through 4g as well as all of the interrupt service routines, including the comm/watch function, is contained in the attached software appendix. This object code is in the form of a program for the PROM 253.

Figure 4A:
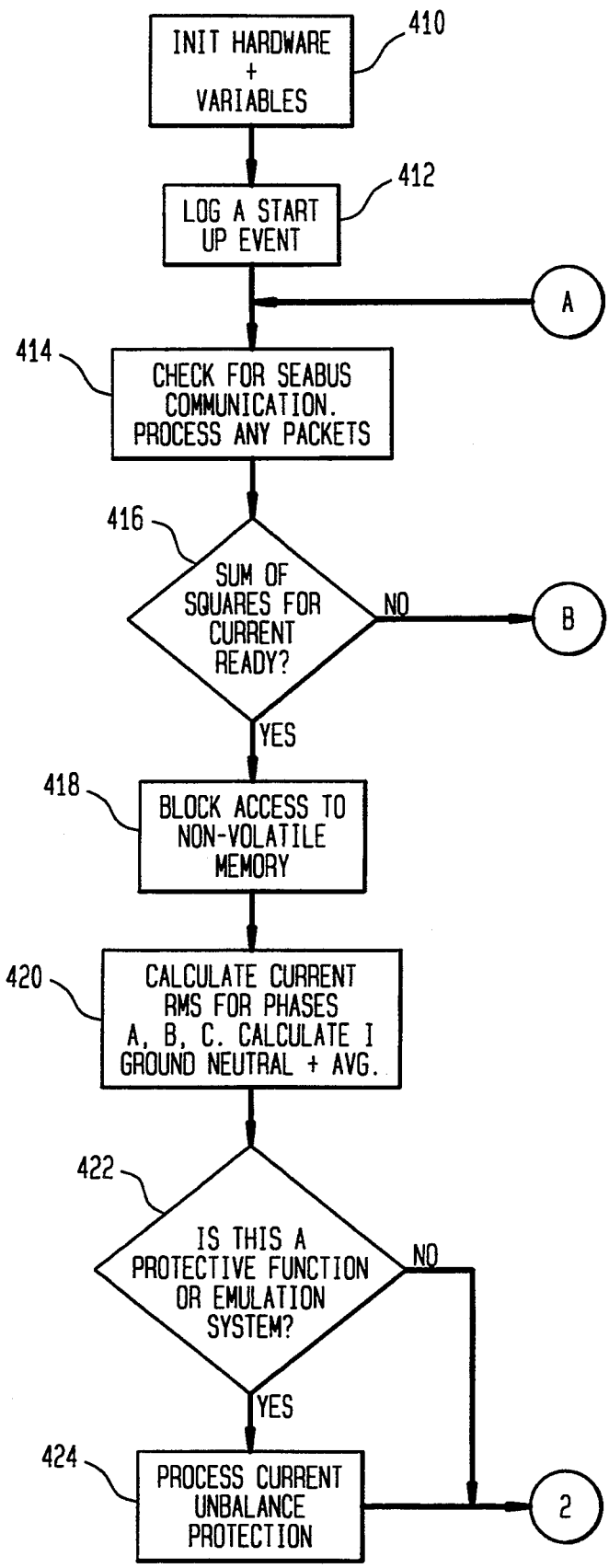
Figure 4B:
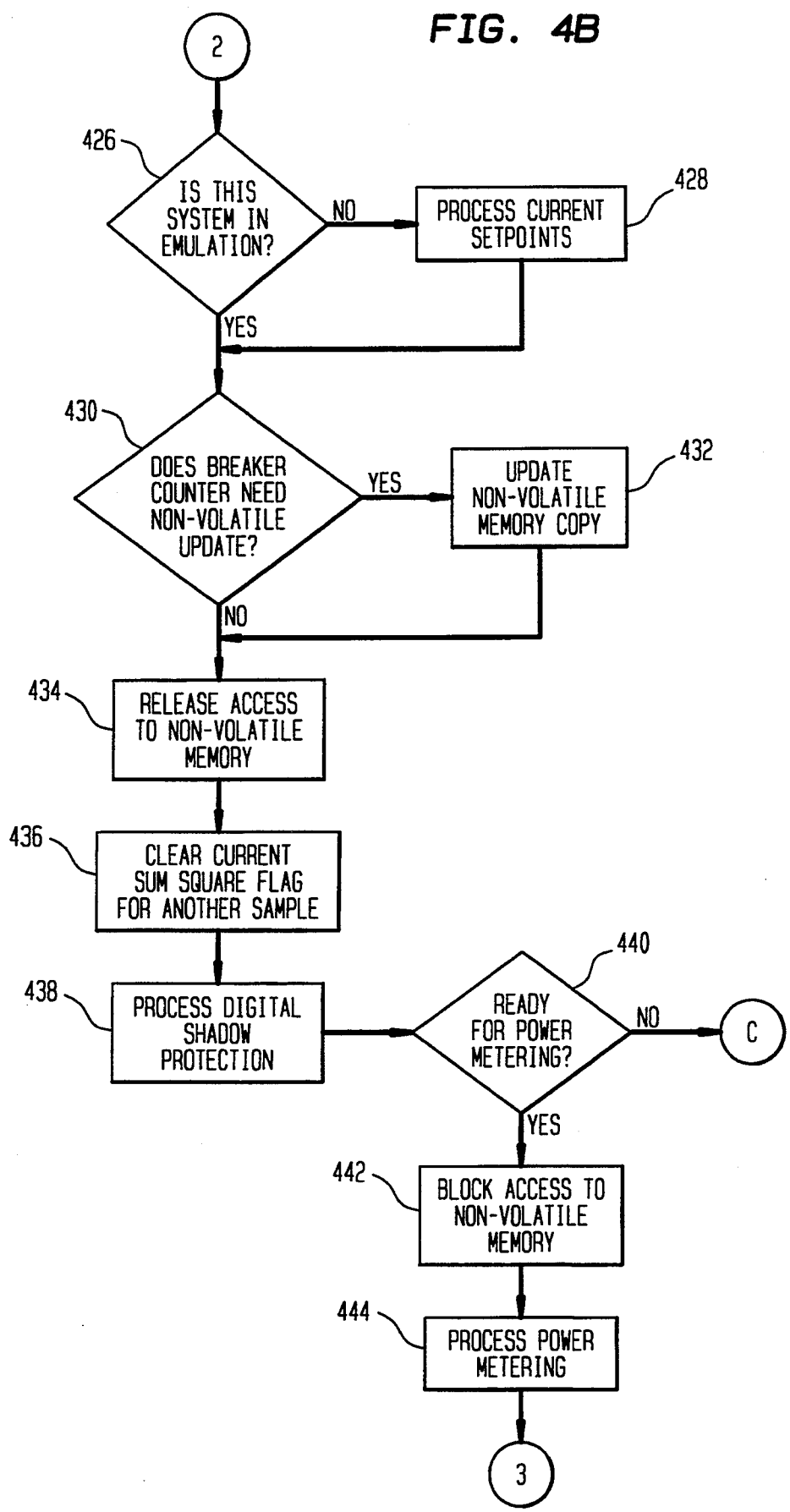

In FIG. 4a, the first step 410 in the main loop initializes the hardware registers and various program variables. The next step, 412, logs the initial start-up event in the event log. Step 414 then checks the RS-485 port 266 to determine if the host processor 140 is attempting to communicate with the communications processor 250. If so, any pending packets are processed at this time. The next step, 416, determines if the sum of squares of the voltage and current samples for the last one-second interval are ready for processing. If not, control passes to step 470 via the off-page connector B.

If, however, at step 416, the sums of the squares of the five current signals ($I_A$, $I_B$, $I_C$, $I_G$ and $I_N$) are ready, then, at step 418, the communications microcomputer 250 blocks access to the nonvolatile memory. This step prevents data from the log from being written into the nonvolatile memory by an interrupt service routine while the data is being read from the nonvolatile memory by the main loop. At step 420, the microcomputer 250 calculates the RMS value of each of the five current signals and the average of the three phase currents. In the exemplary embodiment of the invention, the RMS value for one of the signals is derived by taking the square root of the sum of squares value for the signal, provided by the sampling routine, and dividing by the square root of the number of sample values.

At step 422, the microcomputer 250 determines if it is operating in a protective mode or in an emulation mode. The emulation mode is used to provide compatibility with other communications systems (not shown). If the system is operating in a protective mode, step 424 is executed which performs current imbalance checks. These checks include determining if an imbalance condition exists, logging the event and starting a timer if the imbalance condition did not previously exist. If the imbalance condition is continuing, this step determines if the timer has expired or if the condition has ceased. If the condition has ceased, an inactive event is logged. After step 424, control is passed to step 426 of FIG. 4b via the off-page connector 2.

Step 426 branches around step 428 if the system is in emulation. Step 428 processes the current setpoints based on the RMS values calculated at step 420. This step monitors the signals from the overcurrent microcomputer 210 to determine if a pickup or trip event has occurred. If this is the first occurrence of a pickup or trip event, it is logged. If a previously active pickup condition has been cleared, an inactive event is logged.

After step 428, step 430 determines if the breaker counter value held in nonvolatile memory needs to be updated. This counter keeps track of the number of times the breaker 202 has been open/closed or trip/closed in a given trip sequence. Step 432 updates the counter if necessary.

Step 434 releases access to the nonvolatile memory and clears a sum-of-squares flag for this set of sum of squares values. The control microcomputer 250 uses two sets of sum of squares values. While one set is being used to collect current and voltage sample data, the other set, generated during the previous one-second interval, is used to generate the next set of RMS current and voltage values.

After step 436, the microcomputer 250 performs the digital shadow protection at step 438. As set forth above, the shadow protective function trips the breaker when overcurrent conditions are detected which are beyond the maximum values for a predetermined duration that could cause the overcurrent microcomputer 210 to trip the breaker. If overcurrent conditions at this level are detected, the overcurrent microcomputer 210 must not be operating properly. Consequently, the communications microcomputer 250 trips the breaker directly.

Step 440 is executed after step 438. This step determines if the system is able to perform power metering. Power metering functions are not performed, for example, if the system does not have the option enabled. If the system is not ready, control passes to step 470 of FIG. 4c via the off-page connector C. Otherwise, control passes to step 442 which blocks access to the non-volatile memory while the voltages VA-B, VB-C, and VC-A; the line power values, KW, KVAR and KVA; as well as the line frequency values are updated at step 444. After step 444, control passes via the off-page connector 3 to step 446 of FIG. 4c.

Step 446 allows communications access to the non-volatile memory and step 448 clears the power metering flag to allow voltage, power and frequency information to be collected for the next one-second interval. Step 450 checks if there are any pending data communications requests from either the host computer 140 or the BDU 117. If so, these requests are processed by this step.

Figure 4D:
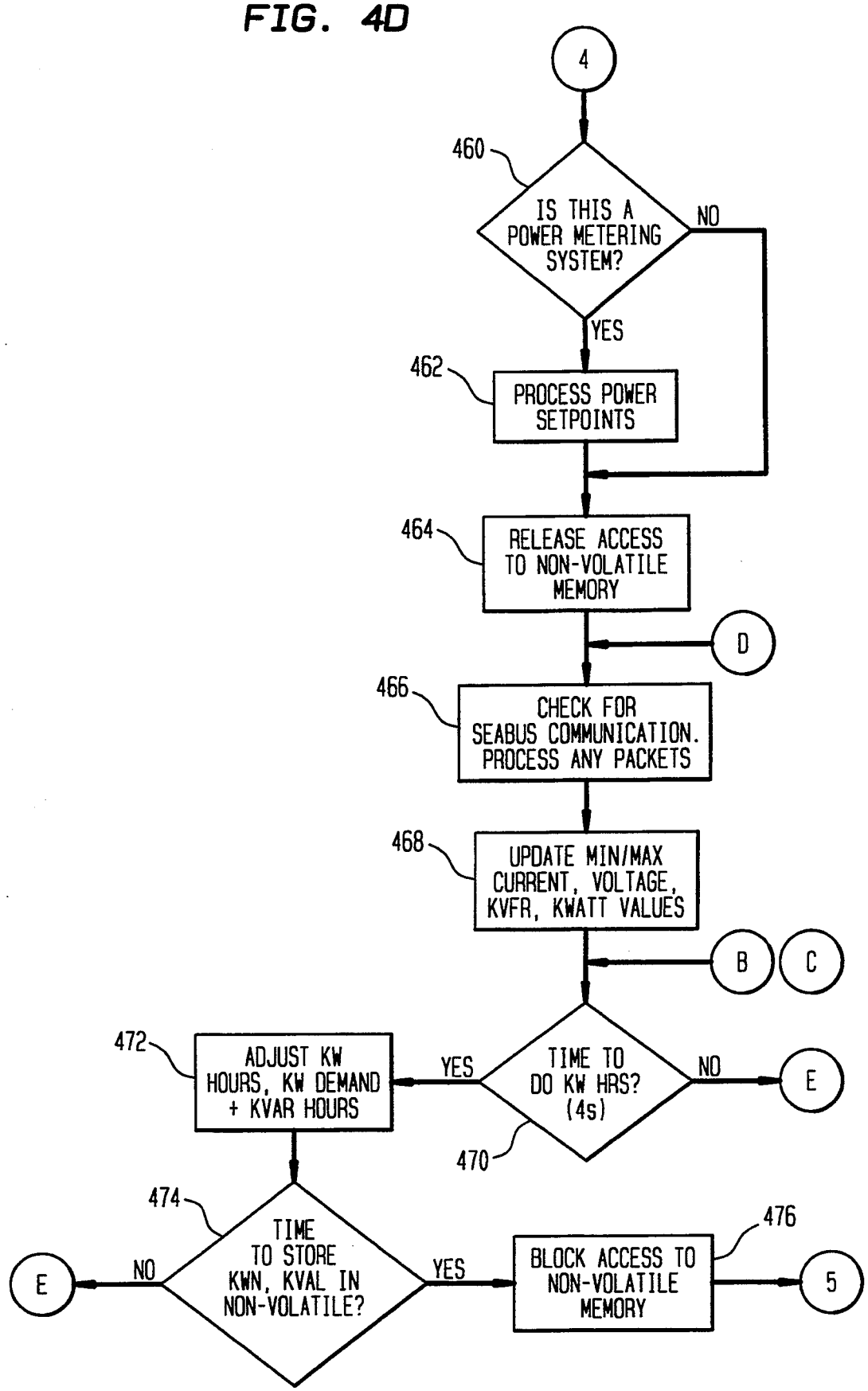

At step 452, if the system is in emulation mode, control is transferred via the off-page connector D to step 466 of FIG. 4d. Otherwise, step 454 blocks access to the non-volatile memory and step 458 performs the power protection functions if it is determined, at step 456, that the system can perform these functions.

In the exemplary embodiment of the invention, the power protection functions trip the breaker and log an event if any of the following conditions are detected: voltage imbalance, over voltage, under voltage, over frequency, under frequency and over reverse power, assuming that these trip values have been programmed by the operator. After step 458, control passes to step 460 of FIG. 4d via the off-page connector 4.

At step 460, if the system is a power metering system, step 462 is executed which processes the power set points. This step may either log the alarm condition and/or activate the alarm signal depending on the options selected by the operator. The alarm functions processed at this step are those described above with reference to Table III.

Step 464 releases access to the non-volatile memory so that, at step 466, any pending communications requests may be processed. Step 468 updates the minimum and maximum current voltage, KVAR, KW and KVA values that are stored in the monitored parameter log in volatile memory.

Step 470 determines if it is time to update the KW hours, KVA hours and KVAR hours values. These values are updated at four second intervals. If not, control passes, via off-page connector E to step 484 of FIG. 4e. Otherwise, step 472 calculates new values for these parameters.

Step 474 determines if it is time to update the values for KW hours, KVA hours and KVAR hours in the non-volatile memory. This operation is performed every eight hours and at any power loss. If not, control is passed to step 484 via the off-page connector E. Otherwise, the non-volatile entries are updated at step 476 and at steps 478 and 480 of FIG. 4e, and the values stored in volatile memory are cleared to allow new values to be calculated. Step 484 processes any pending communications requests that may have occurred while access to the non-volatile memory was blocked.

Figure 4E:
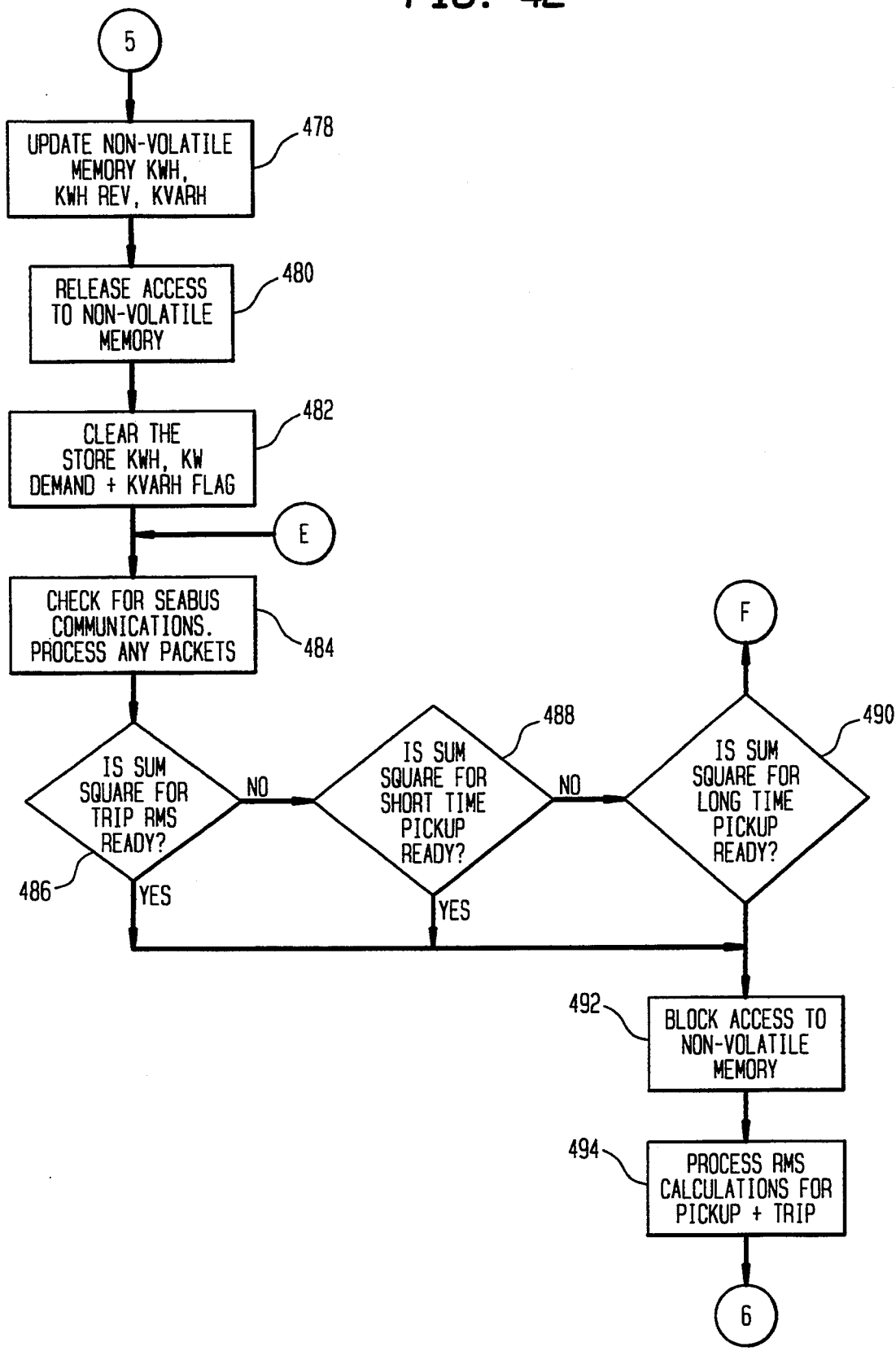
Figure 4F:
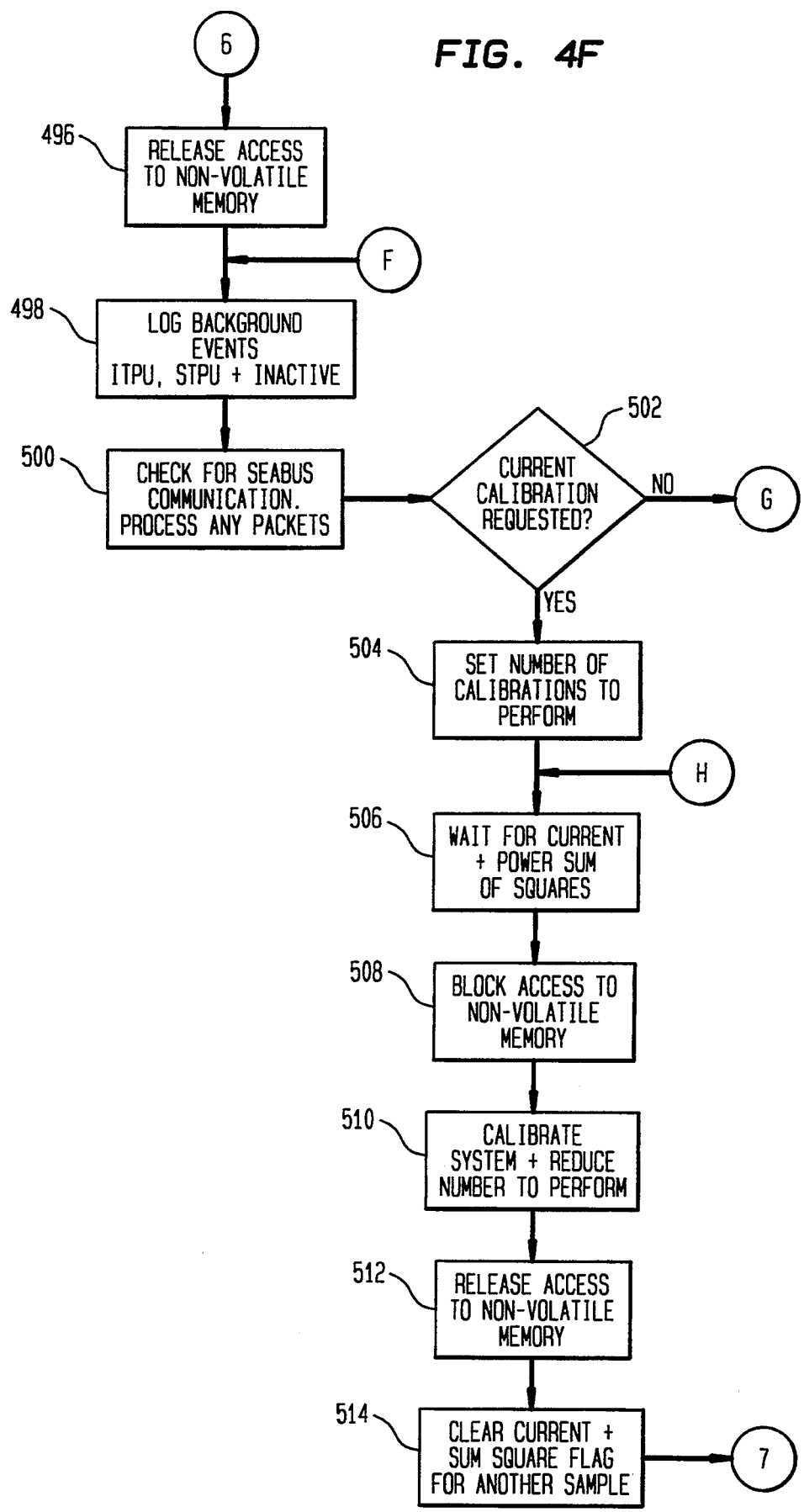

Step 486 of FIG. 4e through step 496 of FIG. 4f perform special processing of the samples being obtained from the sampling interrupt routine when the overcurrent microcomputer 210 has tripped the breaker or has had a long-time or short time pickup. If any of these events has occurred, step 494 calculates RMS current values based on only the 17 current samples that were collected in the last cycle of the current signals $I_A$, $I_B$ and $I_C$ and then logs the calculated values.

step 498 permits events which have been flagged in an interrupt service routine to be logged. These events include long-time pickup, short-time pickup, breaker close, breaker open and breaker trip. Step 500 parses any communications requests that were received during the previous processing.

Figure 4G:
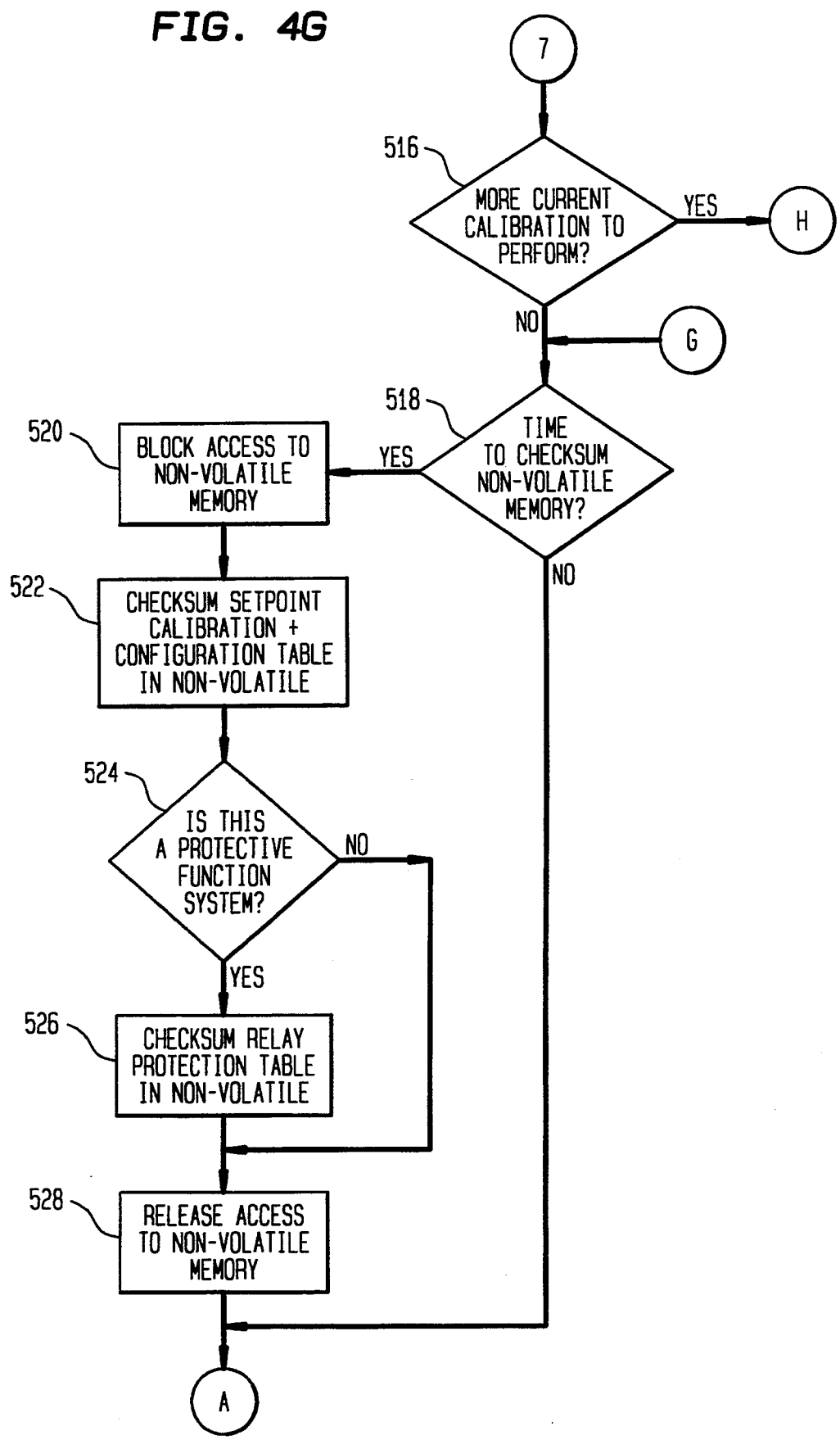

Steps 502 to 516 (FIG. 4g) perform various calibration functions on the trip unit under the control of the host computer 120. Finally, steps 518 through 528 of FIG. 4g are invoked periodically to generate a checksum for the data in the non-volatile memory. After step 528, control returns to step 414 of FIG. 4a, described above, via the off-page connector A.

FIGS. 5a through 5c are timing diagrams which are useful for describing the operation of the sampling interrupt routine executed by the communications microprocessor 250. FIG. 5a shows successive one-second intervals, $T_1$, $T_2$, $T_3$, ... $T_N$, $T_{N+1}$, each of which is divided into 58 sampling sub-intervals, $FS_1$ through $FS_{58}$. FIG. 5b shows details of one of the one-second intervals in which each of the sampling sub-intervals FS includes an active sampling interval of 17.07 milliseconds (ms) and an inactive interval of 0.17 ms. FIG. 5c shows details of the active sampling interval which includes 17 0.980 ms sampling intervals and a single 0.408 ms sampling interval.

These timing diagrams illustrate the operation of the sampling interrupt routine. This routine periodically interrupts the main program loop, described above with reference to FIGS. 4a through 4g, to collect sample values corresponding to five current signals $I_A$, $I_B$, $I_C$, $I_G$ and $I_N$ (assuming a 4 wire system with a ground current sensor) and three voltage signals VA-B, VB-C, and VC-A (or VA, VB, and VC for a 4 wire system).

During each one of the sampling intervals, FS, the routine collects 17 samples of each of the current signals and two samples for each of the voltage signals during each 16.66 ms (1/60 Hz) interval. In addition, in a 0.408 ms offset interval between successive 16.66 ms intervals, the routine collects one more sample for each of the three voltage signals. The combination of the 0.408 ms offset interval and the 0.17 ms inactive interval between successive sampling intervals changes the location in the period of the 60 Hz voltage signal at which samples are taken from period to period.

In this embodiment of the invention, the current samples taken during a 16.66 ms interval are sufficient to resolve the 8th harmonic of the 60 Hz current waveform while the voltage samples taken during a one-second interval are sufficient to resolve the 13th harmonic of the 60 Hz voltage waveform, assuming the waveform remains substantially the same over the one-second interval.

Starting from time T1, the microcomputer 250 collects three voltage samples for VA-B, VB-C, and VC-A, respectively, and then sets a first interrupt to occur within 20 microseconds and a second interrupt to occur at time $T_{1A}$ after a 0.408 ms delay from time T1. The interrupt service routine, POWER_SAMPLES invoked by the first interrupt squares and accumulates each of the collected voltage values.

The interrupt service routine for the second interrupt collects up to five current samples, $I_A$, $I_B$, $I_C$, $I_G$ and $I_N$, as well as three more voltage samples. The current and voltage samples are squared and accumulated by a separate interrupt service routines, SUM_SQUARES and POWER_SAMPLES, respectively. As soon as the samples are collected, the microcomputer 250 sets these interrupts to occur before the next sampling interrupt and also sets another sampling interrupt to occur at time $T_{1B}$, after a delay of 0.980 ms from time $T_{1A}$.

At time $T_{1B}$, the microcomputer 250 again takes five current samples and three voltage samples, schedules interrupts for SUM_SQUARES and POWER_SAMPLES to square and accumulate these sample values and another sampling interrupt, to occur at time $T_{1C}$, 0.980 ms after time $T_{1B}$. The POWER_SAMPLES routine continues to schedule itself during the remainder of the 16.6 ms interval in order to calculate the watts and vars measurements.

At time $T_{1C}$, the microcontroller only collects the five current samples, schedules an interrupt which invokes SUM_SQUARES to square and accumulate the current samples and schedules the next sampling interrupt. This step is repeated 14 more times until time $T_{11}$, at the end of the 18th sample time of the 17.06 ms sampling interval. During this last sample interval, the microcomputer 250 sets a sampling interrupt to occur at time $T_{12}$, 0.17 ms after time $T_{11}$. The pattern established in the sampling interval FS1 is repeated in the interval FS2 which begins at time $T_{12}$.

The multiple interrupt service routines, each consuming only a small amount of processing time, are used to ensure that the samples are collected in a timely manner and that the microcomputer 250 is not kept in an uninterruptable state (i.e. processing an interrupt service routine) when a communications interrupt, circuit breaker trip or other critical event needs to be handled.

At the end of each of the sampling intervals FS, five accumulated sum of squares values are available representing the five current signals during the preceding cycle of the three-phase 60 Hz power signal. As set forth above, these sample values are used to calculate and log an RMS value for the current signals after a pickup or trip event, caused by the overcurrent microcomputer 210, is detected by the communications microcomputer 250. The one-cycle RMS values from successive sampling intervals FS are accumulated to produce a set of one-second RMS values which are used by the communications microcomputer 250 in its monitoring and protective functions. The RMS voltage samples are only accumulated over one second intervals.

FIG. 6 is a flow-chart diagram which is useful for describing the process by which the communications microcomputer 250 controls the COMM/WATCH LED 256 shown in FIGS. 2 and 2a. The COMM-/WATCH LED performs two functions. First, it strobes on for 0.5 seconds and then off for 2.5 seconds of each 3 second interval to indicate that the communications microcomputer 250 is operational. Second, when the communications interrupt is receiving a packet of data from or transmitting a packet of data to the host computer 140, the LED blinks on and off rapidly. These two functions allow an operator to quickly determine that a trip unit is operating properly and is able to receive commands from the host processor.

The COMM/WATCH function is implemented across the sampling and communications handling interrupt routines. Thus, this process occurs while the microcomputer 250 is performing the background tasks of the main program and the sampling tasks of the sampling interrupt routine.

The COMM/WATCH function is activated at 2.5 ms intervals when, at step 610, the microcomputer 250 strobes its watchdog timer. This strobe is monitored by a watchdog circuit (not shown) which is internal to the microcomputer 250. This circuit resets the microcomputer 250 when an expected strobe does not occur. If, at step 612, a COMM LED flag is not active, control is transferred to step 614 to determine if a communications operation is in progress. If so, then at step 616, the process changes the state of the LED 256 either from on to off or from off to on. At the same time, steps 618 and 620 set the COM LED flag to active and start a COMM LED timer. After step 620, the process is complete until the start of the next 2.5 ms interval.

If, at step 612, the COMM LED flag is active, and, as step 622, a communications operation is in progress, step 624 is executed which decrements the COMM LED timer. If the timer has not expired at step 626, the process is complete until the start of the next 2.5 ms interval. If, however, at step 626, the COMM LED timer has expired, step 628 changes the state of the LED 256 and restarts the COMM LED timer. The COMM LED timer is set to cycle the LED 256 on and off at a rate sufficient to be recognized as a blinking light.

If, at step 614 or step 622, a communications operation is not in progress, step 632 is executed which resets the COMM LED flag to inactive. Steps 634, 636, 638 and 640 implement the WATCH function. This function continually cycles the LED 256 on for 0.5 seconds and then off for 2.5 seconds.

While the present invention has been described in terms of an exemplary embodiment, it is contemplated that it may be practiced as outlined above within the spirit and scope of the appended claims.

APPENDIX

```
S1138000434F5059524947485420286329203139 55
S113801039312053 49454D454E5320435 0434F4D2C
S11380202056455220322E323420 7E829D0CEC01A3
S113803018E300ED01A6008900A700394F5FDD9326
S11380409690D6923DDD95968FD6923DD394DD944D
S11380502403 7C00939690D6913DD394DD9424031D
S11380607C0093968FD6913DD393DD93397F008D19
S11380 70DC852A074050820073008DDD85DC872A69
S113808007405082 0073008DDD874F5FDD8996863F
S11380 90D6883DDD8B9685D6883DD38ADD8A240338
S11380A07C00939686D6873DD38ADD8A24037C00A0
S11380B0939685D6873DD389DD897D008D2A12CE9E
S11380C0008CC6040DA60088FF8900A700095A2663
```

```
S11380D0F4398610978F3CCE00906F006F016F04C7
S11380E06F0538680369026901690079009179 00B4
S11380F0906803690269016900790091790 0903CF4
S1138100CE0090EC0405ED04ED0268036902EC0076
S11381101AA3022314EC04C30001ED04EC02C3000F
S113812001ED02EC00A302ED007A008F2EB4EC0402
S113813038ED003937363C7F009B7F009C7F009DE3
S1138140C60618CE009E186D00260A5A2704180881
S113815020F47E8271D79386FF50C300A3188F86C4
S113816003CE00986D0026064A27E70820F6DF9024
S1138170979290932EDC18E601E10025034A180932
S11381801640979681042ECA86FFC3009DDD94DEB7
S1138190909692 4A271F978F18EC011AA300251274
S11381A02216968F4A271418E603E1022504C60115
S11381B020147E82367E8254968F4AEE004D27012B
S11381C00818EC01028FD797DE94EB00E700D692F3
S11381D0D78FDE90A600D6973DDDA418EC0093A4BB
S11381E018ED007A008F2735DE90A601D6973DDD85
S11381F0A418EC0193A418ED012403186A007A0072
S1138200 8F271ADE90A602D6973DDDA418EC0293C0
S1138210A418ED022407CDEE0009CDEF0018EC0000
S113822027074D270EDE90201718087A00962D4157
S113823 07C00957E818F7A00962D367C00951808F7
S1138240E6004F8F0818EC0027DF028F4D2702C687
S1138250F07E81C6E6004F8FCDAC00230C7A0096E9
S113826 02D0F7C0095180820EF18EC00028F7E81FA
S1138270C6383233393637CC0000DD8F9693E602A8
S113828 03DDD919693E6013DD390DD9024037C007F
S1138290 8F9693E6003DD38FDD8F3332390F7F10F5
S113 82A03D86419724861B97397F003586209701A8
S113 82B01500208E03FFCE039F6F5F0926FB8E03FC
S113 82C0FF18CEEA60180926FC18CEEA60180926C1
S113 82D0FC18CEEA60180926FC863A97098620978E
S113 82E0088605975D860E975F8670975E86009771
S113 82F05C86FF9703860097028 65797287F002C99
S1138300862C972D860097208 61597218600972620
S1138310CC0000FD01DBDDB797B9860197BA7F0079
S113 832084FC7E9BFD01E9FC7E9DFD01EBCC0000FD
S1138330FD0388FC7E9FFD01E5FC7EA1FD01E7CCE9
S11383400000FD038AFC7EA3FD01DFFC7EA5FD0188
S1138350E1CC0000FD038CBD9AF6FC7EA7FD020F64
S113836 07F01C17F01C07F01BF8601B701BE8601C5
S1138370B701BC8614B701BD865BB701BB86FF9706
S1138380C3CC000097BEDDBFDDC1CE7EEB18CE02AC
S1138390 11A60018A700081808188C026125F2CE4F
S113 83A00261860B6F00084A26FACC0296FD0292FF
S113 83B0FD0294860 09772143C04153C0B86BD970D
S113 83C02286 2497D0146201146401146301146694
S113 83D00186 2597D1146202146402146302 1466A0
S113 83E00286 2697D2146204146404146304146687
S113 83F00486 2797D3146208146408146308146667
S1138400008C63AD7F3863A97F4C611D7F2DC0EC3FE
S1138410035BDD1ADC0EC301E6DD16C30019C313CA
S1138420 88DD1CC3000CC31388DD1ECC005ADDB4E8
S1138430860A97B6963F817B2708867BCE003FBD90
S1138440CFCF86109735FC7E2BBDD332B67E2A81E2
S1138450DE22068100270220 0586DEBDD38B14BDF3
```

```
S11384600215BD017F03527F03678619B703518646
S1138470E0972ABDBABDB67EAB270C8103230886DC
S113848000CE7EABBDCFCFB67E338580270E8A80EB
S1138490CE7E33BDCFCF148440BDBAD20E86FF97B3
S11384A092BDB66D148420BDD0B9126A02037E89D0
S11384B01ABDD0A8BD89CB13810C03BDAAFA1281C1
S11384C00403BDADADFC020F1AB37EA72706CE7E12
S11384D0A7BDCFBF15BE02156A02BDBA0C126A0849
S11384E0037E891ABDD0A8BD8E4F15BE02156A0839
S11384F0BDD0B912810416BDD0A812812802200370
S1138500BDAB8213812003BDAF8515BE02BDD0B9BA
S1138510FC020D1AB3025F240FFD025FCC025FBDA3
S1138520D02E14BE20147B01FC020B1AB3025D246E
S11385300FFD025DCC025DBDD02E14BE20147B0164
S1138540FC02091AB3025B240FFD025BCC025BBD83
S1138550D02E14BE20147B01FC02071AB302592446
S11385600FFD0259CC0259BDD02E14BE20147B013C
S1138570FC02051AB30257240FFD0257CC0257BD63
S1138580D02E14BE20147B01FC02031AB30255241E
S11385900FFD0255CC0255BDD02E14BE20147B0114
S11385A0FC02011AB30253240FFD0253CC0253BD43
S11385B0D02E14BE20147B01FC01FF1AB3025124F7
S11385C00FFD0251CC0251BDD02E14BE20147B01EC
S11385D0FC01FD1AB3024F240FFD024FCC024FBD24
S11385E0D02E14BE20147B01FC01FB1AB3024D24CF
S11385F00FFD024DCC024DBDD02E14BE20147B01C4
S1138600FC01F91AB3024B240FFD024BCC024BBD03
S1138610D02E14BE20147B01FC01F71AB3024924A6
S11386200FFD0249CC0249BDD02E14BE20147B019B
S1138630FC01F51AB30247240FFD0247CC0247BDE3
S1138640D02E14BE20147B01FC01F31AB30245247E
S11386500FFD0245CC0245BDD02E14BE20147B0173
S1138660FC01F11AB30243240FFD0243CC0243BDC3
S1138670D02E14BE20147B01FC01DB27151AB30293
S113868039240FFD0239CC0239BDD02E14BE20147A
S11386907B01FC01EF1AB302412C0FFD0241CC0215
S11386A041BDD02E14BE20147B01FC01ED1AB3028F
S11386B03F2C0FFD023FCC023FBDD02E14BE201430
S11386C07B01FC01E31AB3023D2C0FFD023DCC02F9
S11386D03DBDD02E14BE20147B01FC023B2D11277E
S11386E01EFC01DD2D081AB3023B2E1A202720168A
S11386F0FC01DD2D02201E1AB3023B2E092016FCBC
S113870001DD2C112000FD023BCC023BBDD02E1418
S1138710BE20147B01FC020D1AB30237230FFD02A5
S113872037CC0237BDD02E14BE20147C02FC020BC1
S11387301AB30235230FFD0235CC0235BDD02E14F9
S1138740BE20147C02FC02091AB30233230FFD027B
S113875033CC0233BDD02E14BE20147C02FC02079D
S11387601AB30231230FFD0231CC0231BDD02E14D5
S1138770BE20147C02FC02051AB3022F230FFD0253
S113878022FCC022FBDD02E14BE20147C02FC020379
S11387901AB3022D230FFD022DCC022DBDD02E14B1
S11387A0BE20147C02FC02011AB3022B230FFD022B
S11387B02BCC022BBDD02E14BE20147C02FC01FF56
S11387C01AB30229230FFD0229CC0229BDD02E148D
S11387D0BE20147C02FC01FD1AB30227230FFD0204
S11387E027CC0227BDD02E14BE20147C02FC01FB32
```

```
S11387F01AB30225230FFD0225CC0225BDD02E1469
S1138800BE20147C02FC01F91AB30223230FFD02DB
S113881023CC0223BDD02E14BE20147C02FC01F70D
S11388201AB30221230FFD0221CC0221BDD02E1444
S1138830BE20147C02FC01F51AB3021F230FFD02B3
S11388401FCC021FBDD02E14BE20147C02FC01F3E9
S11388501AB3021D230FFD021DCC021DBDD02E1420
S1138860BE20147C02FC01F11AB3021B230FFD028B
S11388701BCC021BBDD02E14BE20147C02FC01DBD9
S113888027151AB30211230FFD0211CC0211BDD01A
S11388902E14BE20147C02FC01EF1AB302192F0F10
S11388A0FD0219CC0219BDD02E14BE20147C02FC8A
S11388B001ED1AB302172F0FFD0217CC0217BDD01A
S11388C02E14BE20147C02FC01E31AB302152F0FF0
S11388D0FD0215CC0215BDD02E14BE20147C02FC62
S11388E002132D11271EFC01DD2D081AB302132DCE
S11388F01A20272025FC01DD2D02200F1AB30213B4
S1138900ZD092016FC01DD2F112000FD0213CC02DD
S113891013BDD02E14BE20147C0213840849BD98C4
S11389207415840813841O3FBDD0A8FC01E9CE7EE1
S11389309BBDCFC7FC01EBCE7E9DBDCFC7FC01E53F
S11389403CE7E9FBDCFC7FC01E7CE7EA1BDCFC7FCC5
S113895001DFCE7EA3BDCFC7FC01E1CE7EA5BDCF96
S1138960C715BE02158410BDD0B9126C020A126C70
S113897020061Z6C08022009BDD0A8BD9B1915BEA3
S113898002BDB619BDD0B9136D01208605B7028F9B
S1138990136A02FC136A08F8BDD0A8BD9DCD15BEAC
S11389A002156A02156A08126D01E513842019BDC7
S11389B0D0A8158460BDBB0CBDBAD2BDBB801381E9
S11389C00803BDBB4615BE027E84A71368010615C5
S11389D066017E8A7512650124DCB0FD0290FC7E7E
S11389E00A1A8309C4220B1A8307D02505FD010D39
S11389F02006CC08CAFD010D1566012022DCB0FD5D
S1138A000290FC7E001A838E94220B1A8386C4255E
S1138A1005FD010D2006CC8AACFD010D1466011381
S1138A20650132FC01291A8300002215FC012B1A6E
S1138A3083F000220CCE0129CC0000ED00ED0220D1
S1138A4014FC012B83F000FD012B2409FC01298374
S1138A500001FD0129CE0129CC020DFD0113BD80C9
S1138A60D2EC00BDAA851265010BFC020D1A93B06D
S1138A7022031466011368020615660Z7E8B1F1218
S1138A80650224DCB0FD0290FC7E0A1A8309C4222C
S1138A900B1A8307D02505FD010D2006CC08CAFD5D
S1138AA0010D1566022022DCB0FD0290FC7E021A44
S1138AB0838E94220B1A8386C42505FD010D20069E
S1138AC0CC8AACFD010D14660213650232FC012D43
S1138AD01A8300002215FC012F1A83F000220CCE09
S1138AE0012DCC0000ED00ED022014FC012F83F0D9
S1138AF000FD012F2409FC012D830001FD012DCE71
S1138B00012DCC020BFD0113BD80D2EC00BDAA8562
S1138B101265020BFC020B1A93B0220314660213B3
S1138B206804061566047E8BC912650424DCB0FD56
S1138B30029OFC7E0A1A8309C4220B1A8307D025EB
S1138B4005FD010D2006CC08CAFD010D15660420A3
S1138B5022DCB0FD0290FC7E041A838E94220B1A50
S1138B608386C42505FD010D2006CC8AACFD010DCC
S1138B7014660413650432FC01311A8300002215C3
S1138B80FC01331A83F000220CCE0131CC0000ED3D
```

```
S1138B9000ED022014FC013383F000FD01332409AD
S1138BA0FC0131830001FD0131CE0131CCC029FD0C
S1138BB00113BD80D2EC00BDAA851265040BFC0232
S1138BC0091A93B02203146604136808061566088C
S1138BD07E8C7312650824DCB0FD0290FC7E0A1AB8
S1138BE08309C4220B1A8307D02505FD010D200635
S1138BF0CC08CAFD010D1566082022DCB0FD0290E8
S1138C00FC7E061A838E94220B1A8386C42505FDE6
S1138C10010D2006CC8AACFD010D14660813650800D
S1138C2032FC01391A8300002215FC013B1A83F03F
S1138C3000220CCE0139CC0000ED00ED022014FC22
S1138C40013B83F000FD013B2409FC013983000151
S1138C50FD0139CE0139CC0205FD0113BD80D2ECF2
S1138C6000BDAA851265080BFC02051A93B0220305
S1138C70146608FC01351A8300002215FC01371A1A
S1138C80837FFF220CCE0135CC0000ED00ED0220E5
S1138C9014FC0137837FFFFD01372409FC01358370
S1138CA00001FD0135DCB2FD0290FC7E081A8394BC
S1138CB070220B1A838CA02505FD010D2006CC9093
S1138CC088FD010DCE0135CC0207FD0113BD80D214
S1138CD0EC00BDAA85CE00936F006F016F0218CE21
S1138CE0020DBD802D18CE020BBD802D18CE0209B9
S1138CF0BD802DA600273FCE009E6F006F016F023E
S1138D0018CE009318EC00ED0318A602A705CE00B8
S1138D1098CC0000ED008603A702BD813418CE0074
S1138D209B18A600260818EC01FD02032012CCFFB4
S1138D30FFFD0203200AEC01CE0003028FFD0203B3
S1138D40FC02031A93B0250CCC005ADDB4860A97B2
S1138D50B67E8E4EDEB0038CE146250CCC0055DD8C
S1138D60B4860D97B67E8E4E8CC7AD250CCC0050C4
S1138D70DDB4861197B67E8E4E8CBAE0250CCC00FD
S1138D804DDDB4861497B67E8E4E8CAE13250CCC76
S1138D900049DDB4861797B67E8E4E8CA147250C0C
S1138DA0CC0043DDB4861997B67E8E4E8C947A251A
S1138DB00CCC003DDDB4861B97B67E8E4E8C87AD01
S1138DC0250CCC0034DDB4862097B67E8E4E8C7A8A
S1138DD0E0250CCC002EDDB4862397B67E8E4E8C17
S1138DE06E14250CCC0024DDB4862797B67E8E4EF7
S1138DF08C6147250CCC001EDDB4862A97B67E8E86
S1138E004E8C547A250CCC001BDDB4862B97B67E91
S1138E108E4E8C47AD250CCC0017DDB4862D97B64D
S1138E207E8E4E8C3AE1250CCC0012DDB4862D9753
S1138E30B67E8E4E8C2E14250CCC000ADDB4862D05
S1138E4097B67E8E4ECC000ADDB4862D97B639CC0B
S1138E5001F9FD0113CC0258FD0290FC7E121A8325
S1138E604362220B1A833B922505FD010D2006CC9B
S1138E703F7AFD010DCE0185BD80D2EC00BDAA85EF
S1138E80CC01F7FD0113CC0258FD0290FC7E141AAC
S1138E90834362220B1A833B922505FD010D2006B4
S1138EA0CC3F7AFD010DCE0189BD80D2EC00BDAA74
S1138EB085CC01F5FD0113CC0258FD0290FC7E1611
S1138EC01A834362220B1A833B922505FD010D2070
S1138ED006CC3F7AFD010DCE018DBD80D2EC00BDE4
S1138EE0AA85FC01F9F301F7F301F5CE0003028F23
S1138EF0FD01F38C00022609FC01F3C30001FD010E
S1138F00F3138204037E8FA1861A978F4F5FDD933C
S1138F10B601FAD68F3DDD94B601F9D68F3DD393D1
```

```
S1138F20DD93DC94CE002D028FFD02018C0016230C
S1138F3009FC0201C30001FD0201861A978F4F5FED
S1138F40DD93B601F8D68F3DDD94B601F7D68F3D9B
S1138F50D393DD93DC94CE002D028FFD01FF8C00B2
S1138F60162309FC01FFC30001FD01FF861A978F38
S1138F704F5FDD93B601F6D68F3DDD94B601F5D68D
S1138F808F3DD393DD93DC94CE002D028FFD01FD44
S1138F908C00162309FC01FDC30001FD01FD7E9038
S1138FA034CC0201FD0113CC0258FD0290FC7E1268
S1138FB01A834362220B1A833B922505FD010D207F
S1138FC006CC3F7AFD010DCE01A9BD80D2EC00BDD7
S1138FD0AA85CC01FFFD0113CC0258FD0290FC7E52
S1138FE0141A834362220B1A833B922505FD010D5B
S1138FF02006CC3F7AFD010DCE01ADBD80D2EC0040
S1139000BDAA85CC01FDFD0113CC0258FD0290FCE4
S11390107E161A834362220B1A833B922505FD01B7
S11390200D2006CC3F7AFD010DCE01B1BD80D2ECFE
S113903000BDAA85FC0201F301FFF301FDCE00038C
S1139040028FFD01FB8C00022609FC01FBC3000119
S1139050FD01FBFC020DDD8F12820405FC01F920E9
S113906003FC0201DD91BD803CCE009318CE01517A
S1139070EC0018ED00EC0218ED02FC020BDD8F127F
S1139080820405FC01F72003FC01FFDD91BD803C57
S113909000CFC0153D395FD0153FC0151D9949993D0
S11390A0FD0151FC0209DD8F12820405FC01F5204B
S11390B003FC01FDDD91BD803C0CFC0153D395FD07
S11390C00153FC0151D9949993FD015118CE0151DA
S11390D0CE009ECC0000ED0018EC00ED0218EC026E
S11390E0ED04CE00988600A70012820405CC06C4C5
S11390F02003CC03E8ED01BD813418CE009BCE01E2
S1139100F118A6002707CCFFFFED00200518EC019D
S1139110ED00CE0191156280EC002C12C6040DA660
S11391200388FF8900A703095A26F414628018CE25
S11391300191CE009ECC0000ED0018EC00ED021869
S1139140EC02ED04CE00988600A7001265011A1205
S1139150680116FC7E1E1A8305DC22081A83057832
S1139160250220003CC05AA2014FC7E181A835EEC89
S1139170220081A83571C25022003CC5B04ED01BD91
S11391800813418CE009BCE019118A6002707CC7F0E
S1139190FFED00200E18EC012C07CC7FFFED002022
S11391A002ED001362800FC6020DA60188FF89003C
S11391B0A701095A26F4CE0195156280EC002C1201
S11391C0C6040DA60388FF8900A703095A26F414D0
S11391D0628018CE0195CE009ECC0000ED0018EC04
S11391E000ED0218EC02ED04CE00988600A70012F0
S11391F065021A12680216FC7E1E1A8305DC220818
S113920001A83057825022003CC05AA2014FC7E1AB3
S113921001A835EEC22081A83571C25022003CC5BB8
S1139220004ED01BD813418CE009BCE019518A60033
S11392302707CC7FFFED00200E18EC012C07CC7F14
S1139240FFED002002ED001362800FC6020DA6019F
S1139250088FF8900A701095A26F4CE019915628076
S1139260EC002C12C6040DA60388FF8900A703098D
S113927005A26F414628018CE0199CE009ECC0000C8
S1139280ED0018EC00ED0218EC02ED04CE00988617
S113929000A7001265041A12680416FC7E1E1A83C5
S113929A005DC22081A83057825022003CC05AA20B0
```

```
S11392B014FC7E1C1A835EEC22081A83571C2502B8
S11392C02003CC5B04ED01BD813418CE009BCE019C
S11392D09918A6002707CC7FFFED00200E18EC019B
S11392E02C07CC7FFFED002002ED001362800FC637
S11392F0020DA60188FF8900A701095A26F41583E7
S113930007FC01912C03148301FC01952C031483A5
S113931002FC01992C031483041383070612830 7A8
S11393200520067E93A07E93BA128303231283063C
S11393301F1283052F1383033F1383063B138305F7
S11393404BFC0191F30195F30199FD01917E93D4B6
S1139350FC0191F30199F301952803CC8001FD01EF
S1139360917E93D4FC0191F30195F301992803CCE8
S1139370 8001FD01917E93D4FC0191F30199F301E5
S1139380952803CC7FFFD01917E93D4FC0191F3DA
S11393900195F301992803CC7FFFD01917E93D4BD
S11393A0FC0191F301952805CC7FFF2008F3019976
S11393B02803CC7FFFD0191201AFC0191F3019554
S11393C02805CC80012008F301992803CC8001FDF5
S11393D001912000CE0191156280EC002C12C6028E
S11393E00DA60188FF8900A701095A26F41462809A
S11393F0FC0191DD8FDCB0DD91BD803C18CE009383
S1139400CE009ECC0000ED0018EC00ED0218EC023A
S1139410ED04CE00988600A700CC43A8ED01BD81E1
S113942 03418CE009BCE01EF18EC01ED001AB30105
S1139430F12306FC01F1FD01EF13820106126280A3
S1139440152004 1362800FC6020DA60188FF89004F
S1139450A701095A26F4CE019D156280EC002C1256
S1139460C6040DA60388FF8900A703095A26F4142D
S1139470628018CE019DCE009ECC0000ED0018EC59
S113948000ED0218EC02ED04CE00988600A700124D
S1139 4 9065011A12680116FC7E261A8305DC22086F
S113 94A01A83057825022003CC05AA2014FC7E200B
S11394B01A835EEC22081A83571C25022003CC5B16
S11394C004ED01BD813418CE009BCE019D18A60089
S11394D02707CC7FFFED00200E18EC012C07CC7F72
S11394E0FFED002002ED001362800FC6020DA601FD
S11394F088FF8900A701095A26F4CE01A1156280CC
S1139500EC002C12C6040DA60388FF8900A70309EA
S11395105A26F414628018CE01A1CE009ECC00001D
S1139520ED0018EC00ED0218EC02ED04CE00988674
S113953000A7001265021A12680216FC7E261A831E
S113954005DC22081A83057825022003CC05AA200D
S1139550 14FC7E221A835EEC22081A83571C25020F
S113956 02003CC5B04ED01BD813418CE009BCE01F9
S1139570A118A6002707CC7FFFED00200E18EC01F0
S1139580 2C07CC7FFFED002002ED001362800FC694
S1139590020DA60188FF8900A701095A26F4CE010D
S11395A0A5156280EC002C12C6040DA60388FF8961
S11395B000A703095A26F414628018CE01A5CE0030
S11395C09ECC0000ED0018EC00ED0218EC02ED0456
S11395D0CE00988600A7001265041A12680416FCCF
S11395E07E261A8305DC22081A83057825022003C7
S11395F0CC05AA2014FC7E241A835EEC22081A836C
S1139600571C25022003CC5B04ED01BD813418CE28
S1139610009BCE01A518A6002707CC7FFFED0020F4
S1139620 0E18EC012C07CC7FFFED002002ED001397
S1139630 62800FC6020DA60188FF8900A701095A9E
```

```
S113964026F4158307FC019D2C03148301FC01A15E
S11396502C031483C2FC01A52C0314830413830735
S1139660061283070520067E96E47E96FE12830387
S11396702312830611F1283052F1383033F138306CC
S11396803B1383054BFC019DF301A1F301A5FD01EF
S11396909D7E9718FC019DF301A5F301A12803CC3D
S11396A08001FD019D7E9718FC019DF301A1F3014A
S11396B0A52803CC8001FD019D7E9718FC019DF334
S11396C001A5F301A12803CC7FFFFD019D7E97181E
S11396D0FC019DF301A1F301A52803CC7FFFFD014B
S11396E09D7E9718FC019DF301A12805CC7FFF20E6
S11396F008F301A52803CC7FFFFD019D201AFC017E
S11397009DF301A12805CC80012008F301A52803BD
S1139710CC8001FD019D2000CE019D156280EC00EE
S11397202C12C6020DA60188FF8900A701095A263A
S1139730F4146280FC019DDD8FDCB0DD91BD803CC2
S113974018CE0093CE009ECC0000ED0018EC00ED86
S11397500218EC02ED04CE00988600A700CC43A8C2
S1139760ED01BD813418CE009BCE01E318EC01ED70
S1139770001AB301F12306FC01F1FD01E313820198
S11397800612628015200413628000FC6020DA60122
S113979088FF8900A701095A26F4FC01F127361530
S11397A06280FC01EF2C0714628040508200FE01AD
S11397B0F1038FCE028F028FFD01DD1A830064272F
S11397C0148C01482317FC01DDC30001FD01DD1ADF
S11397D08300642608CC0000FD01E32019FC01E3AA
S11397E02C0612628010200413628000AFC01DD4002
S11397F0508200FD01DDFC02011A8300322414961C
S11398002284FD972297BACC0000FD01DB1471403D
S11398107E987215714096BA2635DCB77900B9592D
S1139820497900B959497900B959497900B9C90048
S113983089001A83138823178FCC1313038FC4E072
S11398400C594959495989900C9001571802006CC21
S113985000000147180B701DCF701DB7F00B77F00E3
S1139860B87F00B9862197BA8602972396228A0286
S1139870972239AA158408FC01EF2A3B4353C300FD
S113988001F3038ACE038402FD038A8F4353C3008A
S113989001A8300002720F301E7FD01E7CCFFFF55
S11398A0F901E6B901E5FD01E5280C148402CC00B8
S11398B000FD01E5FD01E7CC0000DD8FBDD0A8FC73
S11398C001EF2A18B698738155270981AA265FFCEF
S11398D001EF2008FC01EF4353C30001DD8FF303C4
S11398E0882B0DCE038402FD03888FCE0000201A3E
S11398F04353C30001CE0384024353C30001FD0359
S1139900888F4353C30001CEFFFF1A830000271E34
S1139910F301EBFD01EB8FF901EAB901E9FD01E97E
S1139920280C148401CC0000FD01E9FD01EBB67E96
S113993035272D810F2229DC8F2B0ED3CEDDCEDCF3
S1139940CCC9008900DDCC200CD3CEDDCEDCCCC963
S1139950FF89FFDDCCB6038EB17E36240C7E9A855A
S1139960CC0000FD01ED7E9A857F00A696CC2A1FCF
S11399707300CF7300CE7300CD7300CCDCCEC30074
S113998001DDCEDCCCC9008900DDCC86FF97A6863C
S113999000D6CCDD9EDCCDDDA096CFC600DDA27F57
S11399A00098860FF67E363DDD99BD8134DC9B7DC3
S11399B0009D2A03C300017D00A627054353C3006D
S11399C001188FCE0390F6038F583A188FED00F6E6
```

```
S11399D07E355A5818CE0390183A18EC001A837F33
S11399E0FF2609CC0000FD01ED7E9A6DCC000097A6
S11399F095DD9618EC002B0CD396DD969695890090
S1139A009795200AD396DD96969589FF9795180920
S1139A101809188C039024DB7F00A696952A1A73E4
S1139A200097730096730095DC96C30001DD96964B
S1139A30958900979586FF97A6CC0000DD9EDC955E
S1139A40DDA09697C600DDA27F00987F0099B67EC0
S1139A5035979ABD8134DC9B7D009D2A03C30001A8
S1139A607D00A627054353C30001FD01ED7F038E4E
S1139A707C038FB6038FB17E3525037F038FCC0023
S1139A8000DDCCDDCEFC01E32A18B698738155279E
S1139A900981AA265DFC01E32008FC01E34353C3CA
S1139AA00001F3038C2B0DCE038402FD038C8FCEB7
S1139AB00000201A4353C30001CE0384024353C35E
S1139AC00001FD038C8F4353C30001CEFFFF1A83B3
S1139AD00000271EF301E1FD01E18FF901E0B90166
S1139AE0DFFD01DF280C148404CC0000FD01DFFD40
S1139AF001E115BE0239CE0390CC7FFFED000808CA
S1139B008C03AE25F7CC0000B7038FFD0390B70399
S1139B108EFD01EDDDCCDDCE39DCB0FD02901267A7
S1139B20011CFC7E0E1A830140220B1A83010025BE
S1139B3005FD010D2006CC0120FD010D201AFC7E3F
S1139B400C1A8312B0220B1A8311A82505FD010DEE
S1139B502006CC1228FD010DCC013DFD0111CC02E3
S1139B6082FD0113FE0111BD80D2EC00BDAA85DC8B
S1139B70B0FD02901267021CFC7E0E1A8301402283
S1139B800B1A83010025055FD010D2006CC0120FDE3
S1139B90010D201AFC7E0C1A8312B0220B1A8311B9
S1139BA0A82505FD010D2006CC1228FD010DCC01D0
S1139BB041FD0111CC0280FD0113FE0111BD80D2D3
S1139BC0EC00BDAA85DCB0FD02901267041CFC7E8B
S1139BD00E1A830140220B1A83010025055FD010D95
S1139BE02006CC0120FD010D201AFC7E0C1A8312E4
S1139BF0B220B1A8311A82505FD010D2006CC12F5
S1139C0028FD010DCC0145FD0111CC027EFD01139F
S1139C10FE0111BD80D2EC00BDAA85DCB2FD02902C
S1139C20FC7E101A831370220B1A8312702505FD13
S1139C30010D2006CC12F0FD010DCC0149FD0111EE
S1139C40CC027CFD0113FE0111BD80D2EC00BDAA43
S1139C5085DCB0FD02901267081CFC7E0E1A83019D
S1139C6040220B1A83010025055FD010D2006CC01BD
S1139C7020FD010D201AFC7E0C1A8312B0220B1A4F
S1139C808311A82505FD010D2006CC1228FD010D28
S1139C90CC014DFD0111CC027AFD0113FE0111BD71
S1139CA080D2EC00BDAA85136C0270156C03146A93
S1139CB040136C80311281040C147A0486A19792AB
S1139CC0BDB66D201BFC027CFD0296FC027EFD02EB
S1139CD098FC0280FD029AFC0282FD029C146B80B7
S1139CE0156B10156CB0136C40311281040C147A8E
S1139CF00186A09792BDB66D201BFC027CFD029EDE
S1139D00FC027EFD02A0FC0280FD02A2FC0282FD98
S1139D1002A4146B08156B01156C4C136C206F13A3
S1139D206C8005156C8020661281040C147A0486FC
S1139D30A19792BDB66D201BFC027CFD0296FC022D
S1139D407EFD0298FC0280FD029AFC0282FD029CC8
S1139D50146B80156B10156CB0136C0831128104F0
```

```
S1139D600C147A0186A09792BDB66D201BFC027C70
S1139D70FD029EFC027EFD02A0FC0280FD02A2FC0C
S1139D800282FD02A4146B08156B01156C4C136C54
S1139D90083A136C4005156C4020311281040C14F0
S1139DA07A0186A09792BDB66D201BFC027CFD0251
S1139DB09EFC027EFD02A0FC0280FD02A2FC028247
S1139DC0FD02A4146B08156B01156C4C39136D025C
S1139DD0037E9E27136D04037E9EA7136D08037EE6
S1139DE09FAA136D10037EA09C136D20037EA18E89
S1139DF0136D40037EA280136D80037EA385136ED2
S1139E001037EA47C136E02037EA55B136E040320
S1139E107EA640136E08037EA725136E10037EA84A
S1139E2077156D017EA9C6FC01292703146D04FC76
S1139E30012B1A83E0002503146D04FC012D270374
S1139E40146D08FC012F1A83E0002503146D08FC2F
S1139E5001312703146D10FC01331A83E00025033C
S1139E60146D10FC01352703146D40FC01371A836F
S1139E70600025 03146D40FC01392703146D20FC98
S1139E80013B1A83E0002503146D207A028FB60289
S1139E908F810027037E9EA4136D7C05156D012020
S1139EA003156D037EA9C6FC012B83F000FD012B75
S1139EB0240BFC0129270683000 1FD0129DCB0FDE8
S1139EC00290CC86C4FD010DCC020DFD0113CE0120
S1139ED029BD80D2EC00FD0129FC0129BDAA85FC25
S1139EE0020D1A93B024037E9FA4FC0129BDAA8508
S1139EF0FC020D1A93B0275E250BFC010DC303E889
S1139F00FD010D20E5FC0129BDAA85FC020D1A9373
S1139F10B02743220BFC010D830064FD010D20E5F5
S1139F20FC0129BDAA85FC020D1A93B02728250B34
S1139F30FC010DC3000AFD010D20E5FC0129BDAAA9
S1139F4085FC020D1A93B0270D220BFC010D830032
S1139F5001FD010D20E5F6028F5AF7028F58CE7FDE
S1139F603B3AFC010DBDD0A8BDCFBFF6028F27063A
S1139F7015BE027E9FA7CC7F3BDD8FBDAA25BDD039
S1139F80A8CE7E00BDCFBFFC7E00CE003D028F0573
S1139F900505CE7E0CBDCFBF148440BDBB0C15BEE1
S1139FA002156D05156D017EA9C6FC012F83F00015
S1139FB0FD012F240BFC012D2706830001FD012D3B
S1139FC0DCB0FD0290CC86C4FD010DCC020BFD017A
S1139FD013CE012DBD80D2EC00FD012DFC012DBD61
S1139FE0AA85FC020B1A93B024037EA096FC012DD3
S1139FF0BDAA85FC020B1A93B0275E250BFC010D4C
S113A000C303E8FD010D20E5FC012DBDAA85FC027A
S113A0100B1A93B02743220BFC010D830064FD014E
S113A0200D20E5FC012DBDAA85FC020B1A93B02777
S113A03028250BFC010DC3000AFD010D20E5FC01E0
S113A0402DBDAA85FC020B1A93B0270D220BFC012F
S113A0500D830001FD010D20E5F6028F5AF7028FF2
S113A06058CE7F3B3AFC010DBDD0A8BDCFBFF60250
S113A0708F270615BE027EA099CC7F3BDD8FBDAA3B
S113A08025CE7E02BDD0A8BDCFBF148440BDBB0C7D
S113A09015BE02156D09156D017EA9C6FC01338339
S113A0A0F000FD0133240BFC01312706830001FD80
S113A0B00131DCB0FD0290CC86C4FD010DCC020957
S113A0C0FD0113CE0131BD80D2EC00FD0131FC0154
S113A0D031BDAA85FC02091A93B024037EA188FC31
S113A0E00131BDAA85FC02091A93B0275E250BFC39
```

```
S113A0F0010DC303E8FD010D20E5FC0131BDAA8576
S113A100FC02091A93B02743220BFC010D8300645F
S113A110FD010D20E5FC0131BDAA85FC02091A935D
S113A120B02728250BFC010DC3000AFD010D20E515
S113A130FC0131BDAA85FC02091A93B0270D220B3C
S113A140FC010D830001FD010D20E5F6028F5AF795
S113A150028F58CE7F3B3AFC010DBDD0A8BDCFBFC6
S113A160F6028F270615BE027EA18BCC7F3BDD8FC6
S113A170BDAA25CE7E04BDD0A8BDCFBF148440BDEA
S113A180BB0C15BE02156D11156D017EA9C6FC012F
S113A1903B83F000FD013B240BFC013927068300BF
S113A1A001FD0139DCB0FD0290CC86C4FD010DCC6B
S113A1B00205FD0113CE0139BD80D2EC00FD013949
S113A1C0FC0139BDAA85FC02051A93B024037EA2C2
S113A1D07AFC0139BDAA85FC02051A93B0275E25D5
S113A1E00BFC010DC303E8FD010D20E5FC0139BDA5
S113A1F0AA85FC02051A93B02743220BFC010D83A8
S113A2000064FD010D20E5FC0139BDAA85FC0205B1
S113A2101A93B02728250BFC010DC3000AFD010D7C
S113A22020E5FC0139BDAA85FC02051A93B0270D6F
S113A230220BFC010D830001FD010D20E5F6028FC8
S113A2405AF7028F58CE7F3B3AFC010DBDD0A8BD12
S113A250CFBFF6028F270615BE027EA27DCC7F3BC0
S113A260DD8FBDAA25CE7E06BDD0A8BDCFBF148488
S113A27040BDBB0C15BE02156D21156D017EA9C62E
S113A280FC0137837FFFFD0137240BFC01352706D2
S113A290830001FD0135DCB2FD0290CC8CA0FD01F0
S113A2A00DCC0207FD0113CE0135BD80D2EC00FDBB
S113A2B00135FC0135BDAA85FC0207051A93B224B9
S113A2C0037EA37FFC0135BDAA85FC0207051A9312
S113A2D0B22761250BFC010DC303E8FD010D20E449
S113A2E0FC0135BDAA85FC0207051A93B227452255
S113A2F00BFC010D830064FD010D20E4FC0135BD60
S113A300AA85FC0207051A93B22729250BFC010D27
S113A310C3000AFD010D20E4FC0135BDAA85FC0241
S113A32007051A93B2270D220BFC010D830001FDD2
S113A330010D20E4F6028F5AF7028F58CE7F3B3A84
S113A340FC010DBDD0A8BDCFBFF6028F270615BEF8
S113A350027EA382CC7F3BDD8FBDAA25CE7E08BDC5
S113A360D0A8BDCFBFCE003D028F050505CE7E101F
S113A370BDCFBF148440BDBB0C15BE02156D411585
S113A3806D017EA9C6DCB0FD0290373605DDB01341
S113A3906501037EA472CC07D0FD010DCC020DFD36
S113A3A00113CE0129BD80D2EC00FD0129BDAA858F
S113A3B0FC020D1A93B024037EA472FC0129BDAAE9
S113A3C085FC020D1A93B0275E250BFC010DC30317
S113A3D0E8FD010D20E5FC0129BDAA85FC020D1A4A
S113A3E093B02743220BFC010D830064FD010D2073
S113A3F0E5FC0129BDAA85FC020D1A93B027282586
S113A40000BFC010DC3000AFD010D20E5FC0129BD73
S113A410AA85FC020D1A93B0270D220BFC010D83B3
S113A4200001FD010D20E5F6028F5AF7028F58CE88
S113A4307F3B3AFC010DBDD0A8BDCFBFF6028F27EC
S113A4400615BE027EA475CC7F3BDD8FBDAA25CE4A
S113A4507E0ABDD0A8BDCFBFCE003D028F05050545
S113A460CE7E0EBDCFBF148440BDBB0C15BE0215FD
S113A4706D81156D013233DDB07EA9C6CC0258FD65
```

```
S113A480029 0CC3B92FD010DCC01F9FD0113CE01EC
S113A49085BD80D2EC00FD0185FC0185BDAA85FC4B
S113A4A001F91A83020724037EA555FC0185BDAA80
S113A4B085FC01F91A83020727 61250BFC010DC3F2
S113A4C003E8FD010D20E4FC0185BDAA85FC01F92A
S113A4D01A83020727 45220BFC010D830064FD014A
S113A4E00D20E4FC0185BDAA85FC01F91A8302074D
S113A4F02729250BFC010DC3000AFD010D20E4FCF6
S113A5000185BDAA85FC01F91A830207270D220BD8
S113A510FC010D830001FD010D20E4F6028F5AF7C2
S113A520028F58CE7F3B3AFC010DBDD0A8BDCFBFF2
S113A530F6028F270615BE027EA558CC7F3BDD8F21
S113A540BDAA25CE7E12BDD0A8BDCFBF15BE0215B3
S113A5506D01156E01156D017EA9C6CC0258FD0270
S113A56090CC3B92FD010DCC01F7FD0113CE018986
S113A570BD80D2EC00FD0189FC0189BDAA85FC01E6
S113A580F71A83020724037EA63AFC0189BDAA8533
S113A590FC01F71A83020727 61250BFC010DC30395
S113A5A0E8FD010D20E4FC0189BDAA85FC01F71A30
S113A5B08302072745220BFC010D830064FD010D76
S113A5C020E4FC0189BDAA85FC01F71A8302072750
S113A5D029250BFC010DC3000AFD010D20E4FC013B
S113A5E089BDAA85FC01F71A830207270D220BFCFB
S113A5F0010D830001FD010D20E4F6028F5AF702DC
S113A6008F58CE7F3B3AFC010DBDD0A8BDCFBFF61D
S113A610028F270615BE027EA63DCC7F3BDD8FBD93
S113A620AA25CE7E14BDD0A8BDCFBF148440BDBB27
S113A6300C15BE02156D01156E02156D017EA9C6BD
S113A640CC0258FD0290CC3B92FD010DCC01F5FDEE
S113A6500113CE018DBD80D2EC00FD018DFC018D76
S113A660BDAA85FC01F51A83020724037EA71FFCFB
S113A6700018DBDAA85FC01F51A83020727 61250B0C
S113A680FC010DC303E8FD010D20E4FC018DBDAA0E
S113A69085FC01F51A8302072745220BFC010D8373
S113A6A00064FD010D20E4FC018DBDAA85FC01F5CB
S113A6B01A83020727 29250BFC010DC3000AFD019B
S113A6C00D20E4FC018DBDAA85FC01F51A83020767
S113A6D0270D220BFC010D830001FD010D20E4F682
S113A6E0028F5AF7028F58CE7F3B3AFC010DBDD042
S113A6F0A8BDCFBFF6028F270615BE027EA722CCC7
S113A7007F3BDD8FBDAA25CE7E16BDD0A8BDCFBFB1
S113A710148440BDBB0C15BE02156D01156E0415E5
S113A7206D017EA9C6CC0191FD0113l8FE0113CC65
S113A730571CFD010BBDA9C71A8305DC24037EA89F
S113A7407118FE0113BDA9C71A8305DC275B250B0D
S113A750FC010DC303E8FD010D20E618FE0113BD45
S113A760A9C71A8305DC2741220BFC010D83006471
S113A770FD010D20E618FE0113BDA9C71A8305DCEF
S113A7802727250BFC010DC3000AFD010D20E61847
S113A790FE0113BDA9C71A8305DC270D220BFC019A
S113A7A0D830001FD010D20E6FC010DFE01138C5B
S113A7B00191270D8C019527298C019927417EA8A9
S113A7C071F6028F5AF7028F58CE7F3B3AFC010D87
S113A7D0BDD0A8BDCFBF15BE02CC0195FD01137E2F
S113A7E0A72BF6028F58CE7F453AFC010DBDD0A8A9
S113A7F0BDCFBF15BE02CC0199FD01137EA72BF678
S113A800028F58CE7F4F3AFC010DBDD0A8BDCFBFFB
```

```
S113A810F6028F270615BE027EA874CC7F3BDD8F1F
S113A820BDAA25CE7E18BDD0A8BDCFBFFC7E18CE54
S113A8300010028FCE7E1EBDCFBF15BE02CC7F4559
S113A840DD8FBDAA25CE7E1ABDD0A8BDCFBF15BE53
S113A85002CC7F4FDD8FBDAA25CE7E1CBDD0A8BD06
S113A860CFBF148440BDBB0C15BE02156D01156E1F
S113A87008156D017EA9C6CC019DFD011318FE01CA
S113A88013CC571CFD010DBDA9C71A8305DC240395
S113A8907EA9C318FE0113BDA9C71A8305DC275B73
S113A8A0250BFC010DC303E8FD010D20E618FE0194
S113A8B013BDA9C71A8305DC2741220BFC010D83B4
S113A8C00064FD010D20E618FE0113BDA9C71A831B
S113A8D005DC2727250BFC010DC3000AFD010D2013
S113A8E0E618FE0113BDA9C71A8305DC270D220B48
S113A8F0FC010D830001FD010D20E6FC010DFE01AC
S113A900138C019D270D8C01A127298C01A52741BA
S113A9107EA9C3F6028F5AF7028F58CE7F3B3AFCCA
S113A920010DBDD0A8BDCFBF15BE02CC01A1FD0154
S113A930137EA87DF6028F58CE7F453AFC010DBDEB
S113A940D0A8BDCFBF15BE02CC01A5FD01137EA8C2
S113A9507DF6028F58CE7F4F3AFC010DBDD0A8BDC5
S113A960CFBFF6028F270615BE027EA9C6CC7F3B59
S113A970DD8FBDAA25CE7E20BDD0A8BDCFBFFC7E75
S113A98020CE0010028FCE7E26BDCFBF15BE02CCD6
S113A9907F45DD8FBDAA25CE7E22BDD0A8BDCFBF09
S113A9A015BE02CC7F4FDD8FBDAA25CE7E24BDD03F
S113A9B0A8BDCFBF148440BDBB0C15BE02156D01EC
S113A9C0156E10156D0139CE009ECC0000ED0018F7
S113A9D0EC00ED0218EC02ED04CE00988600A7000E
S113A9E0FC010DED01BD813418CE009B18EC01DD96
S113A9F08FDCB0DD91BD803C18CE0093CE009ECCA0
S113AA000000ED0018EC00ED0218EC02ED04CE009D
S113AA10988600A700CC43A8ED01BD813418CE0070
S113AA209B18EC0139BDD0A818CE0091CC000018B9
S113AA30ED0018ED02C605F7028F5AF7028F58DEB3
S113AA408F3AEC0018E30218ED0224085F0D18E9B0
S113AA500118E701F6028F26E115BE02CE009ECC56
S113AA600000ED0018EC00ED0218EC02ED04CE003D
S113AA70988600A700CC0005ED01BD813418CE00F6
S113AA809B18EC0139DD8FFC0290DD91BD803C18F0
S113AA90CE0093CE009ECC0000ED0018EC00ED0239
S113AAA018EC02ED04CE00988600A700FC010DED21
S113AAB001BD813418CE009BFE011318EC01ED009A
S113AAC0393CDD8FCC0800DD91BD803C18CE00936D
S113AAD0CE009ECC0000ED0018EC00ED0218EC0254
S113AAE0ED04CE00988600A700FC026CED01BD8148
S113AAF03418CE009B18EC0138398655B17E5427A2
S113AB00097F01C5157C307EAB8118CE020D18EC8F
S113AB10001AB37E372322B302032A054353C3002A
S113AB20011AB302032433FE020303DF914FF67EBE
S113AB3056CE0064039C91252118091809188C022B
S113AB400924CB137C30117F01C5157C301281049C
S113AB500786969792BDB66D2027B601C5262212A8
S113AB6069101E8655B17E542617B67E55C60A3D19
S113AB70F701C5147C301281040786A69792BDB6EE
S113AB806D398655B17E5127097F01C6157B047E38
S113AB90ABFE18CE01F918EC001AB37E392322B3A8
```

```
S113ABA001F32A054353C300011AB301F3242FFE12
S113ABB001F303DF914FF67E53CE0064039C91258D
S113ABC01D18091809188C01F524CB137B040D7F7B
S113ABD001C6157B0486989792BDB66D2020B601F8
S113ABE0C6261B120A021712691013B67E52C60A31
S113ABF03DF701C6147B0486A89792BDB66D8655B1
S113AC00B17E492709157B107F01C87EAC58FC0131
S113AC10F91AB37E4B2221FC01F71AB37E4B22189A
S113AC20FC01F52213137B100D157B107F01C886E0
S113AC309A9792BDB66D2020B601C8261B120A024F
S113AC401712691013B67E4AC60A3DF701C8147B71
S113AC501086AA9792BDB66D8655B17E4D2709150B
S113AC607B087F01C77EACB2FC01F91AB37E4F2585
S113AC7021FC01F71AB37E4F2518FC01F5251313A7
S113AC807B080D157B087F01C786999792BDB66D29
S113AC902020B601C7261B120A021712691013B628
S113ACA07E4EC60A3DF701C7147B0886A99792BD5C
S113ACB0B66D8655B17E4D2709157B207F01C97E77
S113ACC0AD061271400D1271803CFC01DB1AB37E9B
S113ACD0472513137B200D157B207F01C9869B9785
S113ACE092BDB66D2020B601C9261B120A021712A6
S113ACF0691013B67E46C60A3DF701C9147B208647
S113AD00AB9792BDB66D8655B17E412709157B4040
S113AD107F01CA7EAD5A1271400D1271803CFC0154
S113AD20DB1AB37E432213137B400D157B407F0156
S113AD30CA869C9792BDB66D2020B601CA261B1206
S113AD400A021712691013B67E42C60A3DF701CAF9
S113AD50147B4086AC9792BDB66D8655B17E3D2777
S113AD60097F01CB157B807EADACFC01EF2C0A4042
S113AD705082001AB37E3F2213137B800D157B8013
S113AD807F01CB869D9792BDB66D2020B601CB2660
S113AD901B120A021712691013B67E3EC60A3DF74B
S113ADA001CB147B8086AD9792BDB66D39B67E9586
S113ADB08100270481552615FC7E971AB3020D25C0
S113ADC0291AB3020B25231AB30209251D7F01CCCE
S113ADD0127502037EAE1E15750286E09792BDB60B
S113ADE06D15770286E09792203112750230B60114
S113ADF0CC2608B67E96B701CC20237A01CCB601C6
S113AE00CC261B14750286B09792BDB66DB67E959E
S113AE108155260A14770286B09792BDB4D1B67EC6
S113AE20918100270481552609FC02071AB37E93F9
S113AE30221D7F01CD127504037EAE831575048631
S113AE40E19792BDB66D15770486E1979220311291
S113AE50750430B601CD2608B67E92B701CD202305
S113AE607A01CDB601CD261B14750486B19792BD27
S113AE70B66DB67E918155260A14770486B19792F1
S113AE80BDB4D1128110037EAEEFB67E8D81002752
S113AE900481552609FC02051AB37E8F221D7F0109
S113AEA0CE127508037EAEEF15750886E29792BD43
S113AEB0B66D15770886E29792203112750830B680
S113AEC001CE2608B67E8EB701CE20237A01CEB6F7
S113AED001CE261B14750886B29792BDB66DB67E58
S113AEE08D8155260A14770886B29792BDB4D1B6DF
S113AEF07E8A8100270481552639180E020D18EC6C
S113AF00001AB37E372322B302032A054353C30036
S113AF10011AB302032439FE020303DF914FF67EC4
```

```
S113AF208CCE0064039C91252718091809188C02FB
S113AF300924CB7F01CF127510037EAF84157510E1
S113AF4086E39792BDB66D15771086E3979220310C
S113AF5012751030B601CF2608B67E8BB701CF200C
S113AF60237A01CFB601CF261B14751086B39792AE
S113AF70BDB66DB67E8A8155260A14771086B397BE
S113AF8092BDB4D139B67E8681002704815526l539
S113AF90FC7E881AB301F922291AB301F722231A75
S113AFA0B301F5221D7F01D0127520037EAFF61583
S113AFB0752086E59792BDB66D15772086E5979244
S113AFC02031127520308601D02608B67E87B7012D
S113AFD0D020237A01D0B601D0261B14752086B563
S113AFE09792BDB66DB67E8681552l60A1477208663
S113AFF0B59792BDB4D1B67E8381002704815526CE
S113B0003918CE01F918EC001AB37E392322B301A2
S113B010F32A054353C300011AB301F32440FE018C
S113B020F303DF914FF67E85CE0064039C91252EB9
S113B03018091809188C01F524CB7F01D112754029
S113B040037EB09215754086E69792BDB66DB67EC6
S113B0508381552l63D15774086E69792203112l75F7
S113B0604030B601D12608B67E84B701D120237AB8
S113B07001D1B601D1261B14754086B69792BDB690
S113B0806DB67E838l155260A14774086B69792BDA5
S113B090B4D1B67E7F8100270481552615FC7E81BC
S113B0A01AB301F925291AB301F725231AB301F5B7
S113B0B0251D7F01D2127580037EB103157580862C
S113B0C0E79792BDB66D15778086E7979220311287
S113B0D0758030B601D22608B67E80B701D220230F
S113B0E07A01D2B601D2261B14758086B79792BD19
S113B0F0B66DB67E7F8155260A14778086B79792FF
S113B100BDB4D1B67E7B8100270481552l60BFC019A
S113B110EF2D061AB37E7D221D7F01D31274010325
S113B1207EB16A15740186E89792BDB66D157601F5
S113B13086E8979220311274013081601D32608B6FE
S113B1407E7CB701D320237A01D3B601D3261B1406
S113B150740186B89792BDB66DB67E7B8155260A7A
S113B16014760186B89792BDB4D1B67E7781002754
S113B17004815526l0FFC01EF2C0A405082001AB3BB
S113B1807E79221D7F01D4127402037EB1D5157419
S113B1900286E99792BDB66D15760286E9979220EC
S113B1A03112740230B601D42608B67E78B701D4C1
S113B1B020237A01D4B601D4261B14740286B997CD
S113B1C092BDB66DB67E778155260A14760286B98D
S113B1D09792BDB4D1B67E73810027048155261D94
S113B1E0FC7E752D0DFC01ED2D131AB37E75222AFC
S113B1F0200BFC01ED2C061AB37E75251D7F01D5AD
S113B200127404037EB24E15740486EA9792BDB696
S113B2106D15760486EA979220311274043081601D3
S113B2200D52608B67E74B701D520237A01D5B60198
S113B2300D5261B14740486BA9792BDB66DB67E7378
S113B24081l55260A14760486BA9792BDB4D1B67E87
S113B2506F8100270481552l61DFC7E712D0DFC0194
S113B260E32D131AB37E71222A200BFC01E32C0672
S113B2701AB37E71251D7F01D6127408037EB2C7EE
S113B2801l5740886EB9792BDB66D15760886EB9714
S113B290922031l12740830B601D62608B67E70B7F3
S113B2A001D620237A01D6B601D6261B147408864B
```

```
S113B2B0BB9792BDB66DB67E6F8155260A1476088B
S113B2C086BB9792BDB4D1B67E6B810027048155AD
S113B2D02609FC01F11AB37E6D221D7F01D7127479
S113B2E010037EB32C15741086EC9792BDB66D15C1
S113B2F0761086EC9792203112741030B601D7265E
S113B30008B67E6CB701D720237A01D7B601D726B9
S113B3101B14741086BC9792BDB66DB67E6B8155B6
S113B320260A14761086BC9792BDB4D1B67E678186
S113B3300027048155261312714 00F1371800220D7
S113B3405AFC01DB1AB37E69221D7F01D8127420D6
S113B350037EB39B15742086ED9792BDB66D15766A
S113B3602086ED9792203112742030B601D8260839
S113B370B67E68B701D820237A01D8B601D8261B37
S113B38014742086BD9792BDB66DB67E678155262E
S113B3900A14762086BD9792BDB4D1B67E6381002F
S113B3A027048155261312714 00F13718002205A0D
S113B3B0FC01DB1AB37E65251D7F01D9127440039D
S113B3C07EB40A15744086EE9792BDB66D1576402C
S113B3D086EE9792203112744030B601D92608B611
S113B3E07E64B701D920237A01D9B601D9261B146A
S113B3F0744086BE9792BDB66DB67E638155260AAB
S113B40014764086BE9792BDB4D1B67E598100278A
S113B41007815527037EB480FC7E5F2E0DFC01DD81
S113B4202E381AB37E5F2D32200FFC01DD2E022050
S113B430081AB37E5F2D232000FC7E612E0DFC01D3
S113B440DD2E3D1AB37E612E242035FC01DD2E0253
S113B450201B1AB37E612E152026146A10137480E3
S113B4603F126A20037EB4D0156A20204B146A2050
S113B4701374802C126A10037EB4D0156A1020381D
S113B4807F01DA156A30127480037EB4D01574809B
S113B49086EF9792BDB66D15768086EF9792202D34
S113B4A0B601DA2608B67E5AB701DA20237A01DA21
S113B4B0B601DA261B14748086BF9792BDB66DB6AA
S113B4C07E598155260A14768086BF9792BDB4D1E1
S113B4D03912820847DC7627211275013F140108CE
S113B4E015000814750196928B109792BDB66D964F
S113B4F09280109792BDB93020221375011E140159
S113B500081400081501081575019692801 0979289
S113B510BDB66D96928B109792BDB93039A0080BC9
S113B520900703A1080B910703A6010B960703A834
S113B530030B980703A9030B990703AA030B9A07A4
S113B54003AB05059B0703AC05059C0703AD040588
S113B5509D0703B0010BB10205B20C05B3010BB595
S113B560030BB6030BB7030BB80E05B90405BA18E1
S113B57005BB2205BC2C05BD0505BE0505BF060699
S113B580C00703C10703C20703C30703C50703C6F4
S113B5900 0703C70703C80703C90703CA0703CB0781
S113B5A003CC0703CD0703CE0703CF0703D007035C
S113B5B0D10703D20703D30703D50703D60703D75D
S113B5C00703D80703D90703DA0703DB0703DC07FC
S113B5D003DD0703DE0703DF0703E00703E10703D7
S113B5E0E20703E30703E50703E60703E70703E8C6
S113B5F00703E90703EA0703EB0703EC0703ED0777
S113B60003EE0703EF0703F00703F10703F2070351
S113B610F30703F40703FF070313A7100A86F4973D
S113B62092BDB66D15A71013A7041112A7200D869D
S113B630F39792BDB66D15A70414A72013A708109D
```

```
S113B64086F29792BDB66D15A70815A70415A72015
S113B65013A7010A86909792BDB66D15A70113A78B
S113B660020A86919792BDB66D15A702399692CEBD
S113B670B51DA100270A0808088CB61825F4200A6D
S113B680A6019793A602979420037EB88AFC02929F
S113B6901AB302942212252096722706860097 91E7
S113B6A0202086639791201AFC0292B30294D790CB
S113B6B086639090979120 0AFC0294B30292D791EA
S113B6C020009691909425037EB728FE0294A6004C
S113B6D0CEB51DA100270A0808088CB61825F42049
S113B6E004A60220037EB88AFE0294088C02F92381
S113B6F003CE02964A26F48FFD02947A00727EB637
S113B7008D08B77001B77E02B78E03B7AC04B7BB1F
S113B71005B80606B81507B85B0CB79D0EB7CA186E
S113B720B7D922B7E82CB7F7FE02929692A7008CFD
S113B73002F92703082003CE0296FF02929693CEC5
S113B740B701A100270A0808088CB72825F42004AB
S113B750EE016E007EB88A18A600A70018088C02B5
S113B760F92703082003CE0296FF02925A26E839ED
S113B77018CE027CFE0292C608BDB7577EB85E188A
S113B780CE0207FE0292C608BDB7577EB85E18CE39
S113B7900207FE0292C602BDB7577EB85E18CE02FB
S113B7A005FE0292C602BDB7577EB85E18CE01F3FD
S113B7B0FE0292C608BDB7577EB85E18CE01EFFEF2
S113B7C00292C602BDB7577EB85E18CE01EFFE02E4
S113B7D092C602BDB7577EB85E18CE01EDFE029246
S113B7E0C602BDB7577EB85E18CE01E3FE0292C60C
S113B7F002BDB7577EB85E18CE01F1FE0292C602B2
S113B800BDB7577EB85E18CE01DBFE0292C602BDFC
S113B810B7577EB85EFE0292FC01DD2C034F200276
S113B8208601A7008C02F92703082003CE0296FFA5
S113B8300292B601DDA7008C02F92703082003CE8B
S113B84 00296FF0292B601DEA7008C02F9270308D4
S113B8502003CE0296FF02927EB85E7EB85EFE02A0
S113B86092B601C0A7008C02F92703082003CE0278
S113B87096FF0292B601BFA7008C02F927030820A5
S113B88003CE0296FF02927C0072399672261186CC
S113B8908018A70018089672 18A70018087EB90B1C
S113B8A0FE0294A600CEB51DA100270A0808088C44
S113B8B0B61825F42006A602979420037EB90BFE41
S113B8C00294088C02F92303CE0296D6945AA60059
S113B8D018A700088C02F92303CE029618084F5AC1
S113B8E026ECFE0294A60018A700180896724A9740
S113B8F07218A70018089694FE0294088C02F92383
S113B90003CE02964A26F48FFD02943901B96D02E2
S113B910B97903B99104B99D05B9D906B9E507BA4E
S113B920030CB9850EB9A918B9B522B9C12CB9CD82
S113B9309692B7028C9692CEB51DA100270B0808EB
S113B940088CB61825F47EBA0BA601CEB90CA1005A
S113B950270B0808088CB93025F47EBA0BEE016E6B
S113B9600018A600A7001808085A26F53918CE02B0
S113B97007CE0284C6087EBA0518CE0207CE028A14
S113B980C6027EBA0518CE0205CE028AC6027EBA67
S113B9900518CE01F3CE0284C6087EBA0518CE017E
S113B9A0EFCE028AC6027EBA0518CE01EFCE028A15
S113B9B0C6027EBA0518CE01EDCE028AC6027EBA50
S113B9C00518CE01E3CE028AC6027EBA0518CE015E
```

```
S113B9D0F1CE028AC6027EBA0518CE01DBCE028AF7
S113B9E0C6027EBA05CE0289FC01DD2C0486012044
S113B9F0014FA70008B601DDA70008B601DEA700C5
S113BA000820052003BDB96114738039DCB01AB372
S113BA10020D250F1AB3020B25091AB302092503D7
S113BA207EBAB5FC020D1AB3020B220EFC020B1AED
S113BA30B302092210FC0209220B1AB302092205DF
S113BA40FC020922008FDCB0038F1A83CCCC226560
S113BA50CE0098ED018600A700CE009ECC0000ED3C
S113BA6000CC00FFED02CCFFF0ED04BD813418CE14
S113BA70009B18EC01DD8F4F5FDD939690163DDD42
S113BA8095DC8F3DDD87D394DD9424037C0093DC27
S113BA9087D394DD9424037C0093968F163DD3932F
S113BAA0DD930F0CDCC7D395DDC7DCC5D99499931E
S113BAB0DDC50E2007CC0000DDC5DDC739B67E2A02
S113BAC097A8FC7E2DDDB0FC7E2FDDB2FC7E33DD3D
S113BAD0813918CE0008CCFFFFCE7E2AE80004246A
S113BAE00488A0C801180926F518CE0008088C7E21
S113BAF03A23E91284400B1AB37E3B270E147304D5
S113BB002009CE7E3BBDCFBF1584403918CE000836
S113BB10CCFFFFCE7E00E80004240488A0C80118EE
S113BB200926F518CE0008088C7E2723E9128440E4
S113BB300B1AB37E28270E1473012009CE7E28BD6C
S113BB40CFBF1584403918CE0008CCFFFFCE7E3D10
S113BB50E80004240488A0C801180926F518CE00BA
S113BB6008088C7E5623E91284400B1AB37E5727AB
S113BB700E1473042009CE7E57BDCFBF15844039FF
S113BB8018CE0008CCFFFFCE7E59E80004240488B8
S113BB90A0C801180926F518CE0008088C7E982341
S113BBA0E91284400B1AB37E99270E1473042009FA
S113BBB0CE7E99BDCFBF15844039C616D73BA700AA
S113BBC0C617D73B39C602D73BA700C603D73B39B4
S113BBD086209723DC1AC30271DD1ABDCC5DBDCC6F
S113BBE0B31200800C1261040B1461041484102003D
S113BBF00315610496AD270A4A97AD810026031404
S113BC00610196AE27164A97AE8100260F15610191
S113BC101560F47F00AC1560037F02FAB601C24CD4
S113BC20B701C2810826067F01C27EBC307EBFB444
S113BC307C01C113BE010A15BE017F003B12BE1078
S113BC400412BE022F86FF97C3DEBF2713CC000069
S113BC50DDBF96C4E600C1FF27031473107EBD0B3D
S113BC60DEC1271ECC0000DDC1A60091C427131439
S113BC7073102006E7A00C3260615BE027F003B7E99
S113BC80BD2A13BE1055B6026E2728136A404C8194
S113BC90152234F67EABC403CEBD22583AEE00180A
S113BCA0CE026EF6026E7C026E3A183A18A600971F
S113BCB0C4203F7C026EB67EAB4C81032302860116
S113BCC097C4CE7EAB202B15BE10156A407F026E42
S113BCD0146B40156B0414A710204F1261044B130E
S113BCE0BE2047CE0261860BBDD069260515BE2055
S113BCF0203896C4A40091C42711DFBF14BE01C626
S113BD0016D73BA700C617D73B201F96C4A1002710
S113BD1019DFC114BE01C602D73BA700C603D73B37
S113BD2020087EAB7EAB7EC07ED51300040F96C97F
S113BD302604863C97C94A97C9260520137F00C963
S113BD40DCC51A8307082521DCC71A8300002519DE
S113BD50157AFA1579F8157C04147C04147808BD56
```

```
S113BD60E316CC0000DDC5DDC7B601C34CB701C383
S113BD70810A26067F01C37EBD7D7EBFB4865597AA
S113BD803A43973A7C01C4B601C481052306811E57
S113BD9023142029150220B603062721B602FA2708
S113BDA01C1402202017140220811E25037F01C4C5
S113BDB0B603062708B602FA27031502207D01C53B
S113BDC0271F7A01C5261A120A02161269101215C3
S113BDD07AF81579F8157C04147A02147802BDE314
S113BDE0167D01C6271F7A01C6261A120A021612E8
S113BDF0691012157AF21579F8157C04147A08146E
S113BE007804BDE3167D01C8271F7A01C8261A12DB
S113BE100A021612691012157AFA1579E8157C04CB
S113BE20147910147804BDE3167D01C7271F7A0125
S113BE30C7261A120A021612691012157AFA15790F
S113BE40F0157C04147908147804BDE3167D01CA46
S113BE50271F7A01CA261A120A0216126910101252D
S113BE607AFA1579B8157C04147940147820BDE366
S113BE70167D01C9271F7A01C9261A120A02161251
S113BE80691012157AFA1579D8157C0414792014DE
S113BE907820BDE3167D01CB271F7A01CB261A1229
S113BEA00A021612691012157AFA157978157C04AB
S113BEB0147980147880BDE316B601B627037A019D
S113BEC0B6B601B7270B7A01B72606140010150180
S113BED010B601B827037A01B8B601B927037A016D
S113BEE0B91300200A12690103150020156901131312
S113BEF06B4027126B0823126B801F156B4013696C
S113BF0002031479021369040314790413690803FE
S113BF10147B0213691003147C40B601C1816424AC
S113BF20037EBFB4B601B527044AB701B512BE01FA
S113BF3007126D0103BDBABD7F01C17C01C0F601CA
S113BF40C0C5032603148408C13C25687F01C07C56
S113BF50038E7C01BFF601BFC13C25587F01BF148D
S113BF6084207C01BEF601BEC1082603148410C1DE
S113BF700C2603148410C118253A1484107F01BEC2
S113BF80CEBFB5B601BB84032603CEBFC2F601BC47
S113BF903A7C01BDB601BDA10023198601B701BDDC
S113BFA07C01BCF601BCC10C230A8601B701BC7C30
S113BFB001BB20003B001F1C1F1E1F1E1F1F1E1F36
S113BFC01E1F001F1D1F1E1F1E1F1F1E1F1E1FDCE6
S113BFD00EC301E6DD168680972396F226037EC102
S113BFE01214610212022003156102126F6006121C
S113BFF06F400520067EC0637EC113DC0EFD010F79
S113C000862C97020101010101010101B671B0
S113C01000F67000862D97020101010101010162
S113C020010101B67100F67000FD0107862E97022A
S113C0300101010101010101B67100F67000FD69
S113C04001090101010101010101010101B671AF
S113C05000F67000FD010B146F40DC0ED3B4DD1646
S113C0607EC107B67100F67000862F97020101011A8
S113C070010101010101010101B67100F67000DDDC6E
S113C08096D09702DCDC850826064050820020005505
S113C090010101200008407DDDCB67100F67000DDCB
S113C0A0DA96D19702DCDA8508260640508200201010101010101010101010B671AF
S113C0B00501010120008407DDDAB67100F6700085
S113C0C0DDD496D29702010101010101010101B6FB
S113C0D07100F67000DDD6010101010101010101C9
S113C0E0010101B67100F67000DDD896F2811026C8
```

```
S113C0F00FDCD4FD0101DCD6FD0103DCD8FD010514
S113C100DC0EC30019DD1C96D397021261020315DD
S113C11002203BB67100F67000862F9702010101E0
S113C12001010101010101B67100F67000DDDCBD
S113C13096D09702DCDC850826064050820020054
S113C14001010120008407DDDCB67100F67000DD1A
S113C150DA96D19702DCDA85082606405082002060
S113C1600501010120008407DDDAB67100F67000D4
S113C170DDD496D29702010101010101010101B64A
S113C1807100F67000DDD6D6B65A26FD862C9702CD
S113C1900101010101010101B67100F67000DD28
S113C1A0D8862D9702010101010101010101B67137
S113C1B000F67000DDF7862E9702010101010101EE
S113C1C0010101B67100F67000DDFB0101010101FE
S113C1D0010101010101B67100F67000DDFF14D7
S113C1E06F21DCD4DDF5DCD6DDF9DCD8DDFD7EC1E4
S113C1F0008610972396F426037EC4DA96F24A97B3
S113C200F22707811126157EC6087A00F486119755
S113C210F2FC010FC3219BDD16156F60DCD4850889
S113C22026044050820084071A8307D0250315642E
S113C23001DD854F5FDD899686163DDD8BDC853D0E
S113C240DD87D38ADD8A24037C0089DC87D38ADDF9
S113C2508A24037C00899685163DD389DD890CDC0C
S113C260E0D38BDDE0DCDED98A9989DDDEDCD6859E
S113C27008260440508200840071A8307D02503153A
S113C2806402DD854F5FDD899686163DDD8BDC8596
S113C2903DDD87D38ADD8A24037C0089DC87D38A49
S113C2A0DD8A24037C00899685163DD389DD890CBB
S113C2B0DCE4D38BDDE4DCE2D98A9989DDE2DCD8E5
S113C2C08508260440508200840071A8307D025037A
S113C2D0156404DD854F5FDD899686163DDD8BDCB4
S113C2E0853DDD87D38ADD8A24037C0089DC87D3FE
S113C2F08ADD8A24037C00899685163DD389DD89ED
S113C3000CDCE8D38BDDE8DCE6D98A9989DDE6DC50
S113C310DADD854F5FDD899686163DDD8BDC853D54
S113C320DD87D38ADD8A24037C0089DC87D38ADD18
S113C3308A24037C00899685163DD389DD890CDC2B
S113C340ECD38BDDECDCEAD98A9989DDEADCDC1AF2
S113C3508307D02503156408DD854F5FDD89968644
S113C360163DDD8BDC853DDD87D38ADD8A24037CA5
S113C3700089DC87D38ADD8A24037C0089968516AC
S113C3803DD389DD890CDCF0D38BDDF0DCEED98A7A
S113C3909989DDEE96F28111270ADC0EC3000CDDCB
S113C3A01E7EC6080CFC0117D3E0FD0117FC011525
S113C3B0D9DF99DEFD01150CFC011BD3E4FD011B43
S113C3C0FC0119D9E399E2FD0119CFC011FD3E822
S113C3D0FD011FFC011DD9E799E6FD011D0CFC01BF
S113C3E023D3ECFD0123FC0121D9EB99EAFD0121C2
S113C3F00CFC0127D3F0FD0127FC0125D9EF99EEB0
S113C400FD0125136C1518126C0214126C01131221
S113C4106C200C126C100B126C0804126C04037E5A
S113C420C48DCE00DE18CE013DEC0018ED00EC0208
S113C43018ED02EC0418ED04EC0618ED06EC0818EF
S113C440ED08EC0A18ED0AEC0C18ED0CEC0E18EDE6
S113C4500EEC1018ED10EC1218ED12136C011514FB
S113C4606C02136B1007136B2003146C80136C04A1
S113C47003146C40136C100A146C20136C04031422
```

```
S113C4806C40136C0403146C0896629767CE00DE4C
S113C490CC0000ED00ED02ED04ED06ED08ED0AED33
S113C4A00CED0EED10ED1212640107863497D015D1
S113C4B0620112640207863597D115620212640480
S113C4C007863697D21562041264080786379703D315
S113C4D015620896F427037EC608136A02037EC613
S113C4E008CE011518CE0129EC0018ED00EC021855
S113C4F0ED02EC0418ED04EC0618ED06EC0818ED5A
S113C50008EC0A18ED0AEC0C18ED0CEC0E18ED0E04
S113C510EC1018ED10EC1218ED12CC0000ED00ED4B
S113C52002ED04ED06ED08ED0AED0CED0EED10ED57
S113C530129662976512640111126301051568 0170
S113C5402008146801156301200412660109863469
S113C55097D01562012010862497D01568011462C3
S113C5600114640114630112640211126302051 5BB
S113C5706802200814680215630220041266020986
S113C580863597D11562022010862597D11568 0249
S113C590146302146202146402126404111263 0428
S113C5A0051568042008146804156304200412 6641
S113C5B00409863697D21562042010862697D21570
S113C5C068041463041462041464041264081112E9
S113C5D063080515680820081468081563082004 12
S113C5E012660809863797D31562082010862797A4
S113C5F0D31568081463081462081464081464 08146A02E2
S113C600 0863A97F4861197F23B8608972396F32689
S113C610037ECB35126F01037ECBF51370403513C7
S113C62070803413700133137108321371103 11395
S113C6307101301371022F1371042E1370022D1324
S113C64070042C1370082B1370102A1370202920E7
S113C6502A7ECBF57EC67E7EC73E7EC7FE7EC8554B
S113C6607EC8AC7EC9037EC9577EC9AB7EC9FF7E36
S113C670CA327ECA657ECA987ECAC67ECAF4DCF710
S113C6801A8308302C091A8307D02F03CC0800859D
S113C690082605C3F80020028407DDF7DCFB1A83B3
S113C6A008302C091A8307D02F03CC0800850826EC
S113C6B005C3F80020028407DDFBDCFF1A830830 81
S113C6C02C091A8307D02F03CC0080085082605C33C
S113C6D0F80020028407DDFFFC01071A8308302CD0
S113C6E0091A8307D02F03CC080085082605C3F850
S113C6F00020028407FD0107FC01091A8308302C7D
S113C700091A8307D02F03CC080085082605C3F82F
S113C71 00020028407FD0109FC010B1A8308302C58
S113C720091A8307D02F03CC080085082605C3F80F
S113C73 00020028407FD010B1470407ECBF5DCF56C
S113C7401A8308302C091A8307D02F03CC080085DC
S113C750082605C3F80020028407DDF5DCF91A83F6
S113C76008302C091A8307D02F03CC080085082 62B
S113C77005C3F80020028407DDF9DCFD1A830830C4
S113C7802C091A8307D02F03CC080085082605C37B
S113C790F80020028407DDFDFC01011A8308302C17
S113C7A0091A8307D02F03CC080085082605C3F88F
S113C7B00020028407FD0101FC01031A8308302CC8
S113C7C0091A8307D02F03CC080085082605C3F86F
S113C7D00020028407FD0103FC01051A8308302CA4
S113C7E0091A8307D02F03CC080085082605C3F84F
S113C7F00020028407FD01051470807ECBF5FC0146
S113C80007B301092C090DC8FFC90088FF8900DDA1
```

```
S113C810854F5FDD899686163DDD8BDC853DDD87A2
S113C820D38ADD8A24037C0089DC87D38ADD8A24C9
S113C830037C00899685163DD389DD890CFC01575C
S113C840D38BFD0157FC0155D98A9989FD015514F3
S113C85070017ECBF5FC0109B3010B2C090DC8FF57
S113C860C90088FF8900DD854F5FDD899686163D06
S113C870DD8BDC853DDD87D38ADD8A24037C00895A
S113C880DC87D38ADD8A24037C00899685163DD310
S113C89089DD890CFC015BD38BFD015BFC0159D95B
S113C8A08A9989FD01591471087ECBF5FC010BB3FB
S113C8B001072C090DC8FFC90088FF8900DD854FD9
S113C8C05FDD899686163DDD8BDC853DDD87D38A69
S113C8D0DD8A24037C0089DC87D38ADD8A24037CF7
S113C8E000899685163DD389DD890CFC015FD38BC5
S113C8F0FD015FFC015DD98A9989FD015D14711008
S113C9007ECBF5FC01072C090DC8FFC90088FF89FF
S113C91000DD854F5FDD899686163DDD8BDC853D28
S113C920DD87D38ADD8A24037C0089DC87D38ADD12
S113C9308A24037C00899685163DD389DD890CFC05
S113C940017BD38BFD017BFC0179D98A9989FD0197
S113C950791471017ECBF5FC01092C090DC8FFC9BE
S113C9600088FF8900DD854F5FDD899686163DDDF1
S113C9708BDC853DDD87D38ADD8A24037C0089DC5A
S113C98087D38ADD8A24037C00899685163DD38962
S113C990DD890CFC017FD38BFD017FFC017DD98AED
S113C9A09989FD017D1471027ECBF5FC010B2C09E4
S113C9B00DC8FFC90088FF8900DD854F5FDD8996BA
S113C9C086163DDD8BDC853DDD87D38ADD8A240335
S113C9D07C0089DC87D38ADD8A24037C00899685E0
S113C9E0163DD389DD890CFC0183D38BFD0183FCC7
S113C9F00181D98A9989FD01811471047ECBF5FCEA
S113CA000107B3010913820206FC0107B3010BDD20
S113CA1087FC0101DD85BD806D0CFC0163D38BFDBA
S113CA200163FC0161D98A9989FD01611470027E58
S113CA30CBF5FC0109B3010B13820206FC0109B317
S113CA400107DD87FC0103DD85BD806D0CFC0167FA
S113CA50D38BFD0167FC0165D98A9989FD016514B1
S113CA6070047ECBF5FC010BB3010713820206FCB4
S113CA70010BB30109DD87FC0105DD85BD806D0C6B
S113CA80FC016BD38BFD016BFC0169D98A9989FD8B
S113CA9001691470087ECBF5DCFB93FF138202045A
S113CAA0DCFF93FBDD87DCF5DD85BD806D0CFC01CF
S113CAB06FD38BFD016FFC016DD98A9989FD016DDE
S113CAC01470107ECBF5DCFF93F713820204DCF7BD
S113CAD093FFDD87DCF9DD85BD806D0CFC0173D32C
S113CAE08BFD0173FC0171D98A9989FD0171147060
S113CAF0207ECBF5DCF793FB13820204DCFB93F777
S113CB00DD87DCFDDD85BD806D0CFC0177D38BFDFD
S113CB100177FC0175D98A9989FD0175157047154E
S113CB2070B8157119157106156F017A00F396F333
S113CB3027037ECBF5136A08037ECBF5CE01551887
S113CB40CE0185EC0018ED00EC0218ED02EC04189F
S113CB50ED04EC0618ED06EC0818ED08EC0A18EDE7
S113CB600AEC0C18ED0CEC0E18ED0EEC1018ED1090
S113CB70EC1218ED12EC1418ED14EC1618ED16EC7A
S113CB801818ED18EC1A18ED1AEC1C18ED1CEC1E14
S113CB9018ED1EEC2018ED20EC2218ED22EC2418E0
```

```
S113CBA0ED24EC2618ED26EC2818ED28EC2A18EDD7
S113CBB02AEC2C18ED2CEC2E18ED2ECC0000ED00F8
S113CBC0ED02ED04ED06ED08ED0AED0CED0EED10B1
S113CBD0ED12ED14ED16ED18ED1AED1CED1EED2021
S113CBE0ED22ED24ED26ED28ED2AED2CED2E146A30
S113CBF008C63AD7F33B86019723130A0105860238
S113CC00B701BA3B8602972396BA8121272CDC12FE
S113CC1093BB1A8301F422091271202314712O207A
S113CC20291571201A83138825201A8330D4221AD7
S113CC30D3B8DDB896B7890097B77A00BA260B1532
S113CC407120962284FD97222004DC12DDBB3B86F2
S113CC50049723138140058603B701BA3B7D01BACB
S113CC6027507A01BA264B126B04471300010913AB
S113CC700A013C146902200B138140331300042F72
S113CC80146904157A32157AC0157A0A1579F815DB
S113CC907C04130A1003147A10130A2003147A2054
S113CCA0130A4003147A40BDCD672000BDCE097F2E
S113CCB001BA39136B04037ECE08120A021B7F00EB
S113CCC0CA137C013A13694036130A01037ECD6707
S113CCD0147901157A057ECE087F00CB96CA260406
S113CCE0960897CA4A97CA27037ECE08136B400654
S113CCF01569407ECE08157C0114A7047ECD4296AA
S113CD00CB2604960897CB4A97CB27037ECE0814EC
S113CD10A708FC020FC30001FD020F147C01157A61
S113CD2005157906156906157C30157CC0157B1E22
S113CD30156918157BE0146940156B08156B80158F
S113CD406B40120A0121147901157A051281040E2F
S113CD50136B020314A701136B200314A702156BB2
S113CD6003156B307ECE08157901120A8021136BEE
S113CD70033A126B032F126B0110156B02157A0123
S113CD8012810406157A0114A701156B01201D12E6
S113CD906B0312136B0306126B02112005146B0153
S113CDA0200A146B02126C0403146C04B601B52738
S113CDB0037ECE01120A0426136B3045126B303405
S113CDC0126B1015156B20157A041281040B157A59
S113CDD00414A7028605B701B5156B102023126B46
S113CDE03012136B3006126B20172005146B1020C1
S113CDF010146B20126C100996F2810D2503146C2B
S113CE0010130A0803147A8039B601BEB70272B649
S113CE1001BFB70271B601C0B70270B601C1B70253
S113CE206FB601BDB70273B601BCB70274B601BBDD
S113CE30B70275DC79FD0276DC7BFD0278CE0277E1
S113CE40130A80051C000120031D0001130A0405B8
S113CE501C000420031D0004CE02761369020B1C84
S113CE6000027ECF47136904131C0004137A700375
S113CE707ECF47CE02771C00207ECF47CE027813A8
S113CE806908061C00027ECF47CE0279126910039E
S113CE907ECF911C0040127802181278O437127861
S113CEA02056127880751278080220061578087EBC
S113CEB0CF47FC0205FD027AFC0207FD027CFC025E
S113CEC009FD027EFC020BFD0280FC020DFD0282C4
S113CED01578022069CC0000FD027AFC01F3FD0202
S113CEE07CFC01F5FD027EFC01F7FD0280FC01F9EA
S113CEF0FD02821578042046FC01DBFD027AFC0168
S113CF00F3FD027CFC01F5FD027EFC01F7FD0280CD
S113CF10FC01F9FD02821578202023CC0000FD02DB
S113CF207ACC0000FD027CFC01E3FD027EFC01EFF3
```

```
S113CF30FD0280FC01F1FD02821578802000146B53
S113CF4004146A407ECF91146B04CE00DECC000042
S113CF50ED00ED02ED04ED06ED08ED0AED0CED0E2D
S113CF60ED10ED12861297F296F4810122048602E6
S113CF7097F4863497D0156201863597D1156202ED
S113CF80863697D2156204863797D3156208146CD7
S113CF900186409723DC0EC3C350DD1814224039A8
S113CFA086409723152240CE02791D0001120A0201
S113CFB007120A02031C00817F026E14BE103B3765
S113CFC08D0D33178D0939378D0933178D053912B6
S113CFD061043E16D78FE400D18F2718C616D73BBD
S113CFE0A700C617D73B8D2B7F003BE600C1FF2768
S113CFF003147310A1002716C602D73BA700C6036B
S113D000D73B8D0F7F003BA10027031473107F00D3
S113D0103B08393637DC0EC3138824057D000E2BFC
S113D020FB1A930E22FB333239CE00012008CE00C6
S113D030022003CE00043C83021137040404C3021B
S113D04061188F33C407CED0613AE600381718AAA6
S113D0500018A7000927095824F31808C60120ED71
S113D06039010204081020408 0E6002609084A26F7
S113D070F8CE0000202E18CEFFFF18085424FB1809
S113D0808F18CED061183A18A60043A400A7008FC9
S113D090830261050505C302118F3AA60097C48F68
S113D0A0C37CDA8F8C00003914BE0212BE01F93938
S113D0B018CE011E180926FC390F1261010F0E1338
S113D0C0BD020713BD0103BDEFBA7ED1B27F00AE2E
S113D0D00E15610115BD04CC02FCDD7DCC0308DD19
S113D0E07F96AA136004211381041A36158104BDA6
S113D0F0D0A8B67E3385042708DC81CE7E33BDCF2D
S113D100BF3215BE027ED19113600821128104 1A28
S113D11036148104BDD0A8B67E3385042608DC818C
S113D120CE7E33BDCFBF3215BE027ED180126010D9
S113D1300F12602017126040241260 80307ED1A646
S113D140B1D1FB274CB1D1EF2747205AB1D2702778
S113D1502FB1D282272AB1D1EF27252049B1D1E3BB
S113D160272FB1D1F2263F96A8263B2024B1D1E344
S113D170271FB1D2762709B1D1F2262A96A82626EE
S113D180CED270A100271B0808088CD29A25F4205F
S113D19015CED1B3A100270A0808088CD27025F453
S113D1A02004EE01AD001560F47F00AC1560037F30
S113D1B002FA392BE8CD24E7312AE8E52EEB1F2CBF
S113D1C0E96229E8C125E74153E1EA50E1F454E278
S113D1D04051E24A5DE6EF52E2935AE32C55E2D71E
S113D1E05CE33E20E6F928E881FFECECA0D2A1A1A3
S113D1F0D329A2D37BA4D3E7A7D2E6AFD3BFC4E09D
S113D2003AC5E06FC6E0A4C7E0D9C8E10EC9E1435E
S113D21026E771A6D45AA8D4BAA9D51AAAD584AB3C
S113D220D5EEACD658ADD6C227DDB2B0D72CB1D727
S113D2308EB2D7F0B3D856B5D8AEB6D914B7D97024
S113D240B8D9D6B9DA3CBADAA2BBDB08BCDB6EBD0E
S113D250DBD4BEDC3ABFDCA0C1DFA340DFBFC3DF49
S113D260CE42E017CAE1784AE1B0A5D44522E71ED0
S113D270AFD3B82EEB112FEC9DA0D29AA1D322A24A
S113D280D374A3D3A0A6D4535CE33629E8B62DEA1D
S113D29034FFECDDA5D43E22E70B18DE7D1809200F
S113D2A00318DE7D157302BDD0A80F18E60218A678
S113D2B003DDB0CE7E2DBDCFBF18E60418A605DD74
```

```
S113D2C0B2CE7E2FBDCFBFDCB0CE000A028FDD8F81
S113D2D004D38FDD8FCE7E37BDCFBF148440BDBA5B
S113D2E0D215BE020E3914730218DE7D18E6021838
S113D2F0A6031A8302942229157302BDD0A8CE7EF8
S113D30031BDCFBFFC7E31CE000A028FDD8F04D346
S113D3108FCE7E39BDCFBF148440BDBAD215BE02B4
S113D3200E3918DE7D1809200318DE7D18E6021870
S113D330A603157302BDD0A8188FCED36C4F1AACB8
S113D34000270D08084C810323F418CE12C086016F
S113D3508A30972B188F1AB37E2B270CCE7E2BBDC9
S113D360CFBF148440BDBAD215BE0239258012C085
S113D370096004B018DE7D1809200318DE7D1473DB
S113D3800218A60281DE2217157302BDD0A897A841
S113D390CE7E2ABDCFCF148440BDBAD215BE023989
S113D3A018DE7D18097F01C118EC04B701BEF7012E
S113D3B0BF18A606B701C03918DE7D180920031866
S113D3C0DE7D18A602B701BB18A603B701BC18A6D8
S113D3D004B701BD18A605B701BE18A606B701BF5C
S113D3E018A607B701C03914730218DE7DB601BC54
S113D3F0274BBB01BDF601BB27433D0505837D7B60
S113D400DD8F18E60218A6031A938F2630157302CF
S113D410BDD0A818E60418A605DD81CC00E01A8367
S113D42000D122051581802003148180DC81CE7E09
S113D43033BDCFBF148440BDBAD215BE023918DE45
S113D4407D1809200318DE7D18E602D76D18E6035F
S113D4500D76E3918DE7D1809200918DE7D1281285F
S113D460022053BDD0A815730218A6048155270ABB
S113D47081AA270681FF272F201618A602813222AF
S113D4800F8105250B18A603810F220481012405B1
S113D4901473022021CE7E5618A602BDCFCFCE7EB5
S113D4A05518A603BDCFCFCE7E5418A604BDCFCF4A
S113D4B0148440BDBB4615BE023918DE7DBDD0A81C
S113D4C0128128022050157302 18A6048155270AD8
S113D4D081AA270681FF272F201618A6028132224F
S113D4E00F8105250B18A603810F22048101240551
S113D4F01473022021CE7E5318A602BDCFCFCE7E58
S113D5005218A603BDCFCFCE7E5118A604BDCFCFEF
S113D510148440BDBB4615BE023918DE7DBDD0A8BB
S113D520128128022 05A15730218A6058155270A6C
S113D53081AA270681FF2739201D18E60218A603B1
S113D5401A83029422111A83003C250B18A6048125
S113D5500F220481012405147302 2024CE7E4F1867
S113D560E60218A603BDCFBFCE7E4E18A604BDCFDB
S113D570CFCE7E4D18A605BDCFCF148440BDBB468B
S113D58015BE023918DE7DBDD0A812812802205AAA
S113D59015730218A6058155270A81AA270681FF5B
S113D5A02739201D18E60218A6031A8302942211B3
S113D5B01A83003C250B18A604810F220481012440
S113D5C0051473022024CE7E4B18E60218A603BD70
S113D5D0CFBFCE7E4A18A604BDCFCFCE7E4918A6B3
S113D5E005BDCFCF148440BDBB4615BE023918DE3D
S113D5F07DBDD0A812812802205A15730218A605F1
S113D6008155270A81AA270681FF2739201D18E69C
S113D6100218A6031A8302BC22111A8301C2250B25
S113D62018A604810F220481012405147302202406
S113D630CE7E4718E60218A603BDCFBFCE7E46189D
S113D6400A604BDCFCFCE7E4518A605BDCFCF14848A
```

```
S113D65040BDBB4615BE023918DE7DBDD0A812817F
S113D6602802205A15730218A6058155270A81AA93
S113D670270681FF2739201D18E60218A6031A83FE
S113D68002BC22111A8301C2250B18A604810F22A1
S113D69004810124051473022024CE7E4318E6027B
S113D6A018A603BDCFBFCE7E4218A604BDCFCFCEF1
S113D6B07E4118A605BDCFCF148440BDBB4615BE20
S113D6C0023918DE7DBDD0A812812802205A1573B4
S113D6D00218A6058155270A81AA270681FF273942
S113D6E0201D18E60218A6031A831C2022111A838F
S113D6F0000A250B18A604810F22048101240514B5
S113D70073022024CE7E3F18E60218A603BDCFBFC5
S113D710CE7E3E18A604BDCFCFCE7E3D18A605BD55
S113D720CFCF148440BDBB4615BE023918DE7DBD83
S113D730D0A815730218A60581AA270E8100270A0E
S113D7408155270681FF2733201718E60218A60300
S113D7501A839C40220B1A830001250518A604266F
S113D760051473022024CE7E9718E60218A603BD82
S113D770CFBFCE7E9618A604BDCFCFCE7E9518A679
S113D78005BDCFCF148440BDBB8015BE023918DE61
S113D7907DBDD0A815730218A60581AA270E8100A5
S113D7A0270A8155270681FF2733201718E6021818
S113D7B0A6031A830FA220B1A830001250518A6BD
S113D7C00426051473022024CE7E9318E60218A6BC
S113D7D003BDCFBFCE7E9218A604BDCFCFCE7E911F
S113D7E018A605BDCFCF148440BDBB8015BE023939
S113D7F018DE7DBDD0A8138110581573 0218A60534
S113D80081AA270E8100270A8155270681FF273325
S113D810201718E60218A6031A839C40220B1A83C9
S113D820000125 0518A60426051473022024CE7EC3
S113D8308F18E60218A603BDCFBFCE7E8E18A604AD
S113D840BDCFCFCE7E8D18A605BDCFCF148440BDED
S113D850BB8015BE023918DE7DBDD0A81573021831
S113D860A60481AA270E8100270A8155270681FF75
S113D8702729201018A602813222098105250518BE
S113D880A60326051473022021CE7E8C18A602BDA1
S113D890CFCFCE7E8B18A603BDCFCFCE7E8A18A65F
S113D8A004BDCFCF148440BDBB8015BE023918DE41
S113D8B07DBDD0A8138120581573 0218A60581AA2E
S113D8C0270E8100270A8155270681FF2733201759
S113D8D018E60218A6031A830294220B1A83003C4A
S113D8E0250518A60426051473022024CE7E881864
S113D8F0E60218A603BDCFBFCE7E8718A604BDCF0F
S113D900CFCE7E8618A605BDCFCF148440BDBB8084
S113D91015BE023918DE7DBDD0A8138120 4E1573C3
S113D9200218A60481AA270E8100270A815527061A
S113D93081FF2729201018A602813222098105259A
S113D9400 0518A60326051473022021CE7E8518A689
S113D95002BDCFCFCE7E8418A603BDCFCFCE7E83AB
S113D96018A604BDCFCF148440BDBB8015BE0239B8
S113D97018DE7DBDD0A8138120581573 0218A605A2
S113D98081AA270E8100270A8155270681FF2733A4
S113D990201718E60218A6031A830294220B1A838E
S113D9A0003C250518A60426051473022024CE7E07
S113D9B08118E60218A603BDCFBFCE7E8018A60448
S113D9C0BDCFCFCE7E7F18A605BDCFCF148440BD7A
S113D9D0BB8015BE023918DE7DBDD0A81381205846
```

```
S113D9E015730218A60581AA270E8100270A8155FE
S113D9F0270681FF2733201718E60218A6031A8387
S113DA001D4C220B1A83000A250518A604260514AA
S113DA1073022024CE7E7D18E60218A603BDCFBF74
S113DA20CE7E7C18A604BDCFCFCE7E7B18A605BDC6
S113DA30CFCF148440BDBB8015BE023918DE7DBD36
S113DA40D0A8138120581573021BA60581AA270EA1
S113DA508100270A8155270681FF2733201718E6FE
S113DA600218A6031A831D4C220B1A83000A2505EB
S113DA7018A60426051473022024CE7E7918E60223
S113DA8018A603BDCFBFCE7E7818A604BDCFCFCED7
S113DA907E7718A605BDCFCF148440BDBB8015BECC
S113DAA0023918DE7DBDD0A8138120581573021BE1
S113DAB0A60581AA270E8100270A8155270681FF22
S113DAC02733201718E60218A6031A831D4C2E0BC1
S113DAD01A83E2B42D0518A604260514730220 2423
S113DAE0CE7E7518E60218A603BDCFBFCE7E74188D
S113DAF0A604BDCFCFCE7E7318A605BDCFCF1484A8
S113DB0040BDBB8015BE023918DE7DBDD0A813818F
S113DB10205815730218A60581AA270E8100270A2A
S113DB208155270681FF2733201718E60218A6031C
S113DB301A831D4C2E0B1A83E2B42D0518A6042655
S113DB40051473022024CE7E7118E60218A603BDC4
S113DB50CFBFCE7E7018A604BDCFCFCE7E6F18A6E1
S113DB6005BDCFCF148440BDBB8015BE023918DE7D
S113DB707DBDD0A8138120581573021BA60581AA6B
S113DB80270E8100270A8155270681FF2733201796
S113DB9018E60218A6031A831D4C220B1A83000AE6
S113DBA0250518A60426051473022024CE7E6D18BC
S113DBB0E60218A603BDCFBFCE7E6C18A604BDCF67
S113DBC0CFCE7E6B18A605BDCFCF148440BDBB80DD
S113DBD015BE023918DE7DBDD0A8138120581573F7
S113DBE00218A60581AA270E8100270A8155270657
S113DBF081FF2733201718E60218A6031A8302BCF4
S113DC00220B1A8301C2250518A60426051473023E3
S113DC102024CE7E6918E60218A603BDCFBFCE7EAF
S113DC206818A604BDCFCFCE7E6718A605BDCFCF9A
S113DC30148440BDBB8015BE023918DE7DBDD0A85A
S113DC40138120581573021BA60581AA270E810096
S113DC50270A8155270681FF2733201718E6021863
S113DC60A6031A8302BC220B1A8301C2250518A637
S113DC7004260514 73022024CE7E6518E60218A635
S113DC8003BDCFBFCE7E6418A604BDCFCFCE7E63C6
S113DC9018A605BDCFCF148440BDBB8015BE023984
S113DCA018DE7DBDD0A8128120037EDD81157302AC
S113DCB018A60781AA270F8100270B815527078102
S113DCC0FF26387EDD6F18E60218A6031A830000CB
S113DCD027291A8300642E231A83FF9D2D1D18E61D
S113DCE00418A6051A83000027111A8300642E0B5A
S113DCF01A83FF9D2D0518A60626061473027EDDE1
S113DD0081CE7E5D18E60218A603BDCFBFCE7E5B32
S113DD1018E60418A605BDCFBFCE7E5A18A606BDC8
S113DD20CFCF18E60218A603DD8F18E60418A6055F
S113DD30DD91DC8F2D0DDC912D071A938F2F1D2083
S113DD400D200BDC912E151A938F2D102000DC8FE3
S113DD508FDC91188F8FDD91188FDD8F18DE7DCECB
S113DD607E61DC8FBDCFBFCE7E5FDC91BDCFBF189F
```

```
S113DD70DE7DCE7E5918A607BDCFCF148440BDBB2F
S113DD808015BE0239B0DDD1B1DDE5B2DDF9B3DE17
S113DD901AB5DE2EB6DE4FB7DE70B8DE91B9DEB24C
S113DDA0BADED3BBDEF4BCDF15BDDF36BEDF57BF42
S113DDB0DF7818DE7D18A602CEDD85A100270A08CB
S113DDC008088CDDB225F4200536EE016E007EDFF6
S113DDD0A2DE7FBDD0A818CE7E95C604BDED321557
S113DDE0BE027EDF98DE7FBDD0A818CE7E91C60429
S113DDF0BDED3215BE027EDF98DE7F1281100986EA
S113DE0080C604BDED3E200FBDD0A818CE7E8DC6C1
S113DE1004BDED3215BE027EDF98DE7FBDD0A818AA
S113DE20CE7E8AC603BDED3215BE027EDF98DE7F4C
S113DE30128120098680C604BDED3E200FBDD0A806
S113DE4018CE7E86C604BDED3215BE027EDF98DE96
S113DE507F128120098680C603BDED3E200FBDD010
S113DE60A818CE7E83C603BDED3215BE027EDF98B0
S113DE70DE7F128120098680C604BDED3E200FBDE1
S113DE80D0A818CE7E7FC604BDED3215BE027EDF5B
S113DE9098DE7F128120098680C604BDED3E200FE6
S113DEA0BDD0A818CE7E7BC604BDED3215BE027E61
S113DEB0DF98DE7F128120098680C604BDED3E20F6
S113DEC00FBDD0A818CE7E77C604BDED3215BE02B4
S113DED07EDF98DE7F128120098680C604BDED3E78
S113DEE0200FBDD0A818CE7E73C604BDED3215BE7A
S113DEF0027EDF98DE7F128120098680C604BDED94
S113DF003E200FBDD0A818CE7E6FC604BDED3215DD
S113DF10BE027EDF98DE7F128120098680C604BDA2
S113DF20ED3E200FBDD0A818CE7E6BC604BDED32E9
S113DF3015BE027EDF98DE7F128120098680C6042A
S113DF40BDED3E200FBDD0A818CE7E67C604BDED42
S113DF503215BE027EDF98DE7F128120098680C6DC
S113DF6004BDED3E200FBDD0A818CE7E63C604BD0F
S113DF70ED3215BE027EDF98DE7F12812009868095
S113DF80C606BDED3E200FBDD0A818CE7E59C606EC
S113DF90BDED3215BE02200032A70008B6D228BD5E
S113DFA0ED643915730218DE7DBDD0A818E6021899
S113DFB0A603FD020FCE7EA7BDCFBF15BE0239DE7C
S113DFC07FFC020FBDED2DB6D25BBDED643918DECA
S113DFD07D1381204115730218A603810F2211813C
S113DFE001250D18A60281632206810125022005G0
S113DFF01473022021BDD0A8CE7E3618A602BDCF50
S113E000CFCE7E3518A603BDCFCF148440BDBAD27F
S113E01015BE02BD9AF639DE7FC680868013812044
S113E0200CBDD0A8F67E35B67E3615BE02E70008D4
S113E030A70008B6D261BDED643915730218DE7D00
S113E04018A6028155270981AA270A147302201EE3
S113E050148204200515820420000BDD0A8DC81CEE2
S113E0607E33BDCFBF148440BDBAD215BE0239156C
S113E070730218DE7D18A6028155270981AA270A92
S113E080147302201E1482022005158202200BD92
S113E090D0A8DC81CE7E33BDCFBF148440BDBAD2BC
S113E0A015BE023915730218DE7D18A602815527A4
S113E0B00981AA270A147302201E1482012005155F
S113E0C082012000BDD0A8DC81CE7E33BDCFBF1439
S113E0D08440BDBAD215BE023915730218DE7D180C
S113E0E0A6028155270981AA270A147302201E1447
S113E0F0821020051582102000BDD0A8DC81CE7EC0
```

```
S113E10033BDCFBF148440BDBAD215BE02391573D6
S113E1100218DE7D18A6028155270981AA270A1450
S113E1207302201E1482020051582202000BDD0F9
S113E130A8DC81CE7E33BDCFBF148440BDBAD215D6
S113E140BE023915730218DE7D18A602815527090F
S113E15081AA270A147302201E148208200515823E
S113E160082000BDD0A8DC81CE7E33BDCFBF14848F
S113E17040BDBAD215BE023914730218DE7DBDD07B
S113E180A818E60218A6031AB37EA927061A830A5A
S113E190ED261918E60418E106261118A60518A19B
S113E1A0072609157302CE7EA9BDCFBF15BE02395D
S113E1B015730218DE7DDE7FBDD0A818E60218A60E
S113E1C0031AB37EA9270D1A830AED270E8680A7AA
S113E1D00008200C8600A70008200586FFA7000879
S113E1E015BE02B6D267BDED6439138208058605F3
S113E1F0B701B83918DE7DB601B8273318A60291E5
S113E200A8262C18A60391A8262518A60491A826AA
S113E2101E1401081400081501081575018 6F197EC
S113E22092BDB66DBDB930DE7F8655A70020097F4B
S113E23001B8DE7F8680A70008B6D1CBBDED643976
S113E240138208058605B701B93918DE7DB601B910
S113E250273018A60291A8262918A60391A82622D9
S113E26018A60491A8261B140108150008147501AA
S113E27086F09792BDB66DBDB930DE7F8655A70096
S113E28020097F01B9DE7F8680A70008B6D1D1BD01
S113E290ED643918DE7DB601B7272B18A60291A8C4
S113E2A0262418A60391A8261D18A60491A82616AC
S113E2B0147C081401101500108602B701B7DE7F24
S113E2C08655A70020097F01B7DE7F8680A7000856
S113E2D0B6D1D7BDED643918DE7DDE7FB601B62731
S113E2E01518A60291A8260E18A60391A8260718A9
S113E2F0A60491A827107F01B68680A70008B6D18E
S113E300D7BDED6420258655A70008B6D1D7BDED4D
S113E31064146908200314691015 7A35157AC0BD90
S113E320CE091520C01400401420803913 82100532
S113E3308605B701B63918DE7D18EC01200618DE13
S113E3407D18EC021127037EE6DFC5012716CC02F7
S113E35096FD0292FD0294860097 72DE7F8655A791
S113E360007EE6E5C50226037EE5D2FC020DFD0231
S113E3705FCC025FBDD02E14BE20FC020BFD025DFB
S113E380CC025DBDD02E14BE20FC0209FD025BCC84
S113E390025BBDD02E14BE20FC0207FD0259CC0244
S113E3A059BDD02E14BE20FC0205FD0257CC0257E5
S113E3B0BDD02E14BE20FC0203FD0255CC0255BD77
S113E3C0D02E14BE20FC0201FFD0253CC0253BDD05A
S113E3D02E14BE20FC01FFFD0251CC0251BDD02EF3
S113E3E014BE20FC01FDFD024FCC024FBDD02E1403
S113E3F0BE20FC01FBFD024DCC024DBDD02E14BE4F
S113E40020FC01F9FD024BCC024BBDD02E14BE20E2
S113E410FC01F7FD0249CC0249BDD02E14BE20FCFC
S113E42001F5FD0247CC0247BDD02E14BE20FC01ED
S113E430F3FD0245CC0245BDD02E14BE20FC01F1F3
S113E440FD0243CC0243BDD02E14BE20FC01DBFDF3
S113E4500239CC0239BDD02E14BE20FC01EFFD02DE
S113E46041CC0241BDD02E14BE20FC01EDFD023F83
S113E470CC023FBDD02E14BE20FC01E3FD023DCCF6
S113E480023DBDD02E14BE20FC01DDFD023BCC02BA
```

```
S113E4903BBDD02E14BE20FC020DFD0237CC02374A
S113E4A0BDD02E14BE20FC020BFD0235CC0235BDBE
S113E4B0D02E14BE20FC0209FD0233CC0233BDD0A1
S113E4C02E14BE20FC0207FD0231CC0231BDD02E39
S113E4D014BE20FC0205FD022FCC022FBDD02E1449
S113E4E0BE20FC0203FD022DCC022DBDD02E14BE95
S113E4F020FC0201FD022BCC022BBDD02E14BE2029
S113E500FC01FFFD0229CC0229BDD02E14BE20FC43
S113E51001FDFD0227CC0227BDD02E14BE20FC0134
S113E520FBFD0225CC0225BDD02E14BE20FC01F932
S113E530FD0223CC0223BDD02E14BE20FC01F7FD26
S113E5400221CC0221BDD02E14BE20FC01F5FD0217
S113E5501FCC021FBDD02E14BE20FC01F3FD021DF2
S113E560CC021DBDD02E14BE20FC01F1FD021BCC3B
S113E570021BBDD02E14BE20FC01DBFD0211CC0217
S113E58011BDD02E14BE20FC01EFFD0219CC0219DE
S113E590BDD02E14BE20FC01EDFD0217CC0217BD28
S113E5A0D02E14BE20FC01E3FD0215CC0215BDD013
S113E5B02E14BE20FC01DDFD0213CC0213BDD02EAF
S113E5C014BE20157C02157B01DE7F8655A7007ED4
S113E5D0E6E5C5042717BDD0A88600CE7EABBDCF27
S113E5E0CF15BE02DE7F8655A7007EE6E5C5082767
S113E5F033157A0F157AF015791E1569061579E029
S113E600157C3C157CC0157B1E156918157BE01420
S113E610002014690115731F148420DE7F8655A71A
S113E620007EE6E5C510275CBDD0A8CC0000FD0344
S113E63088FD01E9CE7E9BBDCFBFCC0000FD01EB80
S113E640CE7E9DBDCFBF1384010615840115730BCA
S113E650CC0000FD038AFD01E5CE7E9FBDCFBFCC7B
S113E66000000FD01E7CE7EA1BDCFBF1384020615D5
S113E670840215730815840815BE02DE7F8655A72B
S113E680007EE6E5C5202737BDD0A8CC0000FD03F9
S113E6908CFD01DFCE7EA3BDCFBFCC0000FD01E128
S113E6A0CE7EA5BDCFBF138404061584041573085C
S113E6B015840815BE02DE7F8655A7007EE6E5C5F3
S113E6C040270CBD9AF6DE7F8655A7007EE6E5C599
S113E6D080270C157380DE7F8655A7007EE6E5DE75
S113E6E07F8680A700DE7F08B6D1E0BDED643913D4
S113E6F08220058605B701B739DE7F96AB260586ED
S113E700F8A70008B6D1E3BDED6439DE7FD66EE725
S113E7100008D66DE70008B6D26DBDED4539DE7F41
S113E720D66EE70008D66DE70008B6D26DBDED647D
S113E7303918DE7FBDB88B188F8FB6D1B6BDED64A6
S113E74039DE7F18CE028418A600A700081808181E
S113E7508C028C23F2B6D1C5BDED6439A6E790A82E
S113E760E7B1A9E7D2AAE7F3ABE814ACE835ADE822
S113E7705618DE7D18A602CEE75CA100270A080819
S113E780088CE77125F4200536EE016E007EE880E2
S113E790DE7F128108098680C603BDED3E200FBDD1
S113E7A0D0A818CE7E54C603BDED3215BE027EE855
S113E7B076DE7F128128098680C603BDED3E200FD8
S113E7C0BDD0A818CE7E51C603BDED3215BE027E63
S113E7D0E876DE7F128128098680C604BDED3E20DE
S113E7E00FBDD0A818CE7E4DC604BDED3215BE02B5
S113E7F07EE876DE7F128128098680C604BDED3E60
S113E800200FBDD0A818CE7E49C604BDED3215BE7A
S113E810027EE876DE7F128128098680C604BDED7B
```

```
S113E8203E200FBDD0A818CE7E45C604BDED3215DE
S113E830BE027EE876DE7F128128098680C604BD8A
S113E840ED3E200FBDD0A818CE7E41C604BDED32EA
S113E85015BE027EE876DE7F128128098680C60412
S113E860BDED3E200FBDD0A818CE7E3DC604BDED43
S113E8703215BE02200032A70008B6D210BDED64E6
S113E88039BDD0A8DE7FBDECFBB601BDA70008B63C
S113E89001BCA70008B601BBA70008DC81BDED2DB3
S113E8A0BDED21BDED18FC7E2BBDED2D15BE02B6D0
S113E8B0D1E6BDED6439DE7FBDED0B8634BDED459B
S113E8C039DE7FBDED0BB6D1C2BDED6439DE7FDC30
S113E8D072ED000808DC74ED000808BDED0BB6D13C
S113E8E0B3BDED643918DE7D18A6028101270681C7
S113E8F0022738206CDE7F1381200618CE023920CF
S113E9000418CE025518A600A700081808188C028F
S113E9106023F213812004860120028681A7000867
S113E920157B01B6D1B9BDED642036DE7F1381209D
S113E9300618CE0211200418CE022D18A600A70036
S113E940081808188C023823F21381200486022048
S113E950028682A70008157C02B6D1B9BDED6420F9
S113E9600039BDD0A8B67EAB2621DE7F18CE7EACA2
S113E9708600A700081808188C7EC023F38600A719
S113E9800008B6D1BFBDED647EEA3018DE7D18A65E
S113E990028101260F978FB67EAB8101272F81025A
S113E9A0274D206D8102260F978FB67EAB810127FC
S113E9B0608102271820388103260F978FB67EAB1B
S113E9C08101272B8102274920037EEA30DE7F184C
S113E9D0CE7EAC18A600A700081808188C7EC023A9
S113E9E0F2968FA70008B6D1BFBDED647EEA30DE93
S113E9F07F18CE7EC118A600A700081808188C7EC0
S113EA00D523F2968FA70008B6D1BFBDED647EEA88
S113EA1030DE7F18CE7ED618A600A7000818081886
S113EA208C7EEA23F2968FA70008B6D1BFBDED64B1
S113EA3015BE0239B67EAB2619DE7F18CE7EAC86B3
S113EA4000A700081808188C7EC023F38632BDED99
S113EA504539810127068102270A2010DE7F18CE5E
S113EA607EAC200EDE7F18CE7EC12006DE7F18CE5F
S113EA707ED6180818A600A70008180818A600A72C
S113EA800008180818A600A70008180818088D
S113EA90180818A600A70008180818A600A7000858
S113EAA0180818A600A70008180818A600A7000848
S113EAB018081808DCB23CCE000A028F38FD026C3C
S113EAC0180818EC00183CBDAAC11838ED00080855
S113EAD0DCB0FD026C1808180818EC00183CBDAA3C
S113EAE0C11838ED0008081808180818EC00183C7C
S113EAF0BDAAC11838ED0008081808180818EC0059
S113EB00183CBDAAC11838ED0008088632BDED4591
S113EB103918DE7D18E601C1022701397EEBEE18B3
S113EB20DE7D18E602C1012705C1032704397EEB07
S113EB30347EEB98DE7F13812030FC01DBBDED2DAC
S113EB40FC01DDBDED2DFC01E3BDED2DFC01EDBDB2
S113EB50ED2DFC01EFBDED2DFC01F1BDED2DFC0112
S113EB60F3BDED2DFC01FBBDED2DDC72BDED2DDC07
S113EB7074BDED2DDC79BDED2DDC7BBDED2DFC02EE
S113EB8003BDED2D13812004860120028681A70098
S113EB9008B6D1BCBDED6439DE7F1381201218CED6
S113EBA001DB18A600A700081808188C020223F23B
```

```
S113EBB0DC72ED000808DC74ED000808DC79ED0077
S113EBC00808DC7BED00080818CE020318A600A78D
S113EBD000081808188C020E23F2138120048603FF
S113EBE020028683A70008B6D1BCBDED6439DE7F60
S113EBF0BDECFB136B0805147A012007136B80032B
S113EC00147A04BDED0BDCB205BDED2DDCB005BD01
S113EC10ED2DDCB23CCE000A028F38FD026CFC0202
S113EC2007136B0805FC029E2007136B8003FC028C
S113EC3096BDAAC1BDED2DDCB0FD026CFC0209132A
S113EC406B0805FC02A02007136B8003FC0298BD2F
S113EC50AAC1BDED2DFC020B136B0805FC02A2201A
S113EC6007136B8003FC029ABDAAC1BDED2DFC0203
S113EC700D136B0805FC02A42007136B8003FC0230
S113EC809CBDAAC1136B0805156B082007136B8084
S113EC9003156B80BDED2D8631BDED4539BDD0A882
S113ECA0DE7FBDECFBCC0000BDED2DDC81BDED2D88
S113ECB0FC7E2BBDED2DB67E54A70008B67E55A76D
S113ECC00008B67E56A70008DCB205BDED2DDCB009
S113ECD005BDED2D15BE028630BDED4539DE7FCC78
S113ECE000E0BDED2DB6D1E9BDED4539DE7FCC00A8
S113ECF0E0BDED2DB6D1E9BDED6439FC01BFE700FF
S113ED0008A70008B601BEA7000839DC79ED0008A1
S113ED1008DC7BED00080839DCB28D11DCB08D0D08
S113ED2039BDD0A8FC7E318D0415BE0239ED000832
S113ED30083918A600A7000818085A26F539A700AC
S113ED40085A26FA39B7028D3C8F937F38E70008BA
S113ED50B6028DA7000896A8A700088627A700FF7B
S113ED60028D2022B7028D96A8A700083C8F937FBE
S113ED7038E70008B6028DA7000896ABA7000886FE
S113ED8027A700FF028D0918DE7F180918DF7F4FBF
S113ED90E6001B099C7F26F843A700FC028D180996
S113EDA0180918DF7F937F18E7011808180818D856
S113EDB018DF7F13BD04022010150820C66401016A
S113EDC05A26FB152D24142D8039962E85C0272F05
S113EDD0F60306271D1502207A0306270DF60306FF
S113EDE0CE03063AE600D72F2015142D40152D80AA
S113EDF0200D854027091520C0142D24140820D674
S113EE002F850E26088520270D8D0C20097F00AC48
S113EE101560037F02FA3BB602FA27037EEF1F1741
S113EE201360010915600197AB1460023912600286
S113EE300F81142707812727037EEF1F14600139F0
S113EE407C00ACC60BD1AC2517CE02FAD6AC3AA7DF
S113EE5000C10126037EEF1FC10226048B0397A97C
S113EE6096AC91A927037EEF1FD6ABC1F82614CE2A
S113EE7002FCE601D1A82720C1FF2724C1002728CE
S113EE807EEF13C1FF2729C100272DC1DE23037E96
S113EE90EF13D1A8272A207B1460041560082025CD
S113EEA01460101560082010146040156008205BA
S113EEB01460201560082000D146080156008200557A
S113EEC01460082000B702FAF602FA5A7F00AFCEA7
S113EED002FBA6009BAF97AF085A26F696AB9BAFF2
S113EEE043E60011270615600F47EEF13B602FB9784
S113EEF0AA12600814860897AD86FF97AE96AAB149
S113EF00D1FB26187F01C12013860897AD86789718
S113EF10AE20097F00AC1560037F02FA1502203988
S113EF20864097257A0351F60352261713BD021320
S113EF30B603518101270C810027037EEFB986199E
```

```
S113EF40B703519629962AF60352260F81E12744E6
S113EF508100260786F4B703512039CE03533AA71C
S113EF60007C0352C10A2407C002F103542D257FFB
S113EF7003528619B7035112BD0119CE035318CE9B
S113EF80035DC60AA60018A7006F000818085A26D1
S113EF90F314BD0112BD021DF60367CE03673AA642
S113EFA000972A7A0367261114BD027F0367861926
S113EFB0B70351200486E0972A3B13812006860379
S113EFC0978F20048683978FCE035DBDF188265DDD
S113EFD0CEF031B6035DA100272C0808088CF03769
S113EFE025F414BD04CE035EDF7DCE0369DF7F7F8D
S113EFF00367CED1B3B6035DA10027100808088CBF
S113F000D27025F42027EE01AD002021EE01AD00E1
S113F010F603672718C003C1202212F7036718CE2E
S113F0200367183ABDF19C18A70015BD0215BD0170
S113F030392EF0372AF0FBF6036158CEF07D3AF60C
S113F040036218CE0369BDF164F6036118E7001882
S113F05008860318A700180896A818A7001808B669
S113F06003628B0318A70018088B03B70367862E67
S113F07018A700BDF19C18A70015BD0239000000B7
S113F08000008F020E020D020C020B020A0209029A
S113F090080207020602050204020300700700B004A
S113F0A07A00790075007400730072020202010292
S113F0B00001FF01FE01FD01FC01FB01FA01F90160
S113F0C0F801F701F601F501F401F301F201F10190
S113F0D0F001EF01EE01ED01EC01EB01EA01E901C0
S113F0E0E801E701E601E501E401E301E201E101F0
S113F0F0E001DF01DE01DD01DC01DBCE023BB60312
S113F1006081012603CE02638FF003618200F00365
S113F110628200C300018FF6036218CE0369A60061
S113F120188C0384220918A7001808085A26EFF639
S113F130036118E7001808B6036018A700180896BA
S113F140A818A7001808B603628B0318A7001808AC
S113F1508B03B70367862A18A700BDF19C18A70084
S113F16015BD023918DF903A3A09091AEE0018A6BB
S113F1700018DE90188C0384220D18A700180818B4
S113F180DF9009095A26E439E601CB024FAB0008A7
S113F1908C038824035A26F540A1003918A60018C8
S113F1A00918E6005C18AB001809188C03682303DF
S10BF1B05A26F24018A10039AF
S113FFD6EDCA802A802A802A802AC609C1F1BBD0AC
S113FFE6CFA0BFCFCBF6CC04CC4FEF20802A802AFB
S10DFFF6802A802A802A802A802AAB
S9030000FC
```

What is claimed:

1. A controller suitable for monitoring electrical power lines which transmit alternating current electric power including a periodic voltage component and a periodic current component, having a predetermined frequency, to a load circuit, said apparatus comprising:

current sampling means for digitally sampling the current component of the power during a single period thereof, at a rate which produces a number of digital samples sufficient to resolve the current component to the Nth harmonic of said predetermined frequency during each period of said periodic current component, where N is an integer greater than 2; and voltage sampling means for digitally sampling the voltage component of the power, during a sampling interval which includes multiple periods of the voltage component, at a rate less than the rate used to sample the current component to produce a number of digital samples sufficient to resolve the voltage component to the Mth harmonic of said predetermined frequency during the sampling interval, where M is an integer greater than 2.

2. Apparatus according to claim 1, wherein the voltage sampling means obtains digital samples of the voltage component at intervals which differ from the period of the alternating current voltage signal by an amount of time sufficient to ensure that the digital samples represent the voltage component at respectively different instants in each of the multiple periods occurring during the sampling interval.

3. Apparatus according to claim 1, wherein:
the current sampling means produces seventeen digital samples of the current component during each period of the current component;
the voltage sampling means produces two digital samples of the voltage component during each period of the voltage component and the sampling interval includes fifty-eight periods of the voltage component.

4. Apparatus according to claim 1, wherein the controller further includes:
means for squaring each of the digital current samples provided by the current sampling means and for accumulating the squared current sample values to generate a sum of squares current sample value for each period of the current component of the power signal; and
means for squaring each of the digital voltage samples provided by the voltage sampling means and for accumulating the squared voltage sample values to generate a sum of squares voltage sample value for the multiple periods of the voltage component.

5. A controller suitable for monitoring electric power lines which transmit multi-phase alternating current electric power to a load circuit, wherein each power phase includes a periodic voltage component and a periodic current component, having a common frequency, said controller comprising:
means for digitally sampling the current component of each phase of the power during a single period thereof, at a rate which produces a number of samples sufficient to resolve the current component of each power phase to the Nth harmonic of the common frequency during each period of said periodic current component, where N is an integer greater than 2; and
means for digitally sampling the voltage component of each phase of the power, during a sampling interval which includes multiple periods of the voltage component, at a rate less than the rate used to sample the current component to produce, during each sampling interval, a number of digital samples sufficient to resolve the voltage component of each phase of the power to the Mth harmonic of the common frequency, where M is an integer greater than 2.

6. A controller suitable for monitoring electrical power lines which transmit alternating current electric power including a periodic voltage component and a periodic current component, having a predetermined frequency, to a load circuit, said apparatus comprising:
first sampling means for digitally sampling one of the respective current and voltage components of the power during a single period thereof, at a rate which produces a number of digital samples sufficient to resolve said one component to the Nth harmonic of said predetermined frequency during each period of said one periodic component, where N is an integer greater than 2; and
second sampling means for digitally sampling the other component of the power, during a sampling interval which includes multiple periods of said other component, at a rate less than the rate used to sample said one component, to produce a number of digital samples sufficient to resolve said other component to the Mth harmonic of said predetermined frequency during the sampling interval, where M is an integer greater than 2.

* * * * *

UNITED STATES PATENT AND TRADEMARK OFFICE
CERTIFICATE OF CORRECTION

PATENT NO. : 5,369,356

DATED : Nov. 29, 1994

INVENTOR(S) : Michael A. KINNEY; James T. CRONVICH; Wayne M. ZAVIS

It is certified that error appears in the above-identified patent and that said Letters Patent is hereby corrected as shown below:

On the Title Page, Item [56], U.S. PATENT DOCUMENTS: Insert the following:

| | | | |
|---|---|---|---|
| 4,470,092 | 9/1984 | Lombardi | 361/23 |
| 4,687,712 | 8/1987 | Demeyer | 361/96 |
| 4,710,845 | 12/1987 | Demeyer | 361/96 |
| 4,811,154 | 3/1989 | Trenkler et al. | 361/93 |
| 4,996,646 | 2/1991 | Farrington | 364/483 |
| 5,031,178 | 7/1991 | Hartman | 371/29 |

Signed and Sealed this

Fourth Day of April, 1995

*Attest:*

BRUCE LEHMAN

*Attesting Officer*     *Commissioner of Patents and Trademarks*